United States Patent
Danno et al.

(10) Patent No.: US 10,083,898 B2
(45) Date of Patent: Sep. 25, 2018

(54) MANUFACTURING METHOD OF SEMICONDUCTOR DEVICE AND SEMICONDUCTOR DEVICE

(71) Applicant: Renesas Electronics Corporation, Koutou-ku, Tokyo (JP)

(72) Inventors: Tadatoshi Danno, Tokyo (JP); Tsukasa Matsushita, Tokyo (JP); Atsushi Nishikizawa, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/818,684

(22) Filed: Nov. 20, 2017

(65) Prior Publication Data

US 2018/0076115 A1    Mar. 15, 2018

Related U.S. Application Data

(62) Division of application No. 15/462,864, filed on Mar. 19, 2017, now Pat. No. 9,837,339.

(30) Foreign Application Priority Data

Apr. 22, 2016    (JP) .................. 2016-086431

(51) Int. Cl.
*H01L 23/495* (2006.01)
*H01L 23/29* (2006.01)
(Continued)

(52) U.S. Cl.
CPC ...... *H01L 23/49541* (2013.01); *H01L 21/485* (2013.01); *H01L 21/4853* (2013.01);
(Continued)

(58) Field of Classification Search
CPC . H01L 23/48; H01L 23/495; H01L 23/49517; H01L 23/49544; H01L 23/498; H01L 23/528
See application file for complete search history.

(56) References Cited

U.S. PATENT DOCUMENTS 7,019,388 B2    3/2006 Ito et al.
7,348,659 B2    3/2008 Amano et al.
(Continued)

FOREIGN PATENT DOCUMENTS

| JP | 2003-023134 A | 1/2003 |
| JP | 2005-057067 A | 3/2005 |
| JP | 2008-113021 A | 5/2008 |

*Primary Examiner* — Cuong Q Nguyen
(74) *Attorney, Agent, or Firm* — Shapiro, Gabor and Rosenberger, PLLC

(57) ABSTRACT

An improvement is achieved in the reliability of a semiconductor device. After a resin sealing portion is formed to seal a die pad, a semiconductor chip mounted over the die pad, a plurality of leads, and a plurality of wires electrically connecting a plurality of pad electrodes of the semiconductor chip with the leads, the resin sealing portion and the leads are cut with a rotary blade to manufacture the semiconductor device. In the semiconductor device, at least a portion of each of first and second leads is exposed from a lower surface of the sealing portion. End surfaces of the first and second leads as the respective cut surfaces thereof are exposed from each of side surfaces of the sealing portion as the cut surfaces of the resin sealing portion. The distance between a lower side of the end surface of the first lead and an upper surface of the sealing portion is smaller than the distance between an upper side of the end surface of the second lead adjacent thereto and the upper surface of the sealing portion.

8 Claims, 42 Drawing Sheets

(51) Int. Cl.
  *H01L 23/00*   (2006.01)
  *H01L 21/48*   (2006.01)
  *H01L 21/56*   (2006.01)
  *H01L 23/31*   (2006.01)

(52) U.S. Cl.
  CPC .......... *H01L 21/563* (2013.01); *H01L 23/293* (2013.01); *H01L 23/3121* (2013.01); *H01L 23/4952* (2013.01); *H01L 24/43* (2013.01); *H01L 24/46* (2013.01); *H01L 2224/48091* (2013.01)

(56) References Cited

U.S. PATENT DOCUMENTS

| | | | |
|---|---|---|---|
| 9,601,415 B2* | 3/2017 | Makino | H01L 23/49541 |
| 9,633,933 B2* | 4/2017 | Hayashi | H01L 23/49551 |
| 2003/0006492 A1 | 1/2003 | Ogasawara et al. | |
| 2003/0071333 A1* | 4/2003 | Matsuzawa | H01L 23/49548 257/676 |
| 2013/0277817 A1* | 10/2013 | Takeuchi | H01L 23/34 257/676 |
| 2015/0371933 A1* | 12/2015 | Jeon, II | H01L 23/49548 257/669 |

\* cited by examiner

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2016-086431 filed on Apr. 22, 2016 including the specification, drawings and abstract is incorporated herein by reference in its entirety.

BACKGROUND

The present invention relates to a manufacturing method of a semiconductor device and to the semiconductor device and can be used appropriately for, e.g., a manufacturing method of a resin-sealed semiconductor device using a lead frame and for the semiconductor device.

By mounting a semiconductor chip on the die pad of a lead frame, electrically connecting the plurality of pad electrodes of a semiconductor chip with the plurality of leads of the lead frame via a plurality of wires, and then sealing the semiconductor chip including the pad electrodes, the die pad, the leads, and the wires in a resin, a semiconductor device in the form of a semiconductor package can be manufactured.

Each of Japanese Unexamined Patent Publication No. 2003-23134 (Patent Document 1), Japanese Unexamined Patent Publication No. 2008-113021 (Patent Document 2), and Japanese Unexamined Patent Publication No. 2005-57067 (Patent Document 3) describes a technique related to a resin-sealed semiconductor device using a lead frame.

RELATED ART DOCUMENTS

Patent Documents

[Patent Document 1] Japanese Unexamined Patent Publication No. 2003-23134
[Patent Document 2] Japanese Unexamined Patent Publication No. 2008-113021
[Patent Document 3] Japanese Unexamined Patent Publication No. 2005-57067

SUMMARY

In a resin-sealed semiconductor device using a lead frame also, it is desired to improve the reliability thereof. Alternatively, it is desired to reduce the spaces between the leads included in the semiconductor device. Still alternatively, it is desired to improve the reliability of the semiconductor device and reduce the spaces between the leads included in the semiconductor device.

Other problems and novel features of the present invention will become apparent from a statement in the present specification and the accompanying drawings.

According to an embodiment, a method of manufacturing a semiconductor device includes the steps of: (a) providing a lead frame having a chip mounting portion and a plurality of leads; (b) mounting a semiconductor chip over the chip mounting portion; and (c) after the step (b), electrically connecting a plurality of pad electrodes of the semiconductor chip with the leads via a plurality of wires. The method of manufacturing the semiconductor device further includes the steps of: (d) after the step (c), forming a resin sealing portion which seals the semiconductor chip, the wires, the chip mounting portion, and the leads; and (e) after the step (d), cutting the resin sealing portion and the leads with a rotary blade. In the step (d), at least a portion of each of the leads is exposed from a lower surface of the resin sealing portion. In the step (e), a cut surface of each of the leads resulting from the step (e) is exposed from a cut surface of the resin sealing portion resulting from the step (e). The leads include a first lead and a second lead located next to the first lead. A distance between a lower side of the cut surface of the first lead resulting from the step (e) and an upper surface of the resin sealing portion is smaller than a distance between an upper side of the cut surface of the second lead resulting from the step (e) and the upper surface of the resin sealing portion.

Also, according to the embodiment, a semiconductor device includes: a chip mounting portion; a semiconductor chip mounted over the chip mounting portion; a plurality of leads; a plurality of wires electrically connecting a plurality of pad electrodes of the semiconductor chip with the leads; and a resin sealing portion which seals the chip mounting portion, the semiconductor chip, the leads, and the wires. At least a portion of each of the leads is exposed from a lower surface of the resin sealing portion. The leads include a first lead and a second lead located next to the first lead. A first end surface of the first lead and a second end surface of the second lead are exposed from a first side surface of the resin sealing portion. On the first end surface of the first lead and the second end surface of the second lead, metal burrs are formed to extend in respective directions parallel with each of the lower surface and the first side surface of the resin sealing portion. In side view, a distance between a lower side of the first end surface of the first lead and an upper surface of the resin sealing portion is smaller than a distance between an upper side of the second end surface of the second lead and the upper surface of the resin sealing portion.

According to the embodiment, it is possible to improve the reliability of the semiconductor device.

Alternatively, it is possible to reduce the spaces between the leads included in the semiconductor device.

Still alternatively, it is possible to improve the reliability of the semiconductor device and reduce the spaces between the leads included in the semiconductor device.

DETAILED DESCRIPTION

Figure 1:
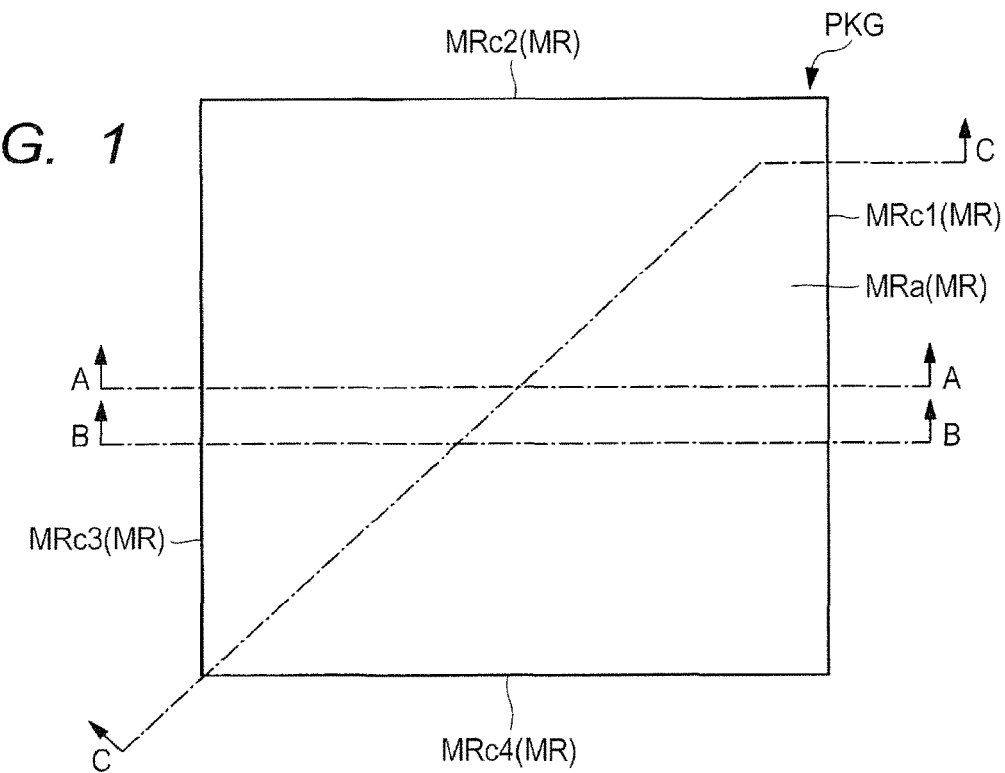
FIG. 1 is a top view of a semiconductor device in an embodiment.

In the following embodiment, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiment, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiment, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiment in detail on the basis of the drawings. Note that, throughout all the drawings for illustrating the embodiment, members having the same functions are designated by the same reference numerals, and a repeated description thereof is omitted. Also, in the following embodiments, a description of the same or like parts will not be repeated in principle unless particularly necessary.

In the drawings used in the embodiment, hatching may be omitted even in a cross section for improved clarity of illustration, while even a plan view may be hatched for improved clarity of illustration.

Embodiment

Referring to the drawings, a semiconductor device in an embodiment of the present invention will be described.

<About Structure of Semiconductor Device (Semiconductor Package)>

Figure 2:
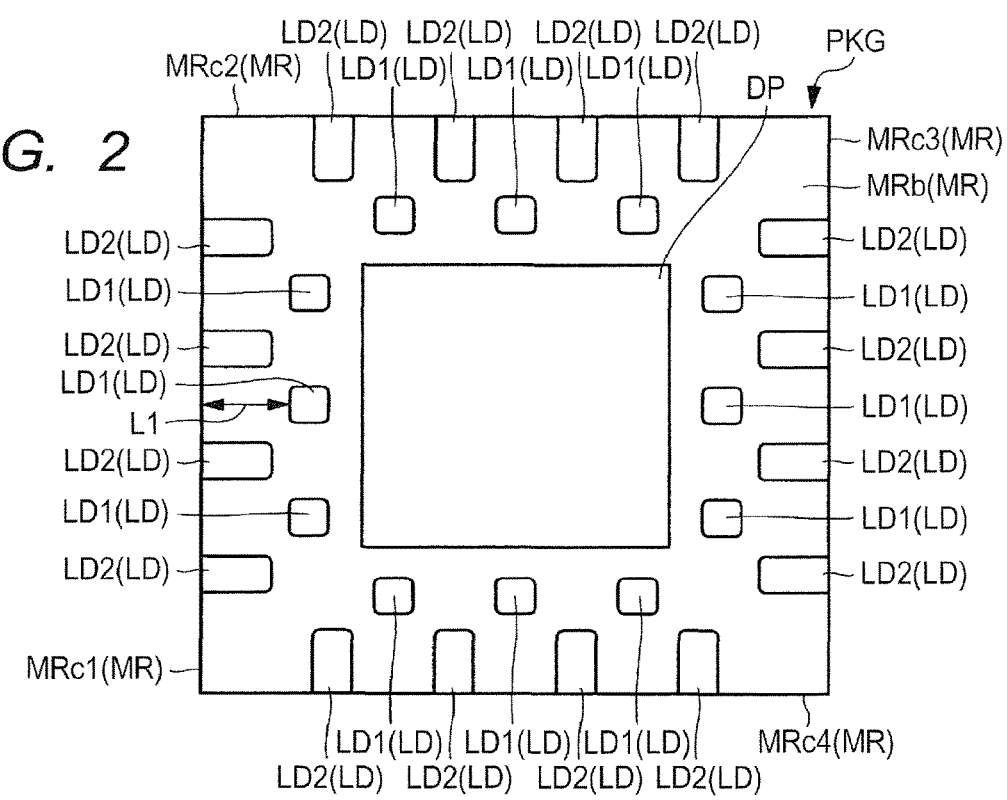
FIG. 2 is a bottom view of the semiconductor device in the embodiment.
Figure 3:
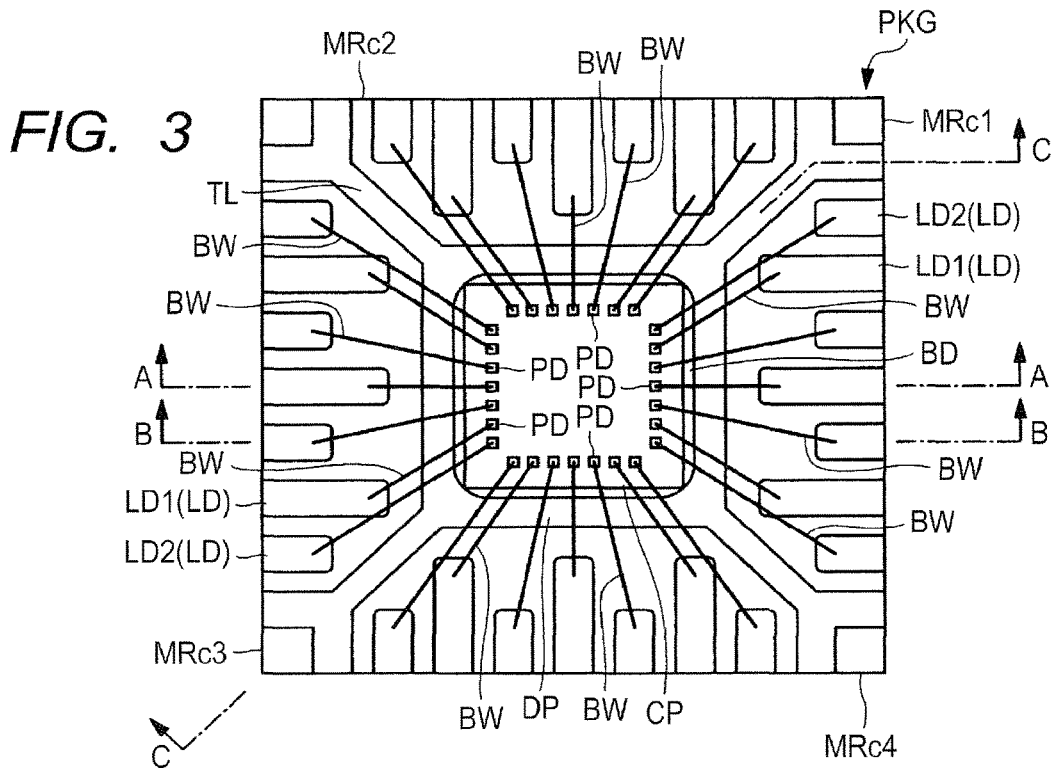
FIG. 3 is a perspective plan view of the semiconductor device in the embodiment.
Figure 4:
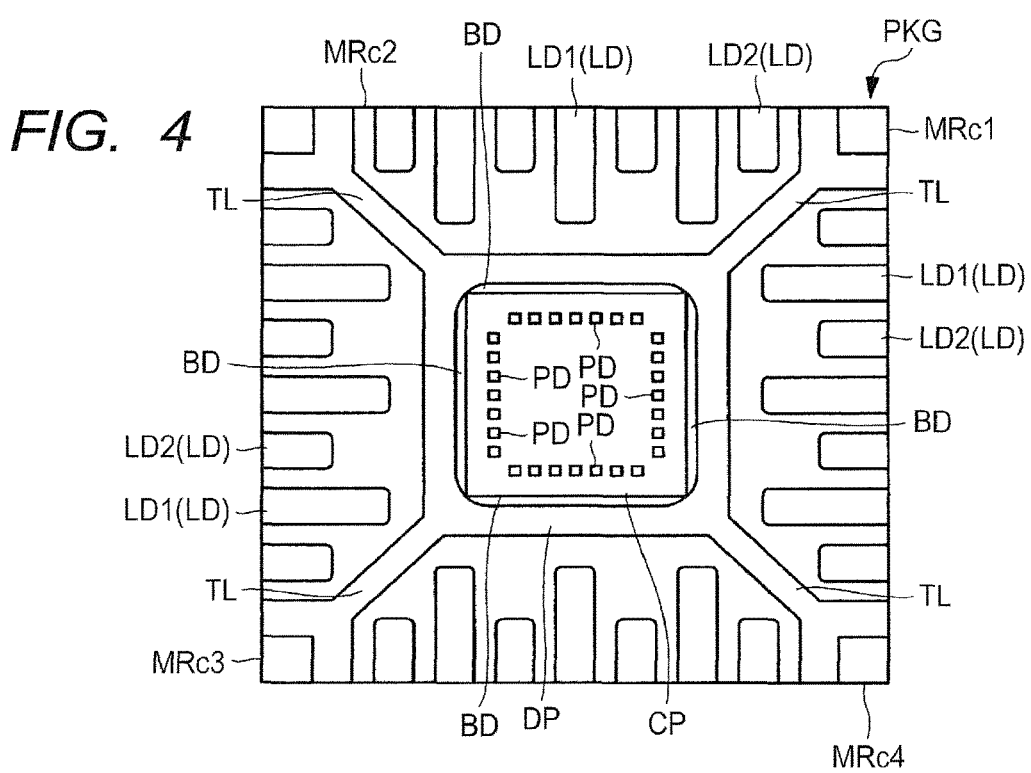
FIG. 4 is a perspective plan view of the semiconductor device in the embodiment.
Figure 5:
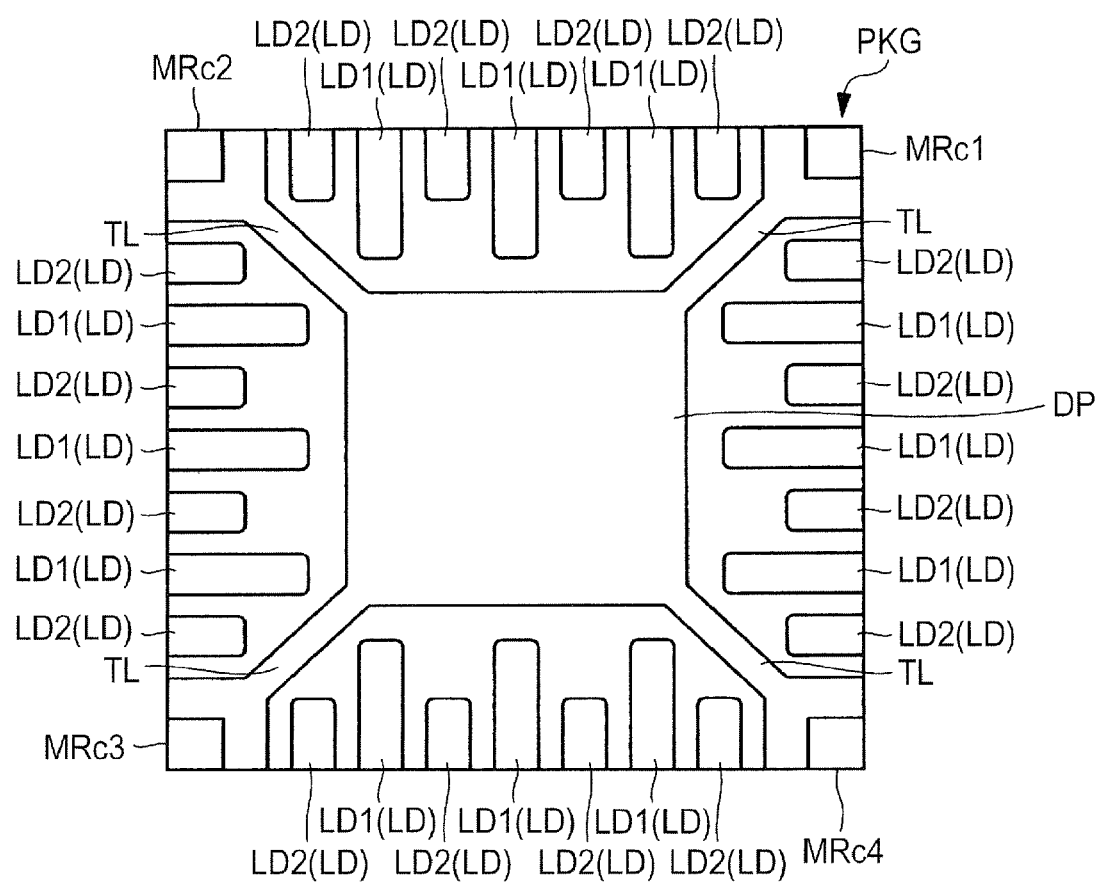
FIG. 5 is a perspective plan view of the semiconductor device in the embodiment.
Figure 6:
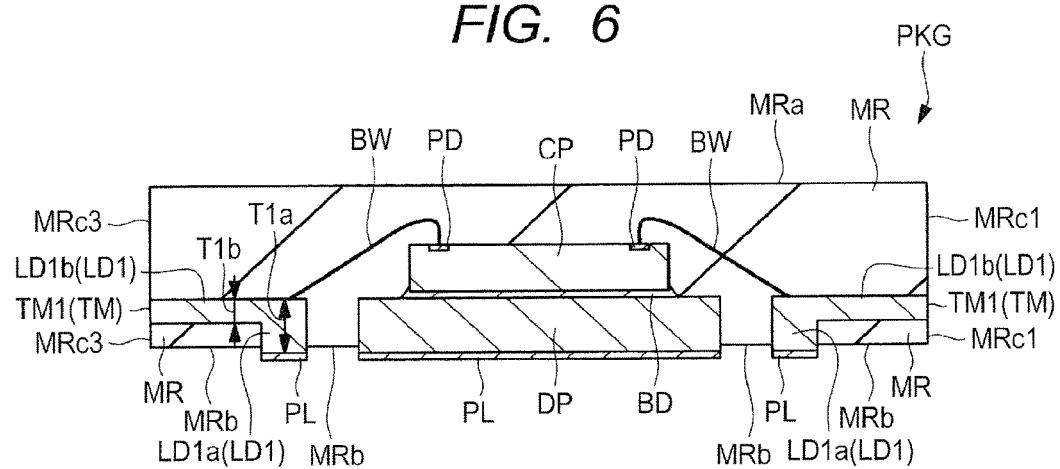
FIG. 6 is a cross-sectional view of the semiconductor device in the embodiment.
Figure 7:
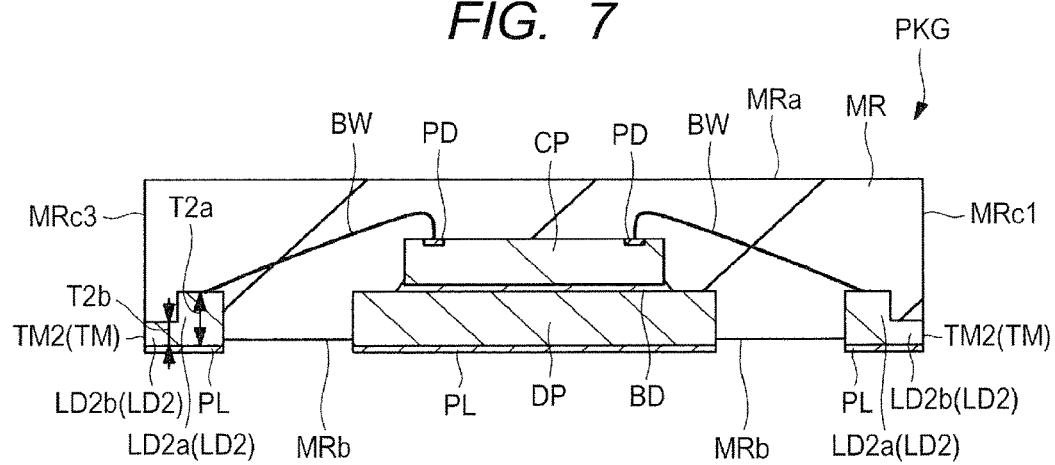
FIG. 7 is a cross-sectional view of the semiconductor device in the embodiment.
Figure 8:
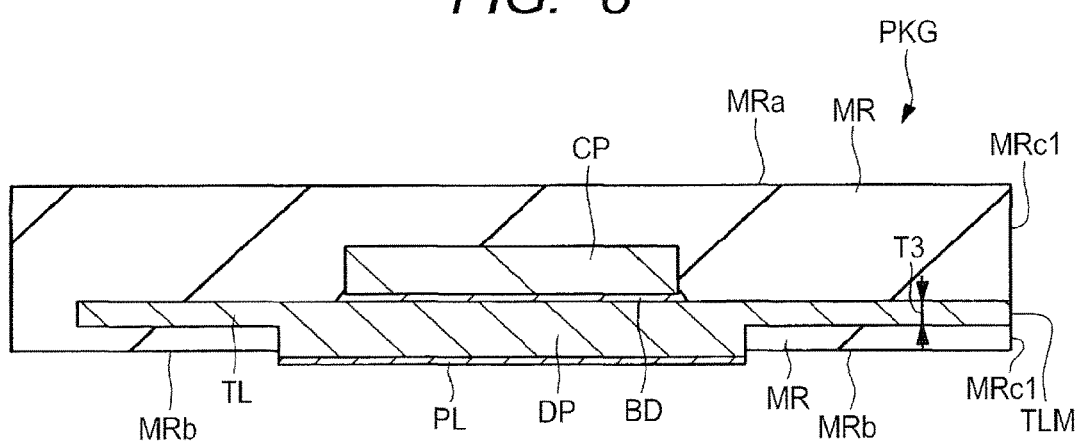
FIG. 8 is a cross-sectional view of the semiconductor device in the embodiment.
Figure 9:
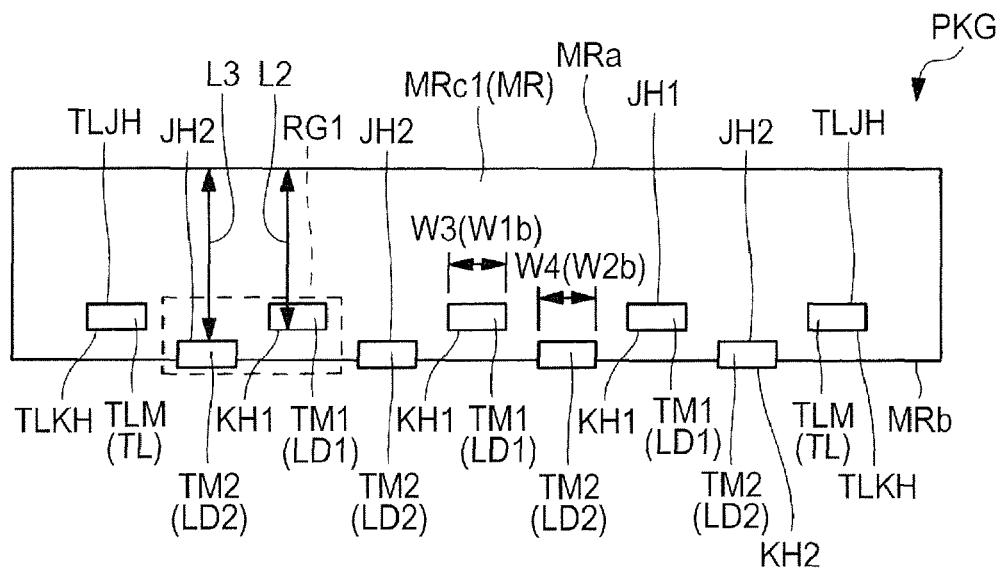
FIG. 9 is a side view of the semiconductor device in the embodiment.
Figure 10:
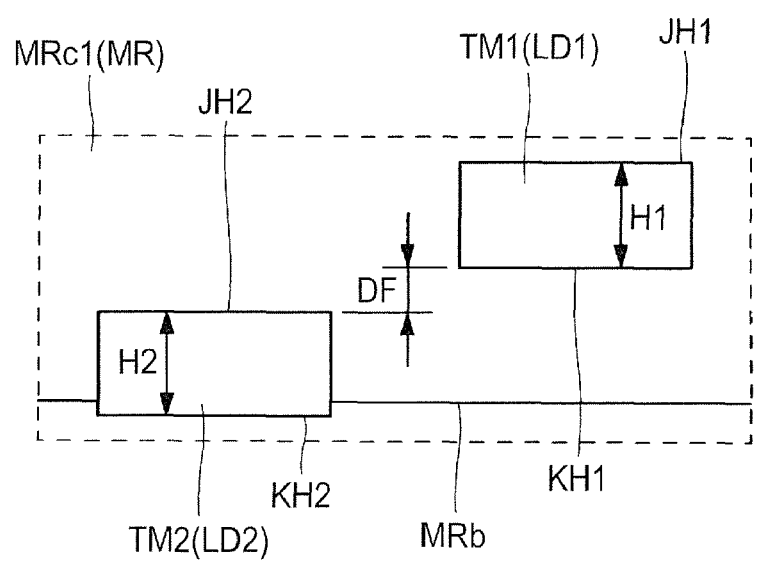
FIG. 10 is a partially enlarged side view showing a part of FIG. 9 in enlarged relation.
Figure 11:
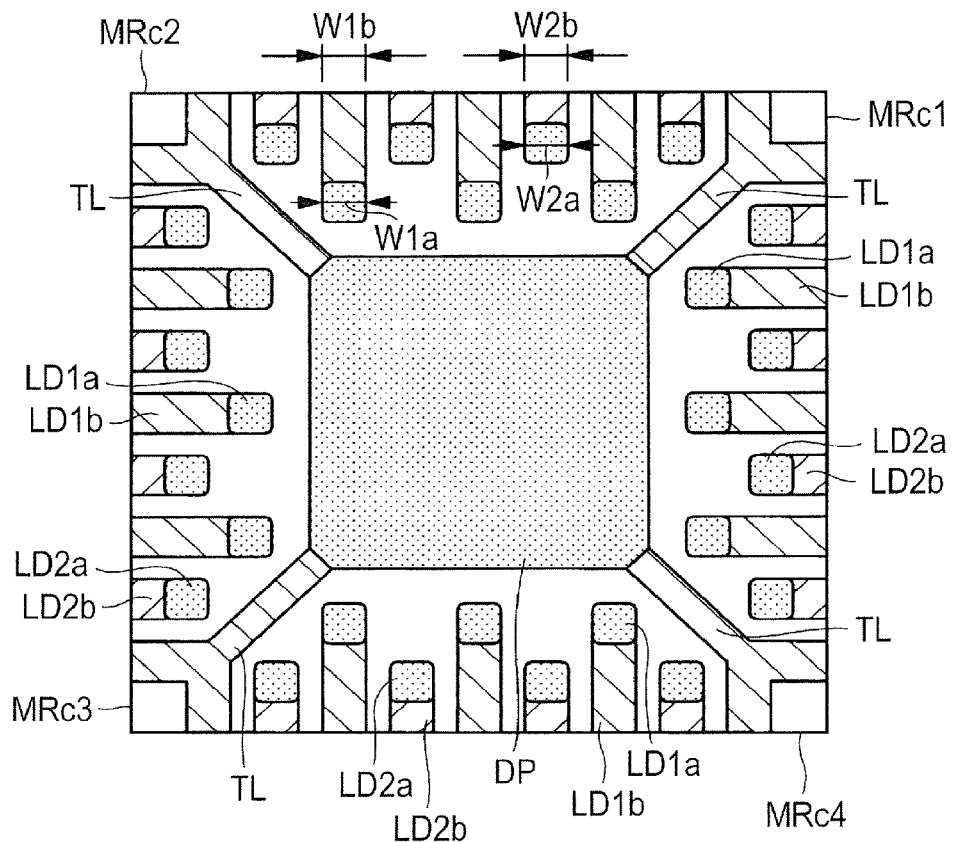
FIG. 11 is a perspective plan view of the semiconductor device in the embodiment.

FIG. 1 is a top view of a semiconductor device PKG in the embodiment of the present invention. FIG. 2 is a bottom view (back-side view) of the semiconductor device PKG. FIGS. 3 to 5 are perspective plan views of the semiconductor device PKG. FIGS. 6 to 8 are cross-sectional views of the semiconductor device PKG. FIG. 9 is a side view of the semiconductor device PKG. FIG. 10 is a partially enlarged side view in which a part of FIG. 9 is enlarged. FIG. 11 is also a perspective plan view of the semiconductor device PKG.

FIG. 3 shows a perspective plan view of the upper surface of the semiconductor device PKG when viewed through a sealing portion MR. FIG. 4 also shows a perspective plan view of the upper surface of the semiconductor device PKG when viewed also through wires BW in FIG. 3. FIG. 5 shows a perspective plan view of the upper surface of the semiconductor device PKG when viewed also through a semiconductor chip CP in FIG. 4. The cross section of the semiconductor device PKG at the position along the line A-A in each of FIGS. 1 and 3 corresponds to FIG. 6. The cross section of the semiconductor device PKG at the position along the line B-B in each of FIGS. 1 and 3 corresponds to FIG. 7. The cross section of the semiconductor device PKG at the position along the line C-C in each of FIGS. 1 and 3 corresponds to FIG. 8. FIG. 9 shows a side view of a side surface MRc1 of a sealing portion MR. A side view of a side surface MRc2 of the sealing portion MR, a side view of a side surface MRc3 of the sealing portion MR, and a side view of a side surface MRc4 of the sealing portion MR are also similar to FIG. 9. FIG. 10 shows an enlarged view of a region RG1 enclosed by the dotted line in FIG. 9. FIG. 11 shows the same perspective plan view as that shown in FIG. 5, but the respective portions of leads LD1 and LD2, a die pad DP, and suspension leads TL which have different thicknesses are hatched to be distinguishable from each other.

The semiconductor device (semiconductor package) PKG in the present embodiment shown in each of FIGS. 1 to 11 is a semiconductor device in the form of a resin-sealed surface-mounted semiconductor package, which is a QFN (Quad Flat Non-Leaded package) type semiconductor device herein. The following will describe a configuration of the semiconductor package PKG with reference to FIGS. 1 to 11.

The semiconductor device PKG in the present embodiment shown in FIGS. 1 to 11 includes the semiconductor chip CP, the die pad (chip mounting portion or tab) DP over which the semiconductor chip CP is mounted, a plurality of leads LD formed of a conductor, the plurality of wires BW electrically connecting a plurality of pad electrodes PD of the semiconductor chip CP with the plurality of leads LD, and a sealing portion (resin sealing portion or sealed body) MR which seals the semiconductor chip CP, the die pad DP, the leads LD, and the wires BS.

The sealing portion MR (resin-sealed body) is made of a resin material such as, e.g., a thermosetting resin material and can also contain a filler or the like. For example, the sealing portion MR can be formed using an epoxy resin containing a filler or the like. Besides an epoxy-based resin, for the purpose of reducing a stress or the like, a biphenyl-based thermosetting resin to which, e.g., a phenol-based curing agent, silicone rubber, a filler, or the like is added may also be used as the material of the sealing portion MR.

The sealing portion MR has an upper surface (top surface) MRa as one of the main surfaces thereof, a lower surface (back surface or bottom surface) MRb as the main surface opposite to the upper surface MRa, and the plurality of side surfaces MRc1, MRc2, MRc3, and MRc4 crossing the upper and lower surfaces MRa and MRb. That is, the sealing portion MR has a thin-plate outer appearance defined by the upper and lower surfaces MRa and MRb and the plurality of side surfaces MTc1, MRc2, MRc3, and MRc4. The plurality of side surfaces MRc1, MRc2, MRc3, and MRc4 are located between the upper and lower surfaces MRa and MRb.

Each of the upper and lower surfaces MRa and MRb of the sealing portion MR has a rectangular (rectangle) shape. Accordingly, the sealing portion MR also has a rectangular two-dimensional shape and therefore has the four side surfaces MRc1, MRc2, MRc3, and MRc4. Among the side surfaces MRc1, MRc2, MRc3, and MRc4 of the sealing portion MR, the side surfaces MRc1 and MRc3 are located opposite to each other, and the side surfaces MRc2 and MRc4 are located opposite to each other. The side surface MRc1 and each of the side surfaces MRc2 and MRc4 cross each other, and the side surface MRc3 and each of the side surfaces MRc2 and MRc4 cross each other.

The side surfaces MRc1, MRc2, MRc3, and MRc4 of the sealing portion MR are formed of cut surfaces (cut surfaces of a sealing portion MR1) resulting from the cutting of the sealing portion MR1 with a dicing blade BRD (rotary blade) described later. Accordingly, each of the side surfaces MRc1, MRc2, MRc3, and MRc4 of the sealing portion MR as the cut surfaces is generally perpendicular to the lower and upper surfaces MRb and MRa of the sealing portion MR. That is, the angle formed between the lower surface MRb of the sealing portion MR and each of the side surfaces MRc1, MRc2, MRc3, and MRc4 thereof is about 90°, and the angle formed between the upper surface MRa of the sealing portion MR and each of the side surfaces MRc1, MRc2, MRc3, and MRc4 thereof is also about 90°. In the upper surface MRa of the sealing portion MR, an identification mark such as a product number can also be formed.

The plurality of leads (lead portions) LD are formed of a conductor and preferably made of a metal material such as copper (Cu) or a copper alloy. The plurality of leads LD are sealed in the sealing portion MR. However, each of the leads LD has at least a portion thereof exposed from the lower surface MRb of the sealing portion MR. An end surface (end portion or cut surface) TM of each of the leads LD which is opposite to the end surface (end portion) thereof closer to the die pad DP is exposed from any of the side surfaces (MRc1, MRc2, MRc3, and MRc4) of the sealing portion MR. The surface (portion) of each of the leads LD which is exposed from the lower surface MRb of the sealing portion MR functions as an external connection terminal portion (external terminal) of the semiconductor device PKG. Each of the leads LD scarcely protrudes from the side surface of the sealing portion MR.

Each of the leads LD has the end surface (end portion) closer to the die pad DP and the end surface (end portion or cut surface) TM opposite thereto. The end surface (end portion) of each of the leads LD closer to the die pad DP is hereinafter referred to as the front end surface (front end portion) of the lead LD. The front end surface and the end surface TM of each of the leads LD are the end surfaces (end portions) located opposite to each other in the extending direction of the lead LD.

The end surface TM of each of the leads LD is formed of the cut surface of the lead LD when the sealing portion MR1 described later is cut with the dicing blade BRD (rotary blade) described later. Accordingly, the end surface TM of the lead LD can also be regarded as the cut surface of the lead LD. Consequently, the end surface TM of each of the leads LD scarcely protrudes from the side surface (MRc1, MRc2, MRc3, or MRc4) of the sealing portion MR. The side surface (MRc1, MRc2, MRc3, or MRc4) of the sealing portion MR and the end surfaces TM of the leads LD exposed thereat form substantially the same plane.

The die pad DP is the chip mounting portion over which the semiconductor chip CP is mounted. The die pad DP is formed to have, e.g., a rectangular two-dimensional shape. The die pad DP has a side surface along the side surface MRc1 of the sealing portion MR, a side surface along the side surface MRc2 of the sealing portion MR, a side surface along the side surface MRc3 of the sealing portion MR, and a side surface along the side surface MRc4 of the sealing portion MR.

The die pad DP is sealed in the sealing portion MR, but the lower surface of the die pad DP is exposed from the lower surface MRb of the sealing portion MR. Note that each of FIGS. 2 and 6 to 8 shows the case where the lower surface of the die pad DP is exposed from the lower surface MRb of the sealing portion MR. However, in another form, it is also possible to prevent the die pad DP from being exposed from the lower surface MRb of the sealing portion MR. In that case, the lower surface of the die pad DP is covered with the sealing portion MR.

The die pad DP is formed of a conductor and preferably made of a metal material such as copper (Cu) or a copper alloy. More preferably, the die pad DP and the plurality of leads LD each included in the semiconductor device PKG are formed of the same material. This facilitates the production of the lead frame in which the die pad DP and the plurality of leads LD are coupled to each other as well as the manufacturing of the semiconductor device PKG using the lead frame.

The plurality of leads LD included the semiconductor device PKG are disposed around the die pad DP in plan view. Accordingly, the plurality of leads LD included in the semiconductor device PKG include the plurality of leads LD disposed closer to the side surface MRc1 of the sealing portion MR, the plurality of leads LD disposed closer to the side surface MRc2 of the sealing portion MR, the plurality of leads LD disposed closer to the side surface MRc3 of the sealing portion MR, and the plurality of leads LD disposed closer to the side surface MRc4 of the sealing portion MR.

That is, between the die pad DP and the side surface MRc1 of the sealing portion MR, the plurality of leads LD are disposed (arranged) along the side surface MRc1 of the sealing portion MR and, between the die pad DP and the side surface MRc2 of the sealing portion MR, the plurality of leads LD are disposed (arranged) along the side surface MRc2 of the sealing portion MR. Also, between the die pad DP and the side surface MRc3 of the sealing portion MR, the plurality of leads LD are disposed (arranged) along the side surface MRc3 of the sealing portion MR and, between the die pad DP and the side surface MRc4 of the sealing portion MR, the plurality of leads LD are disposed (arranged) along the side surface MRc4 of the sealing portion MR.

The respective end surfaces TM of the plurality of leads LD disposed closer to the side surface MRc1 of the sealing portion MR are exposed from the side surface MRc1 of the sealing portion MR. Also, the respective end surfaces TM of the plurality of leads LD disposed closer to the side surface MRc2 of the sealing portion MR are exposed from the side surface MRc2 of the sealing portion MR. Also, the respective end surfaces TM of the plurality of leads LD disposed closer to the side surface MRc3 of the sealing portion MR are exposed from the side surface MRc3 of the sealing portion MR. Also, the respective end surfaces TM of the plurality of leads LD disposed closer to the side surface MRc4 of the sealing portion MR are exposed from the side surface MRc4 of the sealing portion MR.

The four corners of the rectangle forming the two-dimensional shape of the die pad DP are formed integrally with the respective suspension leads TL. Each of the suspension leads TL is formed of the same material as that of the die pad DP to be integral with the die pad DP. The four corners of the outer edge of the die pad DP are formed integrally with the suspension leads LD. The suspension leads TL extend in the sealing portion having a rectangular two-dimensional shape toward the four corners of the sealing portion MR. In the case shown in FIGS. 3 to 5, each of the suspension leads TL is branched to two portions in the vicinity of the corner portion of the sealing portion MR. The two front end surfaces (end surfaces TLM) resulting from the branching are exposed at the two side surfaces (side surfaces of the sealing portion MR) forming the corner portion.

The end surfaces (exposed surfaces or cur surfaces) TLM of the suspension leads TL exposed from the side surfaces (MRc1, MRc2, MRc3, and MRc4) of the sealing portion MR are formed of the cut surfaces of the suspension leads TL when the sealing portion MR1 described later is cut with the dicing blade BRD (rotary blade) described later. Consequently, each of the suspension leads TL scarcely protrudes from the side surface of the sealing portion MR. The side surface (MRc1, MRc2, MRc3, or MRc4) of the sealing portion MR and the end surfaces TLM of the suspension leads TL exposed thereat form substantially the same plane.

Over the upper surface of the die pad DP, the semiconductor chip CP is mounted with the top surface (upper surface) thereof facing upward and with the back surface (lower surface) thereof facing the die pad DP. In the case shown in FIGS. 3 to 5, the two-dimensional size (plane area) of the die pad DP is larger than the two-dimensional size (plane area) of the semiconductor chip CP. In plan view, the semiconductor chip CP is included in the upper surface of the die pad DP. In another form, it may also be possible that the two-dimensional size of the die pad DP is smaller than the two-dimensional size of the semiconductor chip CP. In that case, in plan view, the outer peripheral portion of the semiconductor chip CP protrudes from the die pad DP.

It is assumed herein that, of the two main surfaces located opposite to each other, the main surface where the plurality of pad electrodes PD are formed is referred to as the top surface of the semiconductor chip CP and the main surface opposite to the top surface and facing the die pad DP is referred to as the back surface of the semiconductor chip CP.

The semiconductor chip CP is manufactured by forming various semiconductor elements or semiconductor integrated circuits in the main surface of a semiconductor substrate (semiconductor wafer) made of, e.g., monocrystalline silicon or the like and then dividing the semiconductor substrate into individual semiconductor chips by dicing or the like. The two-dimensional shape of the semiconductor chip CP crossing the thickness thereof is a rectangle.

The back surface of the semiconductor chip CP is bonded to the upper surface of the die pad DP via a bonding material (bonding material layer or an adhesion layer) BD to be fixed thereto. The semiconductor chip CP is sealed in the sealing portion MR and is not exposed from the sealing portion MR. There are cases where the bonding material BD is a conductive material and where the bonding material BD is an insulating bonding material.

Over the top surface of the semiconductor chip CP, the plurality of pad electrodes (pads or bonding pads) PD are formed. The plurality of pad electrodes PD of the semiconductor chip CP and the plurality of leads LD are electrically connected with each other via the plurality of wires (bonding wires) BW. That is, each of the wires BW has one end connected with the pad electrode PD of the semiconductor chip CP and the other end connected with the lead LD. Thus, the pad electrodes PD of the semiconductor chip CP and the leads LD are electrically connected with each other via the wires BW.

The wires (bonding wires) BW are conductive connecting members. More specifically, the wires BW are conductive wires. Since the wires BW are made of metal, the wires BW can be regarded as metal wires (thin metal wires). As the wires BW, gold (Au) wires, copper (Cu) wires, aluminum (Al) wires, or the like can be used appropriately. The wires BW are sealed in the sealing portion MR and are not exposed from the sealing portion MR.

The top surface of the semiconductor chip CP has a rectangular two-dimensional shape and has a side along the side surface MRc1 of the sealing portion MR (side closer to the side surface MRc1), a side along the side surface MRc2 of the sealing portion MR (side closer to the side surface MRc2), a side along the side surface MRc3 of the sealing portion MR (side closer to the side surface MRc3), and a side along the side surface MRc4 of the sealing portion MR (side closer to the side surface MRc4). The plurality of pad electrodes PD arranged along the side closer to the side surface MRc1 over the top surface of the semiconductor chip CP are electrically connected with the plurality of leads LD disposed closer to the side surface MRc1 of the sealing portion MR via the plurality of wires BW. Also, the plurality of pad electrodes PD arranged along the side closer to the side surface MRc2 over the top surface of the semiconductor chip CP are electrically connected with the plurality of leads LD disposed closer to the side surface MRc2 of the sealing portion MR via the plurality of wires BW. Also, the plurality of pad electrodes PD arranged along the side closer to the side surface MRc3 over the top surface of the semiconductor chip CP are electrically connected with the plurality of leads LD disposed closer to the side surface MRc3 of the sealing portion MR via the plurality of wires BW. Also, the plurality of pad electrodes PD arranged along the side closer to the side surface MRc4 over the top surface of the semiconductor chip CP are electrically connected with the plurality of leads LD disposed closer to the side surface MRc4 of the sealing portion MR via the plurality of wires BW.

The plurality of leads LD included in the semiconductor device PKG are disposed around the die pad DP in plan view. The leads LD include the leads LD1 and the leads LD2. The leads LD1 and LD2 are alternately disposed around the die pad DP in plan view. That is, along any of the side surfaces MRc1, MRc2, MRc3, and MRc4 of the sealing portion MR, the leads LD1 and LD2 are alternately disposed. Along each of the side surfaces MRc1, MRc2, MRc3, and MRc4 of the sealing portion MR, the lead LD next to each of the leads LD1 is the lead LD2, and the lead LD next to each of the leads LD2 is the lead LD1. Thus, the leads LD1 and LD2 are next to each other.

The leads LD1 extend closer to the die pad DP than the leads LD2. That is, when a comparison is made between the leads LD1 and LD2 next to each other, the front end surface of each of the leads LD1 is located closer to the die pad DP than the front end surface of each of the leads LD2. That is, when a comparison is made between the leads LD1 and LD2 next to each other, the distance (space) between the front end surface of the lead LD1 and the die pad DP is shorter than the distance (space) between the front end surface of the lead LD2 and the die pad DP.

Each of the leads LD1 integrally has a thicker portion (larger thickness portion) LD1a having a larger thickness and a thinner portion (smaller thickness portion) LD1b having a smaller thickness (see FIG. 6). Also, each of the leads LD2 integrally has a thicker portion (larger thickness portion) LD2a having a larger thickness and a thinner portion (smaller thickness portion) LD2b having a smaller thickness (see FIG. 7). In the lead LD1, a thickness T1b of the thinner portion LD1b is smaller than a thickness T1a of the thicker portion LD1a (i.e., T1b<T1a is satisfied). Also, in the lead LD2, a thickness T2b of the thinner portion LD2b is smaller than a thickness T2a of the thicker portion LD2a (i.e., T2b<T2a is satisfied). The thickness T1a of the thicker portion LD1a of the lead LD1 is substantially equal to the thickness T2a of the thicker portion LD2a of the lead LD2 (i.e., T1a=T2a is satisfied). Also, the thickness T1b of the thinner portion LD1b of the lead LD1 is substantially equal to the thickness T2b of the thinner portion LD2b of the lead LD2 (i.e., T1b=T2b is satisfied).

That is, the lead LD1 (first lead) integrally has the thicker portion LD1a (first thicker portion) and the thinner portion LD1b (first thinner portion) thinner than the thicker portion LD1a which are next to each other in the extending direction of the lead LD1. The thicker portion LD1a is located closer to the die pad DP than the thinner portion LD1b. Also, the lead LD2 (second lead) integrally has the thicker portion LD2a (second thicker portion) and the thinner portion LD2b (second thinner portion) thinner than the thicker portion LD2a which are next to each other in the extending direction of the lead LD2. The thicker portion LD2a is located closer to the die pad DP than the thinner portion LD2b.

Note that, in FIG. 11, the leads LD1 and LD2, the die pad DP, and the suspension leads TL are hatched to allow the respective thicknesses thereof to be recognized. In FIG. 11, the regions hatched with dots are thicker regions and therefore the die pad DP, the thicker portions LD1a of the leads LD1, and the thicker portions LD2a of the leads LD2 are hatched with dots. Also, in FIG. 11, the regions hatched with oblique lines are thinner regions and therefore the thinner portions LD1b of the leads LD1, the thinner portions LD2b of the leads LD2, and the suspension leads TL are hatched with oblique lines. However, the oblique lines hatching the thinner portions LD1b of the leads LD1 and the oblique lines hatching the thinner portions LD2b of the leads LD2 are provided in different orientations. This is because the thickness of each of the thinner portions LD1b of the leads LD1 is reduced by half etching performed on the lower surface thereof, while the thickness of each of the thinner portions LD2b of the leads LD2 is reduced by half etching performed on the upper surface thereof. On the other hand, the oblique lines hatching the thinner portions LD1b of the leads LD1 and the oblique lines hatching the suspension leads TL are provided in the same orientation. This is because the respective thicknesses of the thinner portions LD1b of the leads LD1 and the suspension leads TL are reduced by half etching performed on the lower surfaces thereof. It follows therefore that, in FIG. 11, three types of hatching are used, but the respective thicknesses of the regions with the same type of hatching are equal (the same). By referring to FIGS. 6 to 8 and 11, the respective thicknesses of the leads LD1 and LD2, the die pad DP, and the suspension lead TL can be seen.

As can also be seen from FIG. 11, a width W1$b$ of the thinner portion LD1$b$ of each of the leads LD1 is substantially equal to a width W1$a$ of the thicker portion LD1$a$ of the lead LD1 (W1$a$=W1$b$). Also, a width W2$b$ of the thinner portion LD2$b$ of each of the leads LD2 is substantially equal to a width W2$a$ of the thicker portion LD2$a$ of the lead LD2 (W2$a$=W2$b$). Also, the width W1$b$ of the thinner portion LD1$b$ of the lead LD1 is substantially equal to the width W2$b$ of the thinner portion LD2$b$ of the lead LD2 (W1$b$=W2$b$). Also, the width W1$a$ of the thicker portion LD1$a$ of the lead LD1 is substantially equal to the width W2$a$ of the thicker portion LD2$a$ of the lead LD2 (W1$a$=W2$a$). Accordingly, a lateral dimension W3 of an end surface TM1 of the lead LD1 is equal to a lateral dimension W4 of an end surface TM2 of the lead LD2 (W3=W4).

Note that the width W1$b$ of the thinner portion LD1$b$ of each of the leads LD1 and the width W1$a$ of the thicker portion LD1$a$ of the lead LD1 correspond to widths (dimensions) in directions parallel with the lower surface MRb of the sealing portion MR and generally perpendicular to the extending direction of the lead LD1. Also, the width W2$b$ of the thinner portion LD2$b$ of each of the leads LD2 and the width W2$a$ of the thicker portion LD2$a$ of the lead LD2 correspond to widths (dimensions) in directions parallel with the lower surface MRb of the sealing portion MR and generally perpendicular to the extending direction of the lead LD2. The lateral dimension W3 of the end surface TM1 of the lead LD1 corresponds to the dimension (length) of the end surface TM1 in a direction parallel with the lower surface MRb of the sealing portion MR1 and accordingly corresponds to the dimension (length) of the end surface TM1 in a direction parallel with the lower surface MRb of the sealing portion MR1 and parallel with the end surface TM1. Also, the lateral dimension W4 of the end surface TM2 of the lead LD2 corresponds to the dimension (length) of the end surface TM2 in a direction parallel with the lower surface MRb of the sealing portion MR1 and accordingly corresponds to the dimension (length) of the end surface TM2 in a direction parallel with the lower surface MRb of the sealing portion MR1 and parallel with the end surface TM2. Since the end surface TM1 of the lead LD1 is formed of the cut surface of the thinner portion LD1$b$ of the lead LD1, the lateral dimension W3 of the end surface TM1 of the lead LD1 is substantially equal to the width W1$b$ of the thinner portion LD1$b$ of the lead LD1 (W3=W1$b$). Also, since the end surface TM2 of the lead LD2 is formed of the cut surface of the thinner portion LD2$b$ of the lead LD2, the lateral dimension W4 of the end surface TM2 of the lead LD2 is substantially equal to the width W2$b$ of the thinner portion LD2$b$ of the lead LD2 (W4=W2$b$).

The thinner portion LD1$b$ of each of the leads LD1 is formed by performing half etching on the lower surface of the portion of the lead LD1 which serves as the thinner portion LD1$b$ and thus reducing the thickness thereof when the lead frame used to manufacture the semiconductor device PKG is produced. That is, in the lead LD1, the thinner portion LD1$b$ corresponds to the region subjected to the half etching performed on the lower surface thereof and thus having a reduced thickness and the thicker portion LD1$a$ corresponds to the region not subjected to the half etching. On the other hand, the thinner portion LD2$b$ of each of the leads LD2 is formed by performing half etching on the upper surface of the portion of the lead LD2 which serves as the thinner portion LD2$b$ and thus reducing the thickness thereof when the lead frame used to manufacture the semiconductor device PKG is produced. That is, in the lead LD2, the thinner portion LD2$b$ corresponds to the region subjected to the half etching performed on the upper surface thereof and thus having a reduced thickness and the thicker portion LD2$a$ corresponds to the region not subjected to the half etching.

As a result, in each of the leads LD1, the respective upper surfaces of the thinner portion LD1$b$ and the thicker portion LD1$a$ are at the same height position so that no step is formed between the respective upper surfaces of the thinner portion LD1$b$ and the thicker portion LD1$a$. That is, in the lead LD1, the respective upper surfaces of the thinner portion LD1$b$ and the thicker portion LD1$a$ are located on the same plane. However, in the lead LD1, the respective lower surfaces of the thinner portion LD1$b$ and the thicker portion LD1$a$ are at different height positions. The lower surface of the thinner portion LD1$b$ is at a position higher than that of the lower surface of the thicker portion LD1$a$ so that a step is formed between the respective lower surfaces of the thinner portion LD1$b$ and the thicker portion LD1$a$ (see FIG. 6).

On the other hand, in each of the leads LD2, the respective lower surfaces of the thinner portion LD2$b$ and the thicker portion LD2$a$ are at the same height position so that no step is formed between the respective lower surfaces of the thinner portion LD2$b$ and the thicker portion LD2$a$. That is, in the lead LD2, the respective lower surfaces of the thinner portion LD2$b$ and the thicker portion LD2$a$ are located on the same plane. However, in the lead LD2, the respective upper surfaces of the thinner portion LD2$b$ and the thicker portion LD2$a$ are at different height positions. The upper surface of the thinner portion LD2$b$ is at a position lower than that of the upper surface of the thicker portion LD2$a$ so that a step is formed between the respective upper surfaces of the thinner portion LD2$b$ and the thicker portion LD2$a$ (see FIG. 7).

In each of the leads LD1, the thicker portion LD1$a$ and the thinner portion LD1$b$ are next to each other in the extending direction of the lead LD1. The thicker portion LD1$a$ is located closer to the die pad DP, while the thinner portion LD1$b$ is located closer to the side surface of the sealing portion MR. Also, in each of the leads LD2, the thicker portion LD2$a$ and the thinner portion LD2$b$ are next to each other in the extending direction of the lead LD2. The thicker portion LD2$a$ is located closer to the die pad DP, while the thinner portion LD2$b$ is located closer to the side surface of the sealing portion MR. With the respective upper surfaces of the thicker portions LD1$a$ and LD2$a$ of the leads LD1 and LD2, the wires BW are connected.

In each of the leads LD1, the lower surface of the thicker portion LD1$a$ is exposed from the lower surface MR of the sealing portion MR, while the lower surface of the thinner portion LD1$b$ is covered with the sealing portion MR and is not exposed from the lower surface MRb of the sealing portion MR. On the other hand, in each of the leads LD2, the respective lower surfaces of the thicker portion LD2$a$ and the thinner portion LD2$b$ are exposed from the lower surface MRb of the sealing portion MR. Consequently, each of the leads LD2 has the entire lower surface thereof exposed from the lower surface MRb of the sealing portion MR.

The lower surface of the semiconductor device PKG corresponding to the lower surface MRb of the sealing portion MR serves as the mounting surface of the semiconductor device PKG. The respective lower surfaces of the thicker portions LD1a of the leads LD1 and the entire lower surfaces of the leads LD2 are exposed from the lower surface MRb of the sealing portion MR to function as the external terminals of the semiconductor device PKG. It is assumed herein that the exposed surfaces of the leads LD1 at the lower surface MRb of the sealing portion MR are referred to as the lower exposed surfaces of the leads LD1, and the exposed surfaces of the leads LD2 at the lower surface MRb of the sealing portion MR are referred to as the lower exposed surfaces of the leads LD2. The lower exposed surfaces of the leads LD1 are formed of the lower surfaces of the thicker portions LD1a of the leads LD1, while the lower exposed surfaces of the leads LD2 are formed of the entire lower surfaces of the leads LD2. The lower exposed surface of each of the leads LD1 and LD2 has a rectangular two-dimensional shape. The two-dimensional size (plane area) of the thicker portion LD1a of each of the leads LD1 is substantially equal to the two-dimensional size (plane area) of the thicker portion LD2a of each of the leads LD2. However, since not only the lower surfaces of the thicker portions LD2a of the leads LD2, but also the lower surfaces of the thinner portions LD2b thereof are exposed from the lower surface MRb of the sealing portion MR, the area of the lower exposed surfaces of the leads LD2 is larger than the area of the lower exposed surfaces of the leads LD1.

In plan view, the distance between the thicker portion LD1a of each of the leads LD1 and the die pad DP is smaller than the distance between the thicker portion LD2a of each of the leads LD2 next to the lead LD1 and the die pad DP. Accordingly, the thicker portion LD1a of the lead LD1 is located closer to the die pad DP than the thicker portion LD2a of the lead LD2. As a result, in plan view, the distance between the lower exposed surface of the lead LD1 and the die pad DP is smaller than the distance between the lower exposed surface of the lead LD2 next to the lead LD1 and the die pad DP. Accordingly, the lower exposed surface of the lead LD1 is located closer to the die pad DP than the lower exposed surface of the lead LD2.

At the lower surface MRb of the sealing portion MR, the lower exposed surfaces of the leads LD2 are located in the peripheral region (outer peripheral portion) of the lower surface MRb of the sealing portion MR and disposed herein at positions adjoining the lateral sides of the lower surface MRb of the sealing portion MR. The lateral sides of the lower surface MRb of the sealing portion MR correspond herein to the sides of the lower surface MRb of the sealing portion MR which form the outermost periphery of the lower surface MRb of the sealing portion MR. The lateral sides of the lower surface MRb of the sealing portion MR are also next to the side surfaces of the sealing portion MR. Also, at the lower surface MRb of the sealing portion MR, the lower exposed surfaces of the leads LD1 are disposed at positions inward of the lower exposed surfaces of the leads LD2. The lower exposed surface of each of the leads LD1 is disposed herein at a position away from the lateral side of the lower surface MRb of the sealing portion MR by a distance L1 (L1>0) (see FIG. 2). The leads LD1 and LD2 are alternately disposed (arranged) around the die pad DP. The respective lower exposed surfaces of the leads LD1 and LD2 functioning as the external terminals of the semiconductor device PKG are disposed in two rows in a staggered configuration (staggered arrangement) along the lateral sides (outer periphery) of the lower surface MRb of the sealing portion MR in the regions in the vicinity of the peripheral portion thereof. By providing such an arrangement, it is possible to provide the semiconductor device PKG with a multi-terminal configuration.

The respective end surfaces TM of the leads LD1 and LD2 are exposed from the side surfaces MRc1, MRc2, MRc3, and MRc4 of the sealing portion MR. It is assumed herein that the end surface TM of each of the leads LD1 is referred to as the end surface TM1 using a reference numeral TM1, and the end surface TM of each of the leads LD2 is referred to as the end surface TM2 using a reference numeral TM2.

The end surface TM1 of each of the leads LD1 is next to the thinner portion LD1b of the lead LD1 and serves as the end surface (cut surface) of the thinner portion LD1b of the lead LD1. Also, the end surface TM2 of each of the leads LD2 is next to the thinner portion LD2b of the lead LD2 and serves as the end surface (cut surface) of the thinner portion LD2b of the lead LD2. That is, the end surface TM1 is formed of the thinner portion LD1b of the lead LD1, while the end surface TM2 is formed of the thinner portion LD2b of the lead LD2. Specifically, the end surface TM1 is the cut surface of the thinner portion LD1b resulting from cutting with the dicing blade BRD (rotary blade) described later, while the end surface TM2 is the cut surface of the thinner portion LD2b resulting from cutting with the dicing blade BRD (rotary blade) described later.

At each of the side surfaces MRc1, MRc2, MRc3, and MRc4 of the sealing portion MR, the end surfaces TM1 of the leads LD1 and the end surfaces TM2 of the leads LD2 are alternately arranged. However, the height position of the end surface TM1 of each of the leads LD1 is different from the height position of the end surface TM2 of each of the leads LD2. The height position of the end surface TM1 of the lead LD1 is higher than the height position of the end surface TM2 of the lead LD2. In other words, the height position of the end surface TM2 of the lead LD2 is lower than the height position of the end surface TM1 of the lead LD1. That is, when a comparison is made between the end surface TM1 of the lead LD1 and the end surface TM2 of the lead LD2, the end surface TM1 of the lead LD1 is located closer to the upper surface MRa of the sealing portion MR than the end surface TM2 of the lead LD2. A dimension H1 of the end surface TM1 of the lead LD1 in a height direction is substantially equal to the thickness T1b of the thinner portion LD1b of the lead LD1 (H1=T1b). A dimension H2 of the end surface TM2 of the lead LD2 in the height direction is substantially equal to the thickness T2b of the thinner portion LD2b of the lead LD2 (H2=T2b).

Note that when a "height" or "height position" is mentioned, the "height" or "height position" is based on the lower surface MRb of the sealing portion MR. It is assumed that the side of the sealing portion MR closer to the upper surface MRa thereof (i.e., the side of the sealing portion MR far away from the lower surface MRb thereof) is assumed to be a higher side and the side of the sealing portion MR far away from the upper surface MR1 thereof (i.e., the side of the sealing portion MR closer to the lower surface MRb thereof) is assumed to be a lower side. Also, the "height direction" is the same as the "thickness direction of the sealing portion MR" and corresponds to a direction generally perpendicular to the lower surface MRb or upper surface MRa of the sealing portion MR. Accordingly, the dimension H1 of the end surface TM1 corresponds to the dimension of the end surface TM1 in the thickness direction of the sealing portion MR, and the dimension H2 of the end surface TM2 corresponds to the dimension of the end surface TM2 in the thickness direction of the sealing portion MR.

The end surface TM1 of each of the leads LD1 has a lower side KH1 and an upper side JH1, and the end surface TM2 of each of the leads LD2 has a lower side KH2 and an upper side JH2 (see FIGS. 9 and 10). That is, the end surface TM1 (first end surface) of the lead LD1 (first lead) has the upper side JH1 (first upper side) closer to the upper surface MRa of the sealing portion MR and the lower side KH1 (first lower side) far away from the upper surface MRa of the sealing portion MR. Also, the end surface TM2 (second end surface) of the lead LD2 (second lead) has the upper side JH2 (second upper side) closer to the upper surface MRa of the sealing portion MR and the lower side KH2 (second lower side) far away from the upper surface MRa of the sealing portion MR.

Note that the lower side KH1 of the end surface TM1 of each of the leads LD1 corresponds to the lower side (closer to the lower surface MRb of the sealing portion MR) of a two-dimensional shape (which is more specifically a quadrilateral shape) forming the end surface TM1 of the lead LD1, and the upper side JH1 of the end surface TM1 of the lead LD1 corresponds to the upper side (closer to the upper surface MRa of the sealing portion MR) of the two-dimensional shape (which is more specifically the quadrilateral shape) forming the end surface TM1 of the lead LD1. Also, the lower side KH2 of the end surface TM2 of each of the leads LD2 corresponds to the lower side (closer to the lower surface MRb of the sealing portion MR) of a two-dimensional shape (which is more specifically a quadrilateral shape) forming the end surface TM2 of the lead LD2, and the upper side JH2 of the end surface TM2 of the lead LD2 corresponds to the upper side (closer to the upper surface MRa of the sealing portion MR) of the two-dimensional shape (which is more specifically the quadrilateral shape) forming the end surface TM2 of the lead LD2.

A comparison is made herein between the respective height positions of the lower side KH1 of the end surface TM1 of each of the leads LD1 and the upper side JH2 of the end surface TM2 of each of the leads LD2 (see FIGS. 9 and 10). At the end surfaces TM1 and TM2 of the leads LD1 and LD2 next to each other at each of the side surfaces MRc1, MRc2, MRc3, and MRc4 of the sealing portion MR, the lower side KH1 of the end surface TM1 of the lead LD1 is at a position higher than that of the upper side JH2 of the end surface TM2 of the lead LD2. In other words, the upper side JH2 of the end surface TM2 of the lead LD2 is at a position lower than that of the lower side KH1 of the end surface TM1 of the lead LD1. That is, when a comparison is made between the lower side KH1 of the end surface TM1 of the lead LD1 and the upper side JH2 of the end surface TM2 of the lead LD2, the lower side KH1 of the end surface TM1 of the lead LD1 is at a position closer to the upper surface MRa of the sealing portion MR than the upper side JH2 of the end surface TM2 of the lead LD2, and the upper side JH2 of the end surface TM2 of the lead LD2 is at a position closer to the lower surface MRb of the sealing portion MR than the lower side KH1 of the end surface TM1 of the lead LD1. In other words, a distance (distance in the thickness direction of the sealing portion MR) L2 between the lower side KH1 of the end surface TM1 of the lead LD1 and the upper surface MRa (i.e., side of the upper surface MRa shown in FIG. 9) of the sealing portion MR is smaller than a distance (distance in the thickness direction of the sealing portion MR) L3 between the upper side JH2 of the end surface TM2 of the lead LD2 and the upper surface MRa (i.e., side of the upper surface MRa shown in FIG. 9) of the sealing portion MR (i.e., L2<L3 is satisfied). Note that each of the distances L2 and L3 is a distance in the thickness direction of the sealing portion MR and shown in FIG. 9.

The thickness of the thinner portion LD1$b$ of each of the leads LD1 is reduced by half etching performed on the lower surface thereof, while the thickness of the thinner portion LD2$b$ of each of the leads LD2 is reduced by half etching performed on the upper surface thereof. The end surface TM1 as the cut surface of the thinner portion LD1$b$ of the lead LD1 and the end surface TM2 as the cut surface of the thinner portion LD2$b$ of the lead LD2 are exposed from the side surfaces MRc1, MRc2, MRc3, and MRc4 of the sealing portion MR. As a result, at each of the side surfaces MRc1, MRc2, MRc3, and MRc4 of the sealing portion MR, the height position of the end surface TM1 of the lead LD1 is higher than the height position of the end surface TM2 of the lead LD2. In addition, the lower side KH1 of the end surface TM1 of the lead LD1 is at a position higher than that of the upper side JH2 of the end surface TM2 of the lead LD2.

Since the lower side KH1 of the end surface TM1 is at a position higher than that of the upper side JH2 of the end surface TM2, the following also holds true. That is, even when one of the end surface TM1 of the lead LD1 and the end surface TM2 of the lead KD2 which are next to each other at the side surface MRc1 of the sealing portion MR is virtually moved in a lateral direction (direction parallel with the lower surface MRb and the side surface MRc1 of the sealing portion MR), the virtually moved one of the end surfaces TM1 and TM2 does not overlap the other of the end surfaces TM1 and TM2. The same applies also to the side surfaces MRc2, MRc3, and MRc4 of the sealing portion MR.

From the lower surface MRb of the sealing portion MR, the lower surfaces of the suspension leads TL are not exposed but, from the side surfaces MRc1, MRc2, MRc3, and MRc4 of the sealing portion MR, the end surfaces TLM of the suspension leads TL are exposed.

The suspension leads TL are formed by performing half etching on the lower surfaces of the portions of the lead frame used to manufacture the semiconductor device PKG which serve as the suspension leads TL when the lead frame is produced and thus reducing the thicknesses thereof. Accordingly, a thickness T3 of each of the suspension leads TL is smaller than the respective thicknesses T1$a$ and T2$a$ of the thicker portions LD1$a$ and LD2$a$ of the leads LD1 and LD2 (T3<T1$a$ and T3<T2$a$) and substantially equal to the thickness T1$b$ of the thinner portion LD1$b$ of the lead LD1 (T3=T1$b$). The dimension of the end surface TLM of each of the suspension leads TL in the height direction is substantially equal to the thickness T3 of the suspension lead TL.

At each of the side surfaces MRc1, MRc2, MRc3, and MRc4 of the sealing portion MR, the height position of the end surface TLM of each of the suspension leads TL is substantially equal to the height position of the end surface TM1 of each of the leads LD1 and is accordingly higher than the height position of the end surface TM2 of each of the leads LD2. That is, when a comparison is made between the end surface TLM of the suspension lead TL and the end surface TM2 of the lead LD2, the end surface TLM of the suspension lead TL is at a position closer to the upper surface MRa of the sealing portion MR (position far away from the lower surface MRb of the sealing portion MR) than the end surface TM2 of the lead LD2.

Note that, at each of the side surfaces MRc1, MRc2, MRc3, and MRc4, the end surface TM of the lead LD located next to the end surfaces TLM of each of the suspension leads TL is not the end surface TM1 of the lead LD1, but the end surface TM2 of the lead LD2. This can be achieved by disposing the leads LD2 as the outermost (bilateral) ones of the leads LD which are arranged over each of the side surfaces MRc1, MRc2, MRc3, and MRc4.

A comparison is made herein between the respective heights of a lower side TLKH of the end surface TLM of each of the suspension leads TL and the upper side JH2 of the end surface TM2 of each of the leads LD2. The end surface TLM of the suspension lead TL has an upper side TLJH closer to the upper surface MRa of the sealing portion MR and the lower side TLKH far away from the upper surface MRa of the sealing portion MR. The lower side TLKH of the end surface TLM of the suspension lead TL corresponds to a lower side (closer to the lower surface MRb of the sealing portion MR) of a quadrilateral shape forming the end surface TLM of the suspension lead TL.

At the end surface TLM of each of the suspension leads TL and the end surface TM2 of each of the leads LD2 which are next to each other at each of the side surfaces MRc1, MRc2, MRc3, and MRc4 of the sealing portion MR, the lower side TLKH of the end surface TLM of the suspension lead TL is at a position higher than that of the upper side JH2 of the end surface TM2 of the lead LD2. In other words, the upper side JH2 of the end surface TM2 of the lead LD2 is at a position lower than that of the lower side TLKH of the end surface TLM of the suspension lead TL. That is, when a comparison is made between the lower side TLKH of the end surface TLM of the suspension lead TL and the upper side JH2 of the end surface TM2 of the lead LD2, the lower side TLKH of the end surface TLM of the suspension lead TL is at a position closer to the upper surface MRa of the sealing portion MR (i.e., position far away from the lower surface MRb of the sealing portion MR) than the upper side JH2 of the end surface TM2 of the lead LD2. In other words, the distance (distance in the thickness direction of the sealing portion MR) between the lower side TLKH of the end surface TLM of the suspension lead TL and the upper surface MRa (i.e., side of the upper surface MRa shown in FIG. 9) of the sealing portion MR is smaller than the distance (distance in the thickness direction of the sealing portion MR) between the upper side JH2 of the end surface TM2 of the lead LD2 and the upper surface MRa (i.e., side of the upper surface MRa shown in FIG. 9) of the sealing portion MR.

Accordingly, the following also holds true. That is, at the side surface MRc1 of the sealing portion MR, even when one of the end surface TLM of each of the suspension leads TL and the end surface TM2 of each of the leads LD2 which are next to each other is virtually moved in the lateral direction (direction parallel with the lower surface MRb and the side surface MRc1 of the sealing portion MR), the virtually moved one of the end surfaces TLM and TM2 does not overlap the other of the end surfaces TLM and TM2. The same applies also to the side surfaces MRc2, MRc3, and MRc4 of the sealing portion MR. Note that the lower side TLKH of the end surface TLM of the suspension lead TL can be located at substantially the same height position as that of the lower side KH1 of the end surface TM1 of each of the leads LD1.

Over the lower exposed surfaces of the leads LD1 exposed from the lower surface MRb of the sealing portion MR, the lower exposed surfaces of the leads LD2 exposed from the lower surface MRb of the sealing portion MR, and the lower surface of the die pad DP exposed from the lower surface MRb of the sealing portion MR, plating layers (plating films) PL are formed (see FIGS. 6 to 8). Each of the plating layers PL is made of a metal layer formed by a plating method and is, e.g., a solder plating layer. The plating layers PL formed over the respective lower exposed surfaces of the leads LD1 and LD2 can improve the reliability of the electrical connection between the terminals or conductor pattern of a mounting substrate and the terminals (lower exposed surfaces of the leads LD1 and LD2) of the semiconductor device PKG when the semiconductor device PKG is mounted over the mounting substrate. Note that, in FIG. 2, the plating layers PL are not shown, but the plating layers PL are formed over the respective lower exposed surfaces of the leads LD1 and LD2 and the lower surface of the die pad DP which are shown in FIG. 2. Since the end surfaces TM1 and TM2 of the leads LD1 and LD2 and the end surfaces TLM of the suspension leads TL which are exposed from the side surfaces MRc1, MRc2, MRc3, and MRc4 of the sealing portion MR are cut surfaces, the plating layers PL are not formed over the end surfaces TM1 and TM2 of the leads LD1 and LD2 and over the end surfaces TLM of the suspension leads TL.

Note that, in the present embodiment, the description has been given of the case where the semiconductor device PKG is a semiconductor package of a QFN type. However, it is also possible to apply a semiconductor package of a type other than the QFN type, e.g., a semiconductor package of a SON (Small Outline Non-leaded package) type to the semiconductor device PKG.

In the present embodiment, the description has been given of the case where, the respective lower surfaces of the thicker portion LD2a and the thinner portion LD2b of each of the leads LD2 are exposed from the lower surface MRb of the sealing portion MR. However, in another form, it is also possible to cover the lower surface of the thinner portion LD2b of the lead LD2 with the sealing portion MR and prevent the lower surface of the thinner portion LD2b of the lead LD2 from being exposed from the lower surface MRb of the sealing portion MR, while allowing the lower surface of the thicker portion LD2a of the lead LD2 to be exposed from the lower surface MRb of the sealing portion MR. In this case, it is necessary to set the height position of the lower surface of the thinner portion LD2b of the lead LD2 higher than that of the lower surface of the thicker portion LD2a of the lead LD2. However, in that case also, such a relationship between the lower side KH1 of the end surface TM1 of the lead LD1 and the upper side JH2 of the end surface TM2 of the lead LD2 that the lower side KH1 is at a position higher than that of the upper side JH2 is maintained. This can reduce the amount (volume) of the leads cut in the dicing step and thus elongate the use lifetime of the dicing blade BRD described later.

However, when consideration is given to the bonding (mounting) strength of the semiconductor device PKG, the case where not only the lower surface of the thicker portion LD2a of each of the leads LD2, but also the lower surface of the thinner portion LD2b of the lead LD2 is exposed from the lower surface MRb of the sealing portion MR as in the present embodiment is preferred to the case where the lower surface of the thinner portion LD2b of the lead LD2 is not exposed from the lower surface MRb of the sealing portion MR. Specifically, by exposing also the lower surface of the thinner portion LD2b of the lead LD2 from the lower surface MRb of the sealing portion MR, the area of the lower exposed surface of the lead LD2 can be increased. Accordingly, when the semiconductor device PKG is mounted over the mounting substrate or the like, it is possible to further improve the bonding strength between the lead LD2 of the semiconductor device PKG and the terminal of the mounting substrate. Therefore, it is possible to further improve the mounting reliability of the semiconductor device PKG.

<About Manufacturing Process of Semiconductor Device>

Figure 12:
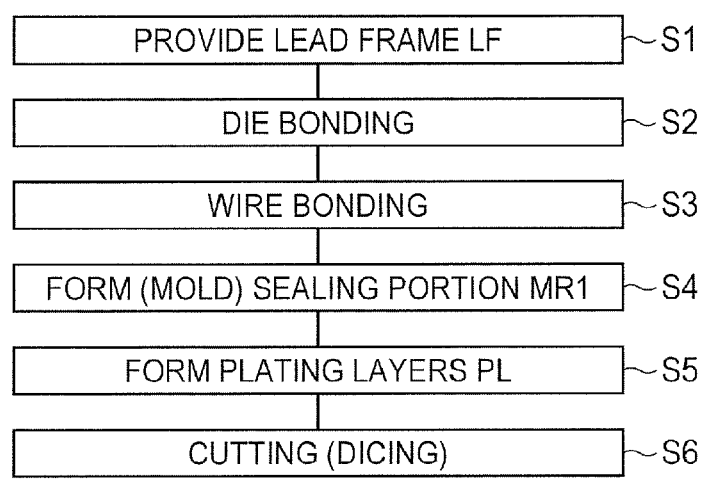
FIG. 12 is a process flow chart showing the manufacturing process of the semiconductor device in the embodiment.
Figure 16:
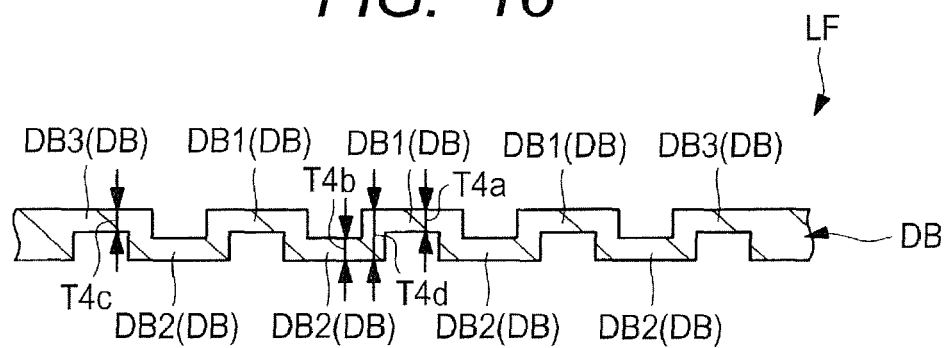
FIG. 16 is a cross-sectional view of the lead frame shown in FIG. 13.

Next, the manufacturing process of the semiconductor device PKG in the present embodiment will be described with reference to FIGS. 12 to 33. FIG. 12 is a process flow chart showing the manufacturing process of the semiconductor device PKG in the present embodiment. Each of FIGS. 13 to 33 is a plan view or a cross-sectional view showing the manufacturing process of the semiconductor device PKG in the present embodiment. Of FIGS. 13 to 33, FIGS. 13, 17, 20, 23, 28, and 31 are plan views (top views), and FIGS. 14 to 16, 18, 19, 21, 22, 24 to 27, 29, 30, 32, and 33 are cross-sectional views. FIGS. 14, 18, 21, 24, 26, 29, and 32 correspond to a cross-sectional view (cross-sectional view corresponding to FIG. 6 described above) at a position corresponding to the line D-D in FIG. 13. FIGS. 15, 19, 22, 25, 27, 30, and 33 correspond to a cross-sectional view (cross-sectional view corresponding to FIG. 7 described above) at a position corresponding to the line E-E in FIG. 13. FIG. 16 corresponds to a cross-sectional view at a position corresponding to the line F-F in FIG. 13.

First, as shown in FIGS. 13 to 16, a lead frame LF for manufacturing the semiconductor device PKG is provided (prepared) (Step S1 in FIG. 12).

Figure 13:
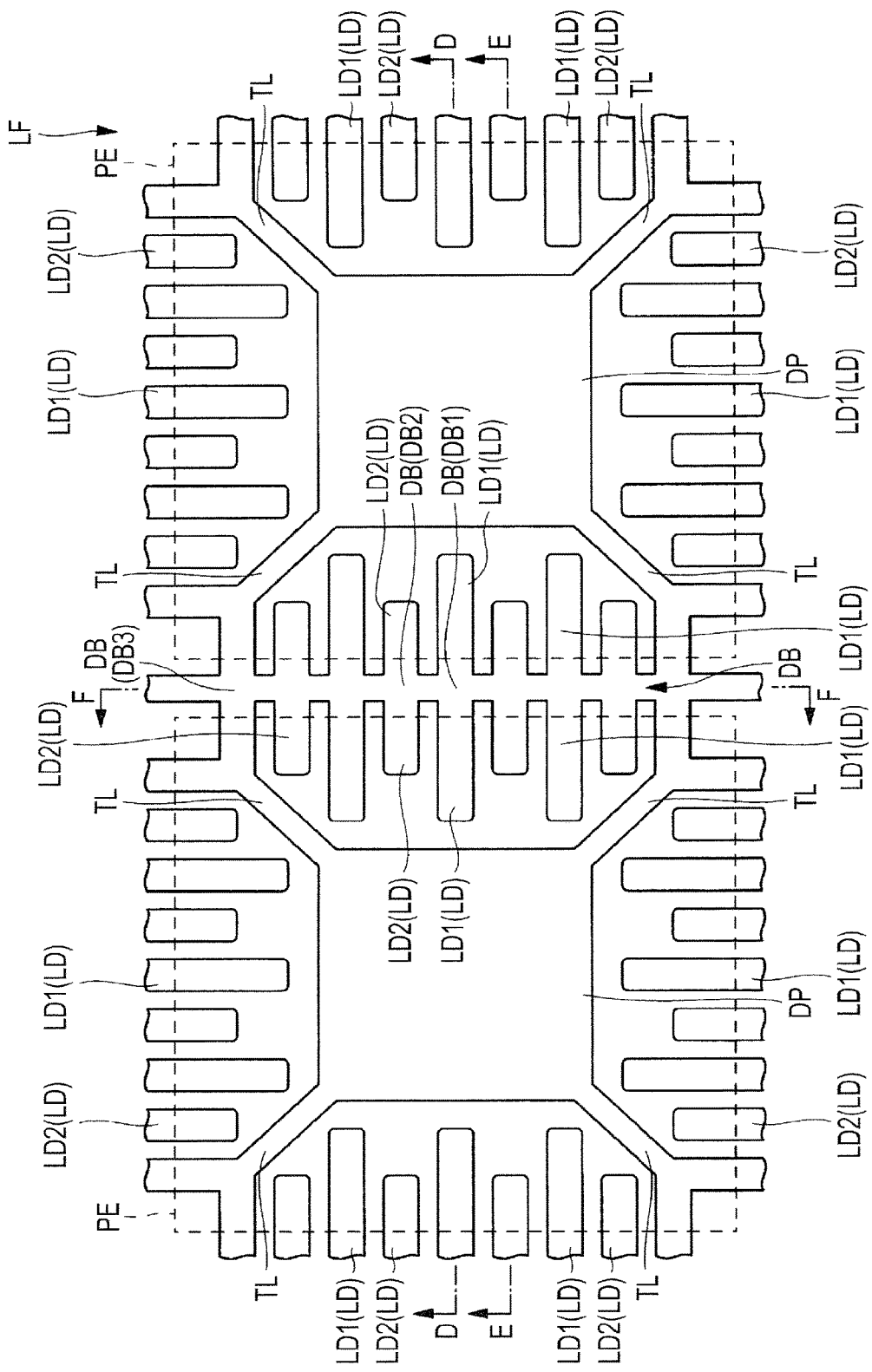
FIG. 13 is a plan view showing a lead frame for manufacturing the semiconductor device in the embodiment.
Figure 14:
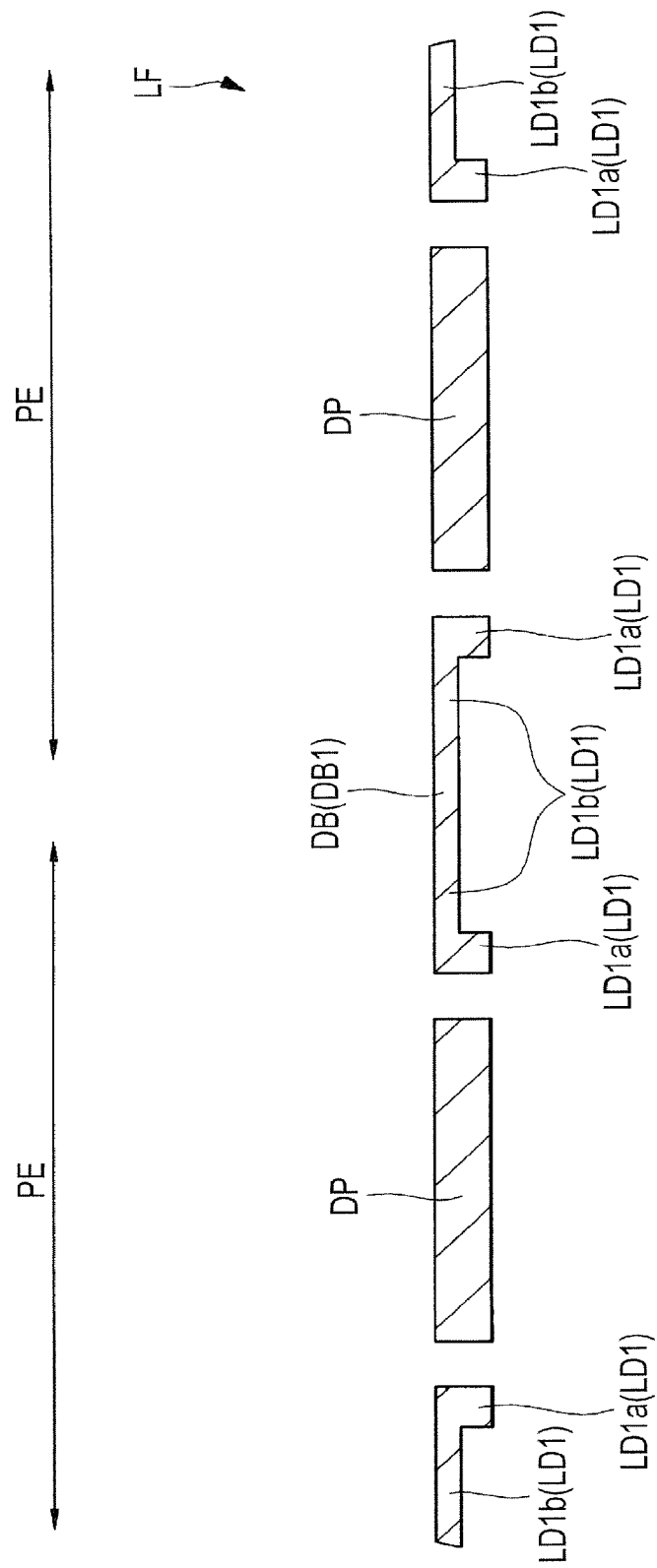
FIG. 14 is a cross-sectional view of the lead frame shown in FIG. 13.
Figure 15:
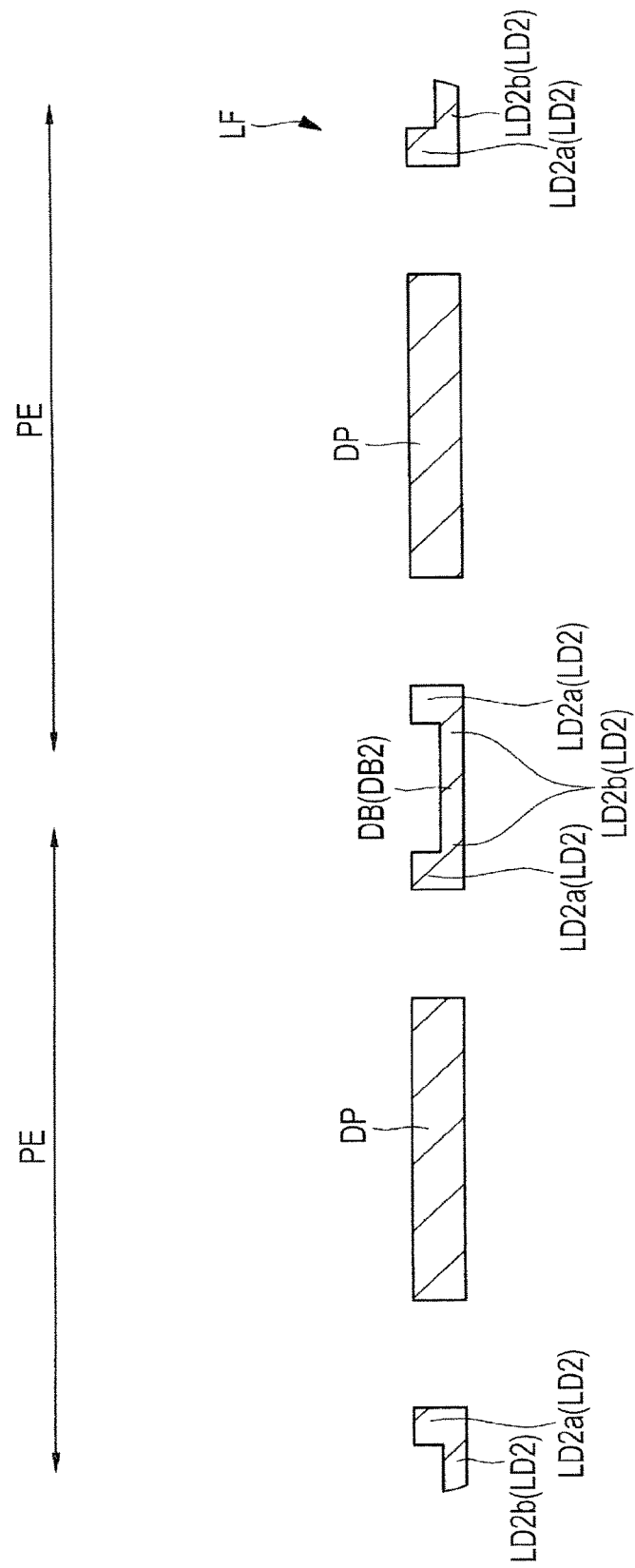
FIG. 15 is a cross-sectional view of the lead frame shown in FIG. 13.

Since a plurality of the semiconductor devices PKG are manufactured using the one lead frame LF, the lead frame LF has a plurality of semiconductor device regions (device regions) PE. Note that each of the semiconductor device regions PE corresponds to a region from which the one semiconductor device PKG is acquired (manufactured). That is, in the lead frame LF, the plurality of (multiple) semiconductor device regions PE are arranged in an array (in rows and columns). FIG. 13 shows a plan view of two of the plurality of semiconductor device regions PE. In FIG. 13, the regions enclosed by the dotted lines correspond to the semiconductor device regions PE. Each of FIGS. 14 and 15 also shows a cross-sectional view of the two semiconductor device regions PE. The regions between the adjacent semiconductor device regions PE correspond to dicing lines (regions to be cut) in Step S6 described later.

In each of the semiconductor device regions PE of the lead frame LF, the die pad DP and the plurality of leads LD (LD1 and LD2) for manufacturing the semiconductor device PKG are disposed. Between the adjacent semiconductor device regions PE, a dam bar (tie bar) DB is disposed. The dam bar DB extends along the sides of the semiconductor device regions PE on both sides thereof between the adjacent semiconductor device regions PE. Accordingly, in plan view, each of the semiconductor device regions PE is circumferentially surrounded by the dam bar DB. In other words, the dam bar DB extends in a grid-like pattern and, in each of the grids, the semiconductor device region PE is located. Since the dam bar DB is disposed in the region between the adjacent semiconductor device regions PE, the dam bar DB is cut and removed in a dicing step in Step S6 described later.

In the present embodiment, the lead frame LF is produced by etching. The leads of the lead frame can be formed more easily by etching than by press working. In the present embodiment, by producing the lead frame LF by etching, the lead frame LF including the leads LD1 each integrally having the thicker portion LD1$a$ and the thinner portion LD1$b$ and the leads LD2 each integrally having the thicker portion LD2$a$ and the thinner portion LD2$b$ can reliably be produced.

Each of the semiconductor device regions PE of the lead frame LF has the die pad DP as the chip mounting portion, the plurality of suspension leads TL supporting the die pad DP, and the plurality of leads LD.

In plan view, in each of the semiconductor device regions PE, the die pad DP is disposed substantially at the center thereof and, around the die pad DP, the plurality of leads LD (LD1 and LD2) are disposed. However, as described above, the plurality of leads LD disposed around the die pad DP include the leads LD1 and LD2 which are alternately disposed. In each of the semiconductor device regions PE, the plurality of leads LD (LD1 and LD2) disposed around the die pad DP are coupled to and held by the dam bar DB surrounding the semiconductor device region PR. The die pad DP is also coupled to and held by the dam bar DB surrounding the semiconductor device region PE via the plurality of suspension leads TL. Accordingly, the dam bar DB can also be regarded as a coupling portion for coupling the plurality of leads LD to each other.

The plurality of leads (LD1 and LD2) in each of the semiconductor device regions PE are integrally connected with (coupled to) the dam bar DB. That is, an end portion of each of the leads LD (LD1 and LD2) which is opposite to the end portion (front end portion) thereof closer to the die pad DP is connected integrally with the dam bar DP. The die pad DP in each of the semiconductor device regions PE is integrally connected with (coupled to) the dam bar DB via the suspension leads TL. That is, an end portion of each of the suspension leads TL which is opposite to the end portion thereof connected with the die pad DP is integrally connected with the dam bar DB. The dam bar DB can function to couple the plurality of leads LD (LD1 and LD2) disposed closer to the dam bar DB in the semiconductor device regions PE on both sides of the dam bar DB to each other and hold the leads LD. Note that the outermost periphery of the lead frame LF is made of a framework (not shown). In the outermost one of the plurality of semiconductor device regions PE arranged in an array, the leads LD next to the framework are integrally connected with (coupled to) the framework. The lead frame LF integrally has the leads LD (LD1 and LD2), the die pad DP, the suspension leads TL, the dam bar DB, and the framework.

Each of the leads LD1 integrally has the thicker portion LD1$a$ and the thinner portion LD1$b$ which are next to each other in the extending direction of the lead LD1. Each of the leads LD2 integrally has the thicker portion LD2$a$ and the thinner portion LD2$b$ which are next to each other in the extending direction of the lead LD2. As can be seen also from the cross-sectional views of FIGS. 14 to 16, in each of the leads LD1, the thicker portion LD1$a$ is located closer to the die pad DP and the thinner portion LD1$b$ extends toward the dam bar DB to be integrally connected with the dam bar DB. Also, in each of the leads LD2, the thicker portion LD2$a$ is located closer to the die pad DP and the thinner portion LD2$b$ extends toward the dam bar DB to be integrally connected with the dam bar DB. An end portion of each of the suspension leads TL which is opposite to the end portion thereof connected with the die pad DP extends toward the dam bar DB to be integrally connected with the dam bar DB. Accordingly, the dam bar DB integrally has portions DB1 connected with the thinner portions LD1$b$ of the leads LD1, portions DB2 connected with the thinner portions LD2$b$ of the leads LD2, portions DB3 connected with the suspension leads TL, and the portions located therebetween.

In the dam bar DB, each of the portions DB1 connected with the thinner portions LD1b of the leads LD1 has a thickness T4a which is equal to the thickness (T1b) of each of the thinner portions LD1b (i.e., T4a=T1b is satisfied). Also, in the dam bar DB, each of the portions DB2 connected with the thinner portions LD2b of the leads LD2 has a thickness T4b which is equal to the thickness (T2b) of each of the thinner portions LD2b (i.e., T4b=T2b is satisfied). Also, in the dam bar DB, each of the portions DB3 connected with the suspension leads TL has a thickness T4c which is equal to the thickness (T3) of each of the leads TL (i.e., Tc=T3 is satisfied).

Also, in the dam bar DB, each of the portions (middle portions) between these portions DB1, DB2, and DB3 has a thickness (T4d) which is larger than the respective thicknesses (T4a, T4b, and T4c) of these portions DP1, DB2, and DB3. That is, the thickness (T4d) of each of the middle portions of the dam bar DB is larger than the respective thicknesses (T4a, T4b, and T4c) of the portions DB1, DB2, and DB3 mentioned above. In other words, T4d>T4a, T4d>T4b, and T4d>T4c are satisfied. The middle portions of the dam bar DB mentioned herein correspond to the portions of the dam bar DB which are other than the portions DB1, DB2, and DB3 of the dam bar DB and include the portions of the dam bar DB which are located between the portions DB1 and DB2 and the portions of the dam bar DB which are located between the portions DB2 and DB3. The thickness (T4d) of each of the middle portions of the dam bar DB is substantially equal to the respective thicknesses (T1a and T2a) of the thicker portions LD1a and LD2a of the leads LD1 and LD2 (i.e., T4d=T1a=T2a is satisfied).

Accordingly, the thickness (T4a) of each of the portions DB1 of the dam bar DB which are connected with the leads LD1 and the thickness (T4b) of each of the portions DB2 of the dam bar DB which are connected with the leads LD2 are smaller than the thickness (T4d) of each of the portions of the dam bar DB which are located between the portions DB1 and DB2 (T4d>T4a and T4d>T4b).

The thinner portions LD1b of the leads LD1 and the portions DB1 of the dam bar DB which are connected with the thinner portions LD1b of the leads LD1 have thicknesses reduced by half etching performed on the lower surfaces thereof. Also, the thinner portions LD2b of the leads LD2 and the portions DB2 of the dam bar DB which are connected with the thinner portions LD2b of the leads LD2 have thicknesses reduced by half etching performed on the upper surfaces thereof. Also, the suspension leads TL and the portions DB3 of the dam bar DB which are connected with the suspension leads TL have thicknesses reduced by half etching performed on the lower surfaces thereof. The portions of the dam bar DB (middle portions of the dam bar DB) which are located between the portions DB1, DB2, and DB3 correspond to regions not subjected to half etching.

In another form, the dam bar DB may also have equal thicknesses. In this case, the foregoing portions DB1, DB2, and DB3 of the dam bar DB and the portions (middle portions) of the dam bar DB which are located therebetween have substantially equal thicknesses which are substantially equal to the respective thicknesses of the thicker portions LD1a and LD2a of the leads LD1 and LD2. That is, in this case, the thinner portions LD1b and LD2b and the suspension leads TL which are thinner than the dam bar DB are integrally connected with the dam bar DB having an overall thickness which is substantially equal to those of the thicker portions LD1a and LD2a. The dam bar DB is cut in the dicing step in Step S6 described later to be removed and, as the volume of the dam bar DB is smaller, the dicing step is more easily performed.

Accordingly, as in the present embodiment, of the dam bar DB, the portions DB1 connected with the thinner portions LD1b of the leads LD1 preferably have thicknesses equal to those of the thinner portions LD1b. Also, of the dam bar DB, the portions DB2 connected with the thinner portions LD2b of the leads LD2 preferably have thicknesses equal to those of the thinner portions LD2b. Also, of the dam bar DB, the portions DB3 connected with the suspension leads TL preferably have thicknesses equal to those of the suspension leads TL. This can reduce the volume of the dam bar DB and therefore facilitates the dicing step in Step S6. This can also elongate the use lifetime of the dicing blade BRD described later. Also, the thicknesses of the portions of the dam bar DB (middle portions of the dam bar DB) which are located between these portions DB1, DB2, and DB3 are set larger than those of the portions DB1, DB2, and DB3 and are preferably set substantially equal to those of the thicker portions LD1a and LD2a of the leads LD1 and LD2. This can integrally connect the portions DB1, DB2, and DB3 with each other and assure the strength of the dam bar DB.

Figure 17:
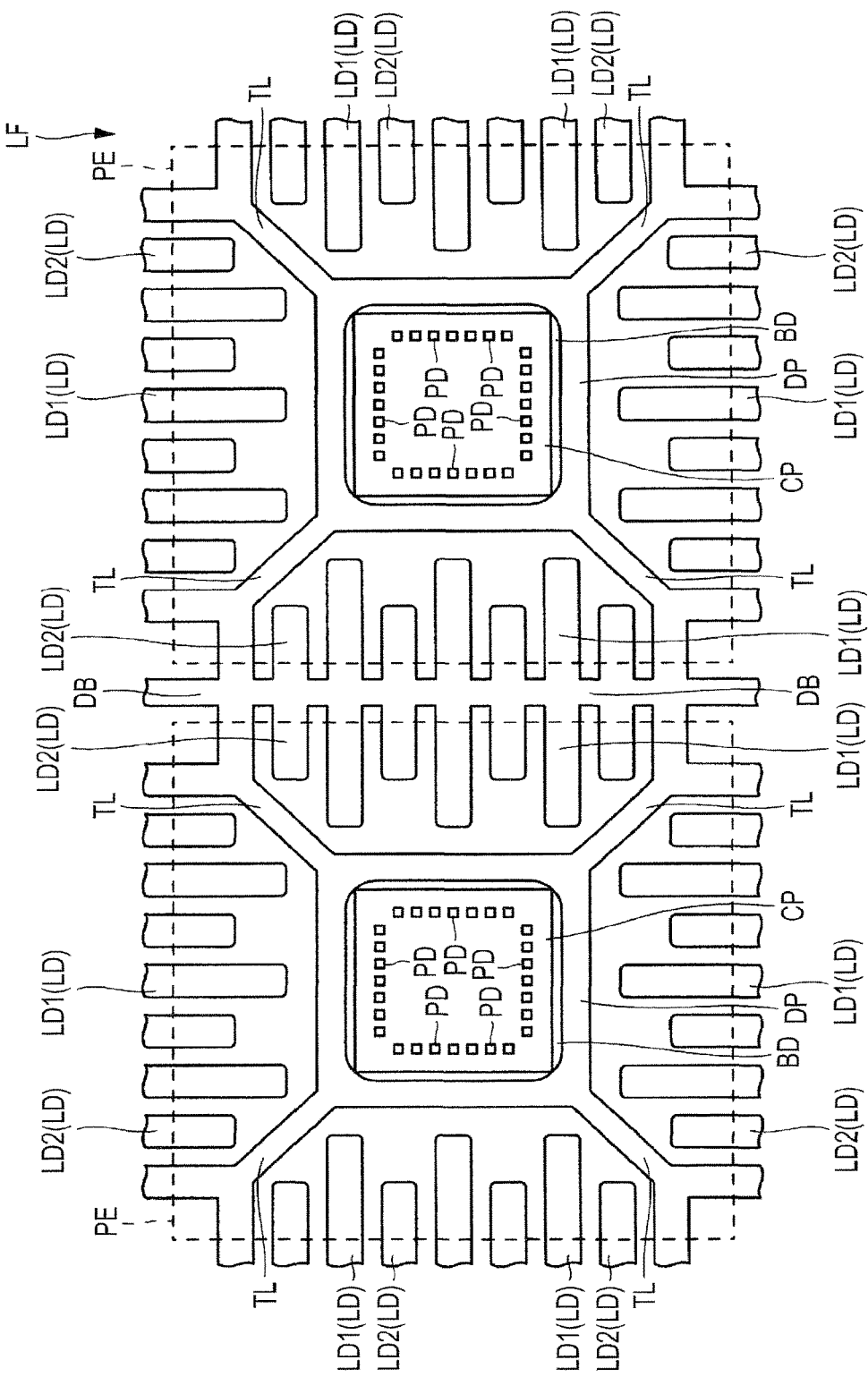
FIG. 17 is a plan view showing a die bonding step.
Figure 18:
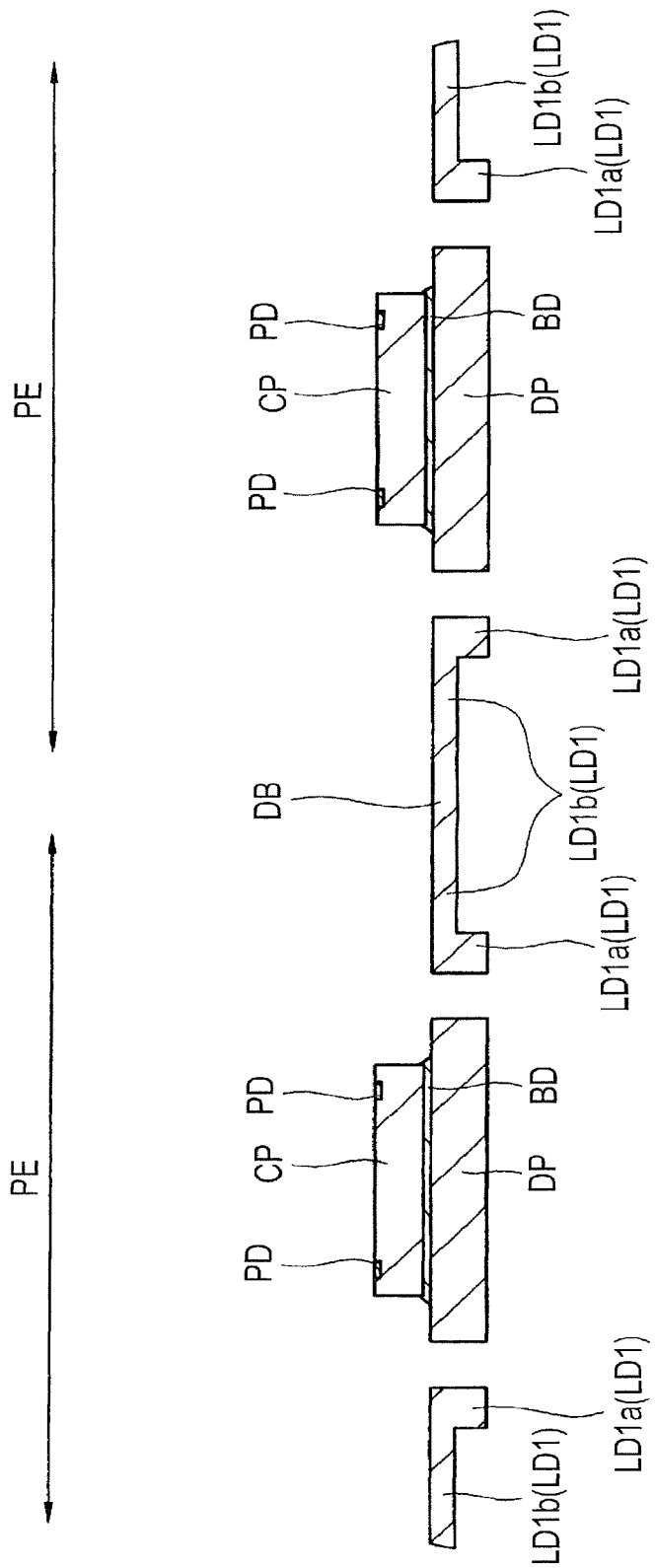
FIG. 18 is a cross-sectional view showing the die bonding step.
Figure 19:
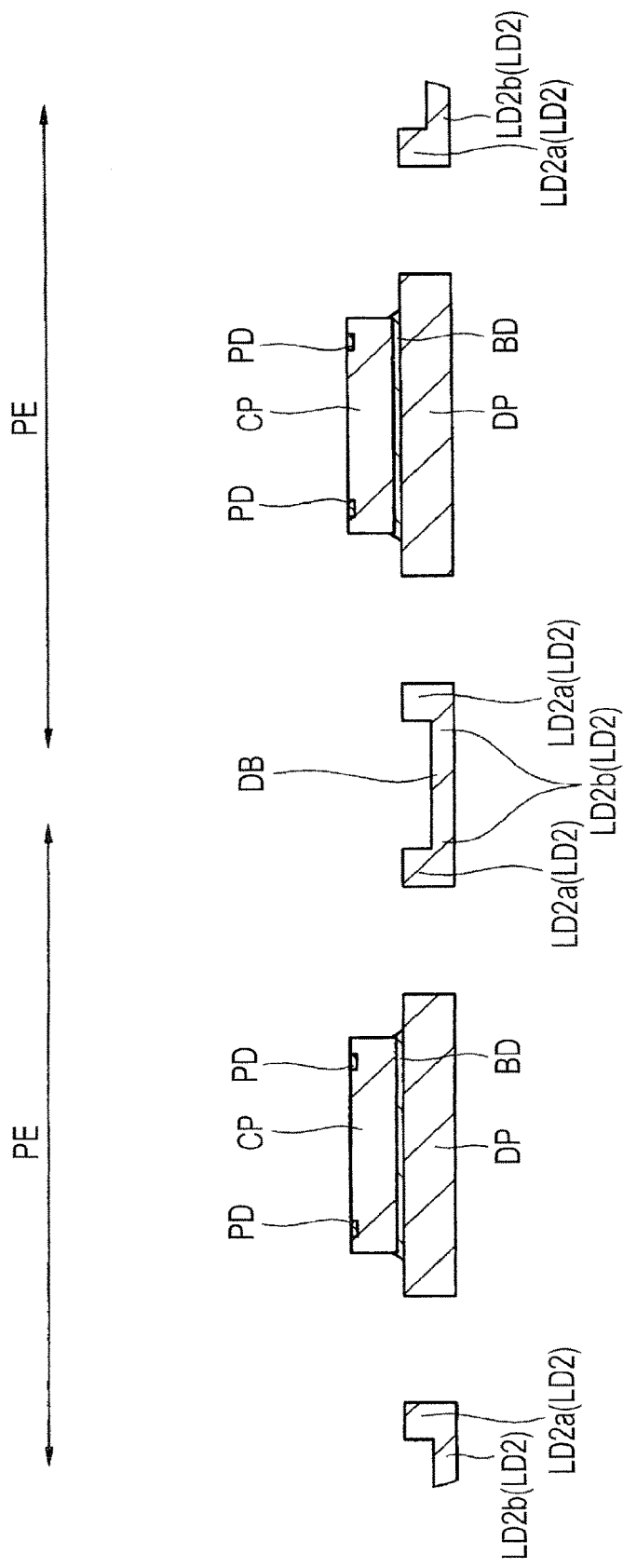
FIG. 19 is a cross-sectional view showing the die bonding step.

Next, as shown in FIGS. 17 to 19, a die bonding step is performed to mount the semiconductor chip CP over the upper surface of the die pad DP via the bonding material BD in each of the semiconductor device regions PE of the lead frame LF and bond (fix) the semiconductor chip CP thereto (Step S2 in FIG. 12).

The die bonding step in Step S2 includes the steps of, e.g., applying the bonding material BD onto the upper surface of the die pad DP, then mounting the semiconductor chip CP over the upper surface of the die pad DP, and then solidifying the bonding material BD.

Figure 20:
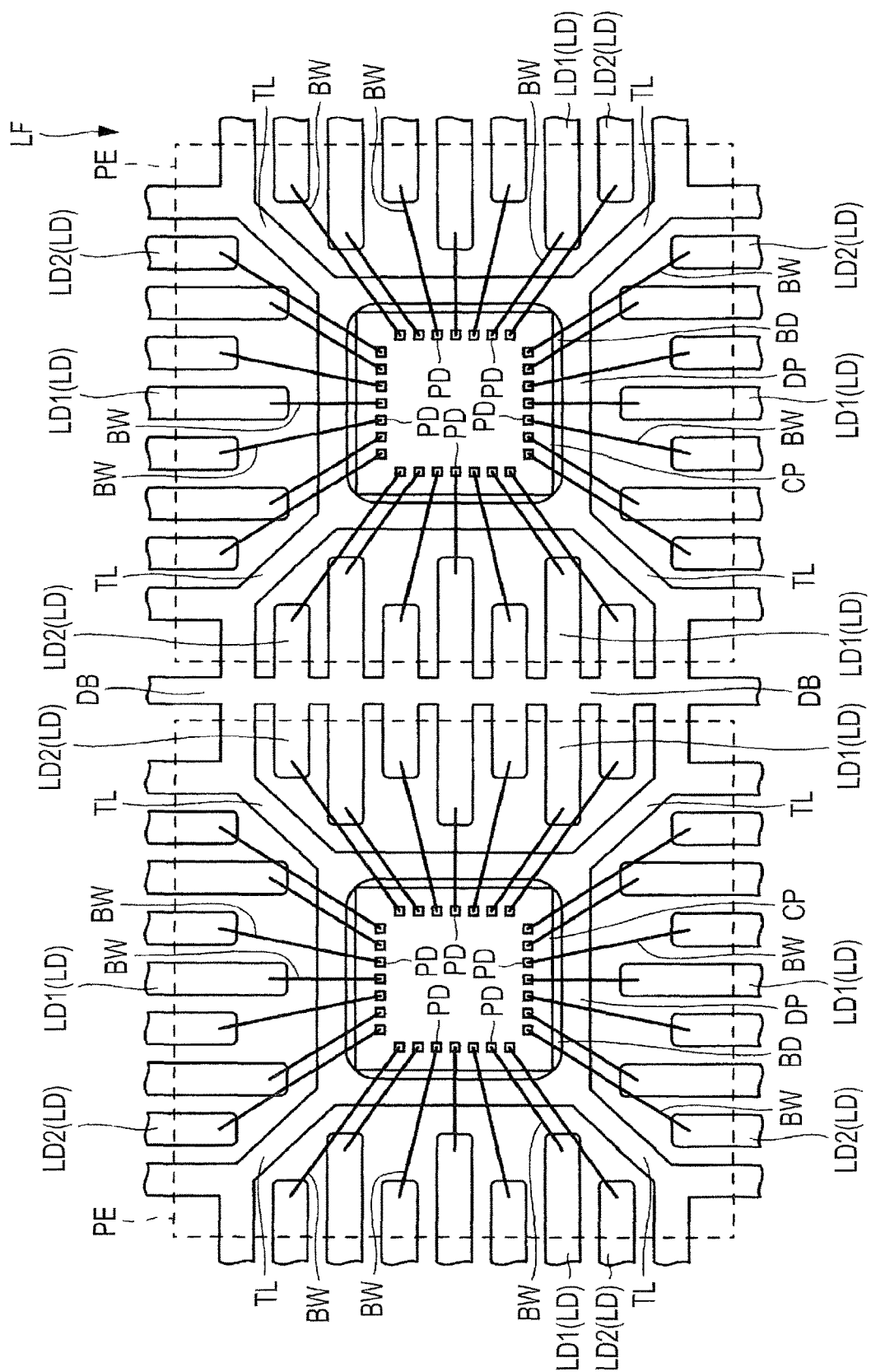
FIG. 20 is a plan view showing a wire bonding step.
Figure 21:
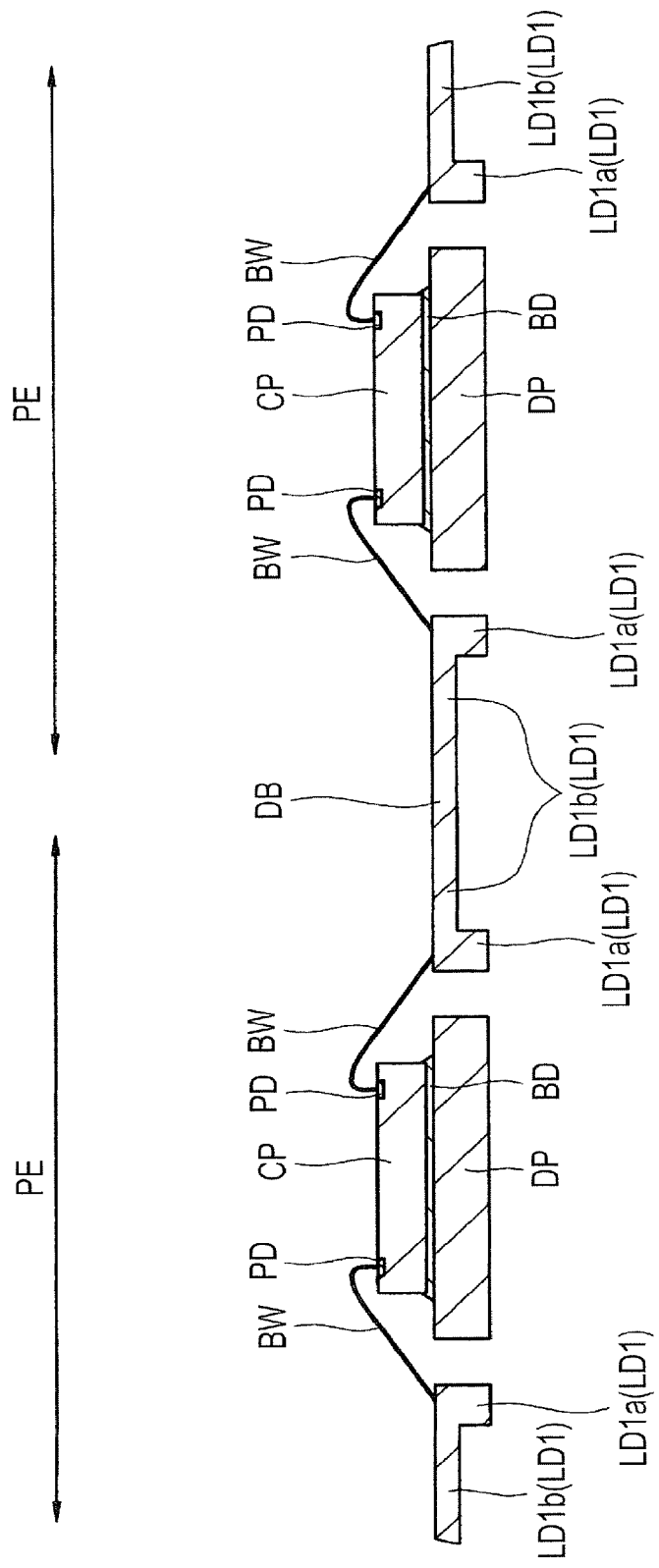
FIG. 21 is a cross-sectional view showing the wire bonding step.
Figure 22:
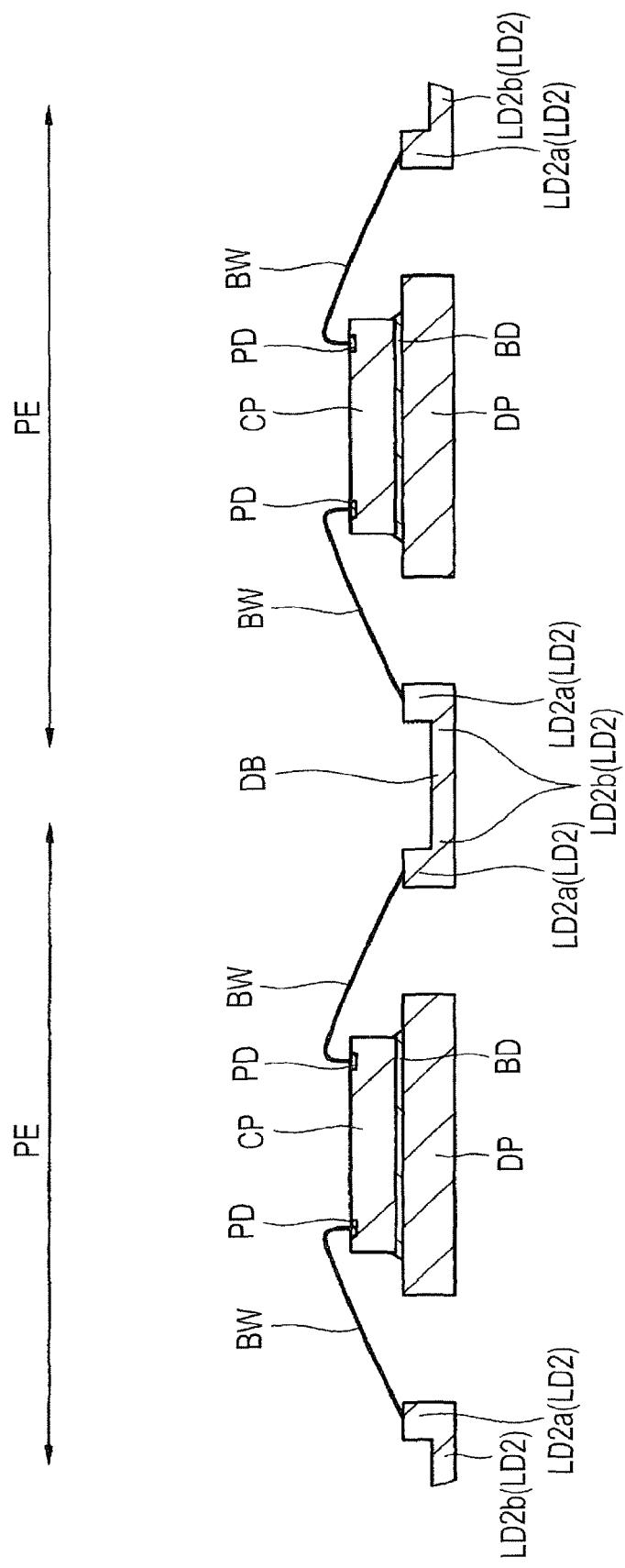
FIG. 22 is a cross-sectional view showing the wire bonding step.

Next, as shown in FIGS. 20 to 22, a wire bonding step is performed to electrically connect the plurality of pad electrodes PD of the semiconductor chip CP in each of the semiconductor device regions PE with the plurality of leads LD (LD1 and LD2) in the semiconductor device region PE via the plurality of wires BW (Step S3 in FIG. 12).

Figure 23:
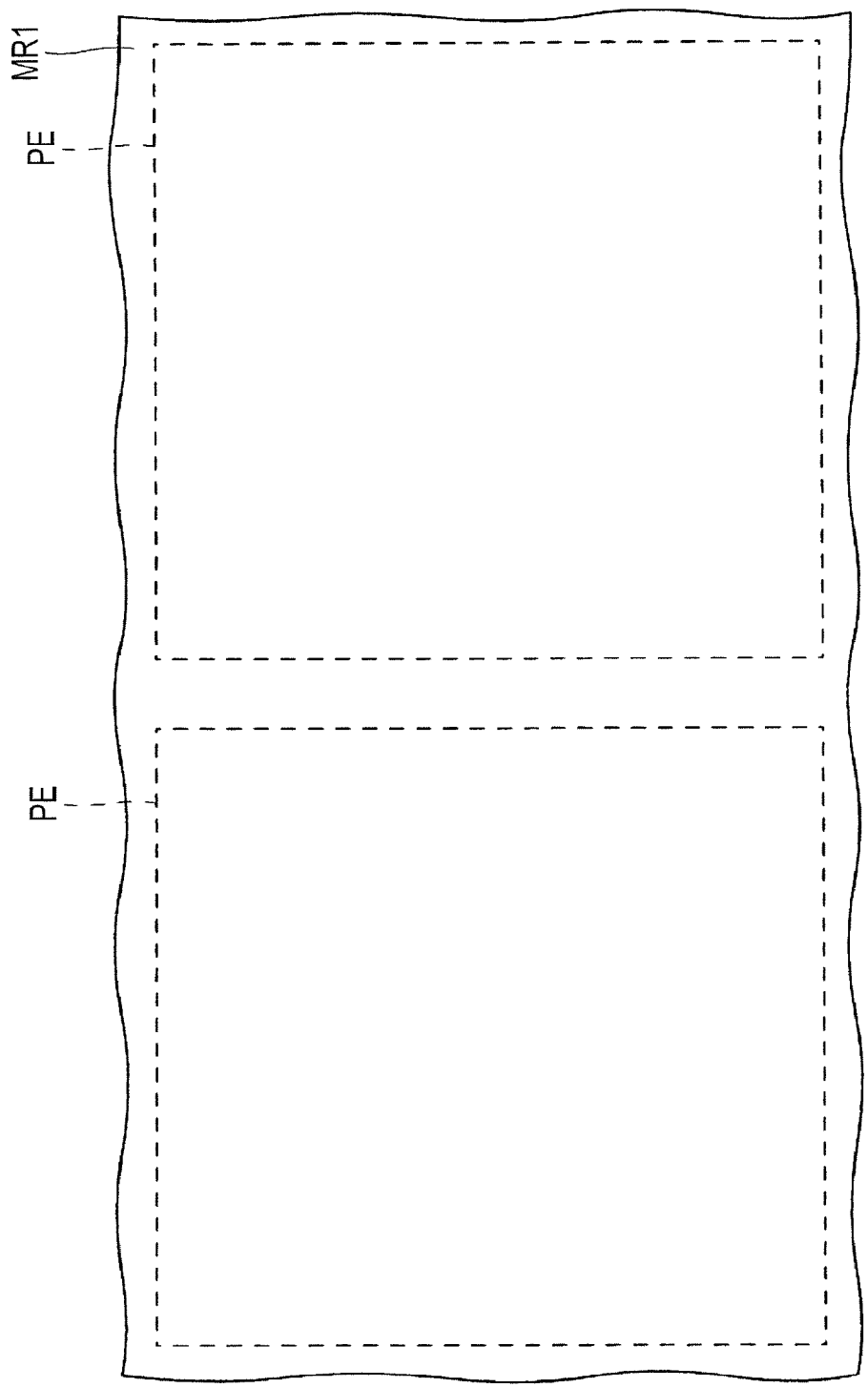
FIG. 23 is a plan view showing a molding step.
Figure 24:
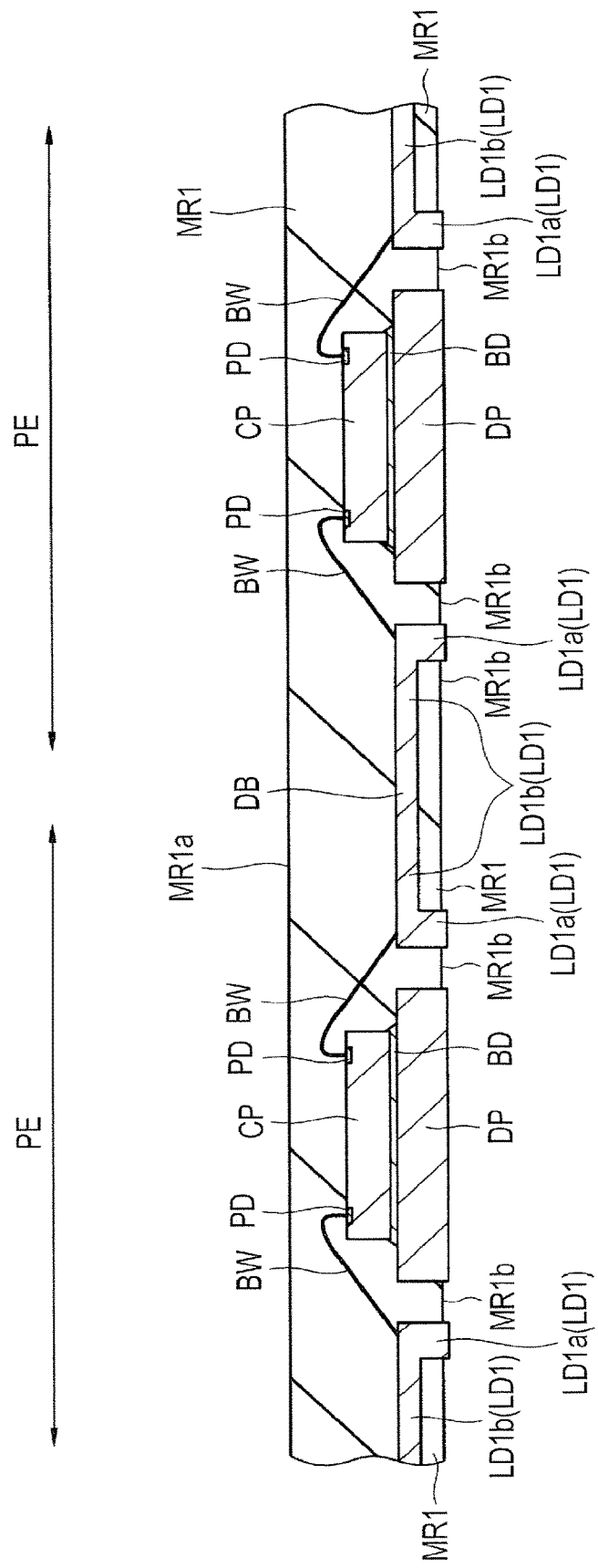
FIG. 24 is a cross-sectional view showing the molding step.
Figure 25:
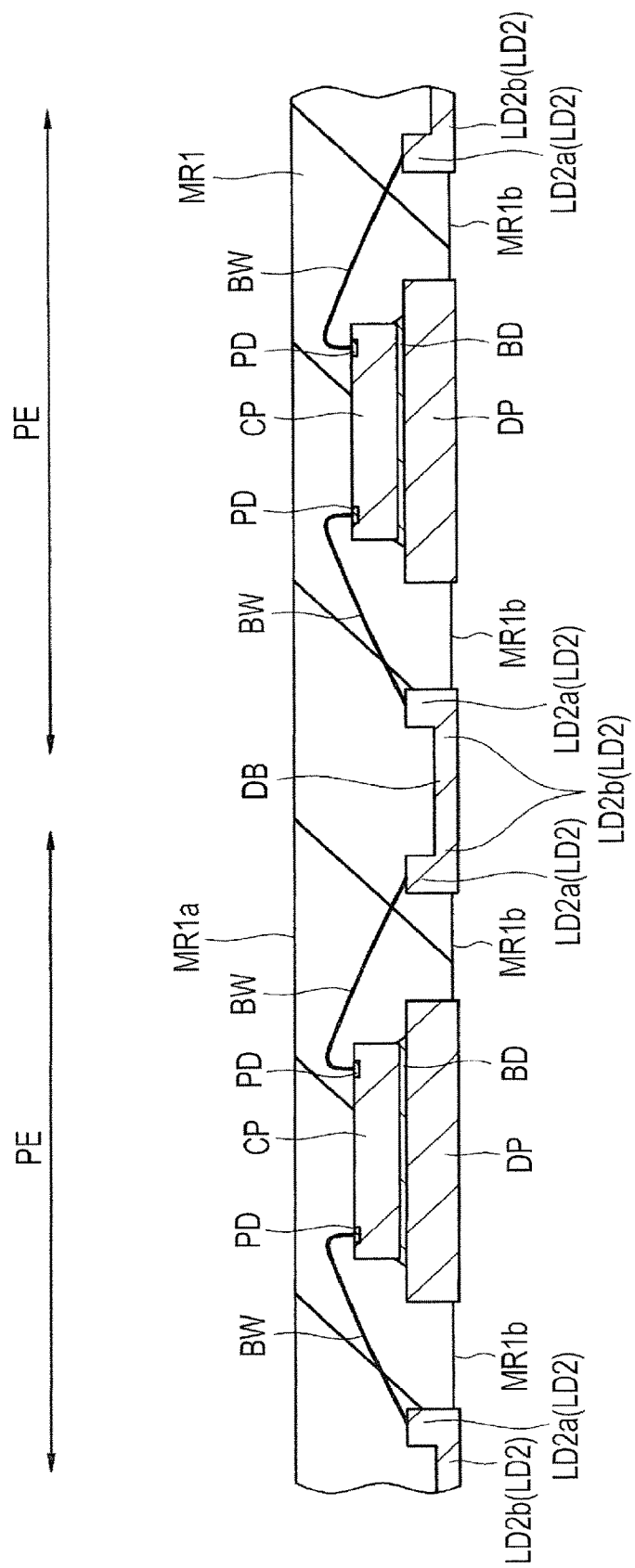
FIG. 25 is a cross-sectional view showing the molding step.

Next, as shown in FIGS. 23 to 25, resin sealing is performed using a molding step to form the sealing portion (batch molding portion) MR1 as a resin sealing portion (resin-sealed body) to seal the die pad DP, the semiconductor chip CP, the wires BW, the leads LD (LD1 and LD2), and the suspension leads TL in each of the plurality of semiconductor device regions PE with the sealing portion MR1 (Step S4 in FIG. 12). Examples of the molding step include a transfer molding step.

In the present embodiment, in the molding step in Step S4, batch molding is performed to batch-mold the plurality of semiconductor device regions PE of the lead frame LF with the sealing portion MR1. That is, the sealing portion MR1 is formed so as to cover the plurality of whole semiconductor device regions PE of the lead frame LF. As a result, the sealing portion MR1 is formed not only over the semiconductor device regions PE but also between the adjacent semiconductor device regions PE, and the dam bar DB is also sealed with the sealing portion MR1. That is, over the plurality of whole semiconductor device regions PE of the lead frame LF, the semiconductor chips CP, the wires BW, the die pads, the leads LD, the suspension leads TL, and the dam bar DB are sealed with the sealing portion MR1.

The sealing portion MR1 is made of, e.g., a resin material such as a thermosetting resin material or the like and can also contain a filler or the like. For example, the sealing portion MR1 can be formed using an epoxy resin containing a filler or the like. For example, the sealing portion MR1 can be formed by disposing the lead frame LF in a mold such that the plurality of semiconductor device regions PE of the lead frame LF are located in the cavity of the mold, then injecting a sealing resin material into the cavity of the mold, and curing the sealing resin material by heating.

The sealing portion MR1 has an upper surface MR1a and a lower surface MR1b which are located opposite to each other. When the sealing portion MR1 is formed, each of the leads LD in each of the semiconductor device regions PE has at least a portion exposed from the lower surface MR1b of the sealing portion MR1. Specifically, in each of the leads LD1, the lower surface of the thicker portion LD1a is exposed from the lower surface MR1 of the sealing portion MR1, while the lower surface of the thinner portion LD1b is covered with the sealing portion MR1 and is not exposed from the lower surface MR1b of the sealing portion MR1. On the other hand, in each of the leads LD2, the lower surface of the thicker portion LD2a and the lower surface of the thinner portion LD2b are exposed from the lower surface MR1b of the sealing portion MR1. Accordingly, each of the leads LD2 has the entire lower surface thereof exposed from the lower surface MR1b of the sealing portion MR1.

Figure 26:
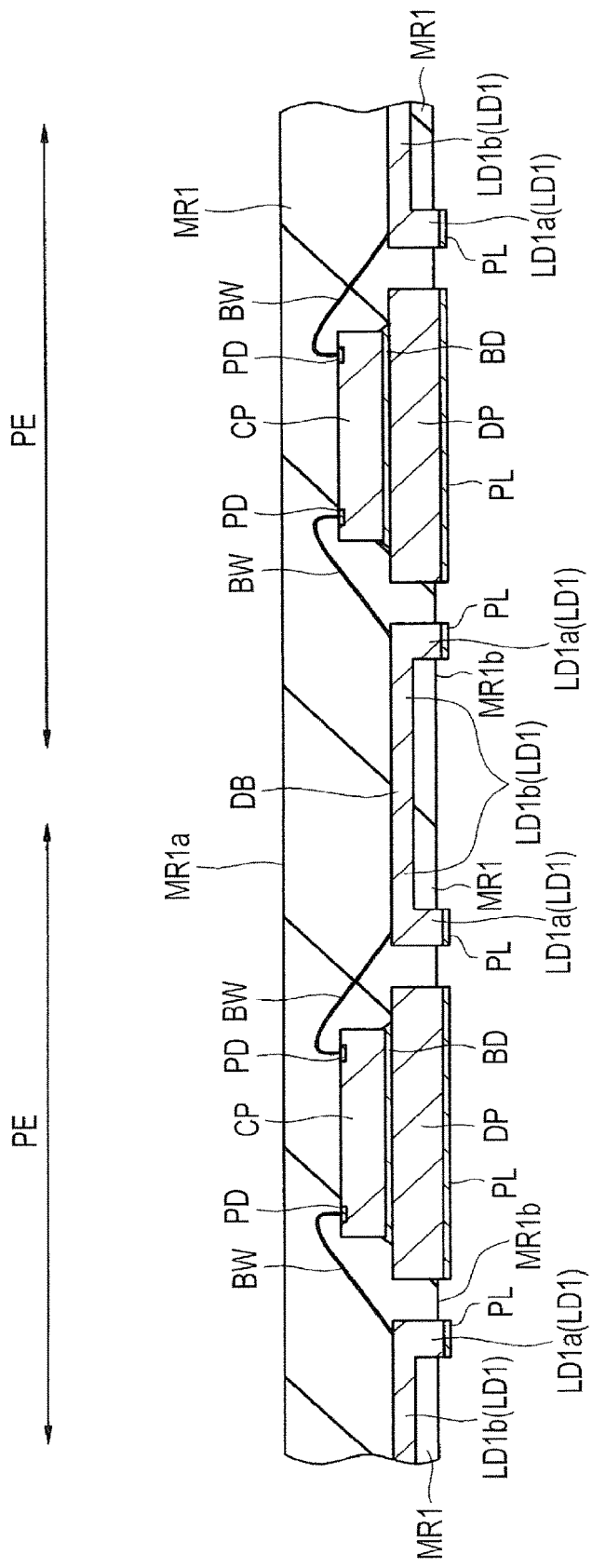
FIG. 26 is a cross-sectional view showing a plating step.
Figure 27:
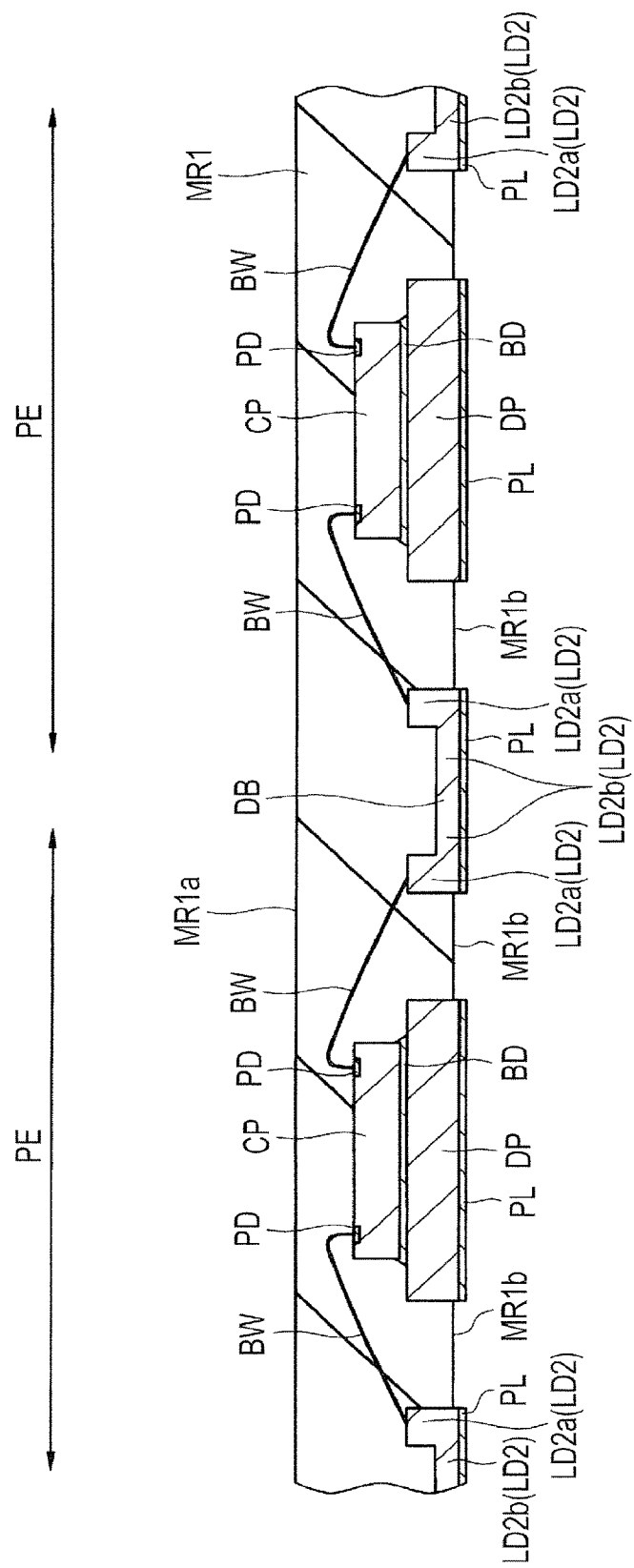
FIG. 27 is a cross-sectional view showing the plating step.

Next, as shown in FIGS. 26 and 27, the plating layers PL are formed over the lower exposed surfaces of the leads LD1 and LD2 exposed from the lower surface MR1b of the sealing portion MR1 and over the lower surfaces of the die pads DP exposed from the lower surface of the sealing portion MR1 (Step S5 in FIG. 12). The plating layers PL are metal layers made of, e.g., solder plating layers and can be formed using an electrolytic plating method or the like.

In each of the leads LD1, the lower surface of the thicker portion LD1a is exposed from the lower surface MR1b of the sealing portion MR1 so that the plating layer PL is formed over the lower surface of the thicker portion LD1a of the lead LD1. The lower surface of the thinner portion LD1b of the lead LD1 is covered with the sealing portion MR1 so that the plating layer PL is not formed over the lower surface of the thinner portion LD1b of the lead LD1. Each of the leads LD2 has the entire lower surface thereof exposed from the lower surface MR1b of the sealing portion MR1 so that the plating layer PL is formed over the entire lower surface of the lead LD2.

Next, the lead frame LF and the sealing portion MR1 are cut (by dicing) to be split (divided) into the individual semiconductor device regions PE (Step S6 in FIG. 12).

Figure 28:
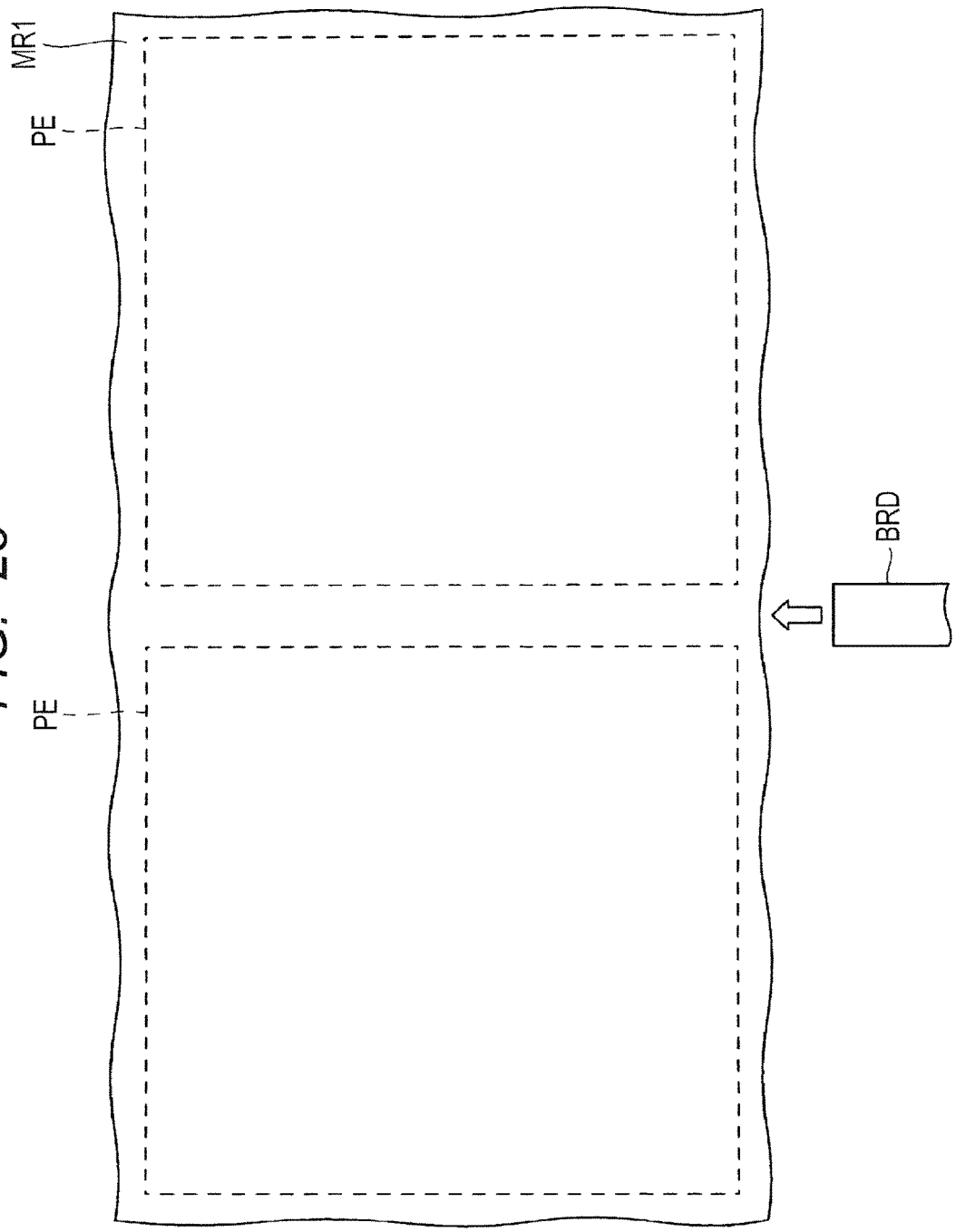
FIG. 28 is a plan view showing a dicing step.
Figure 29:
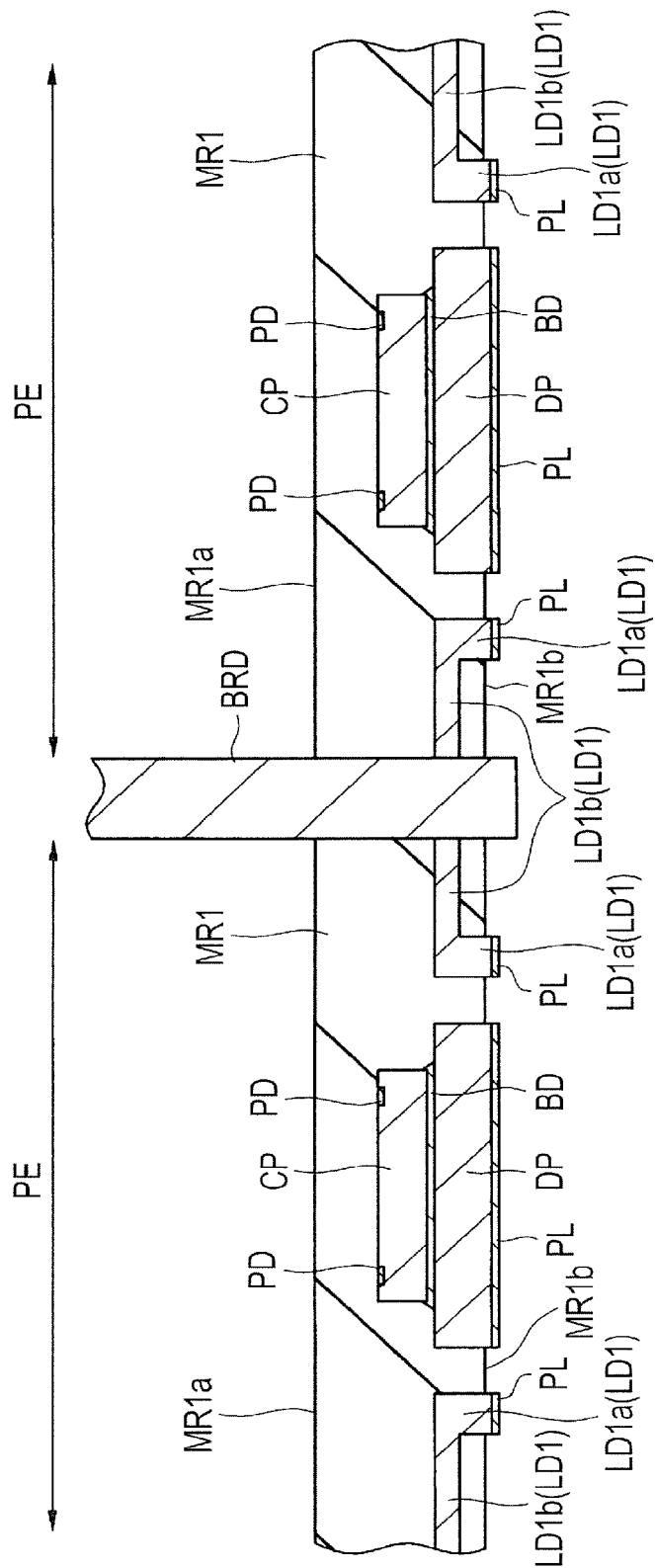
FIG. 29 is a cross-sectional view showing the dicing step.
Figure 30:
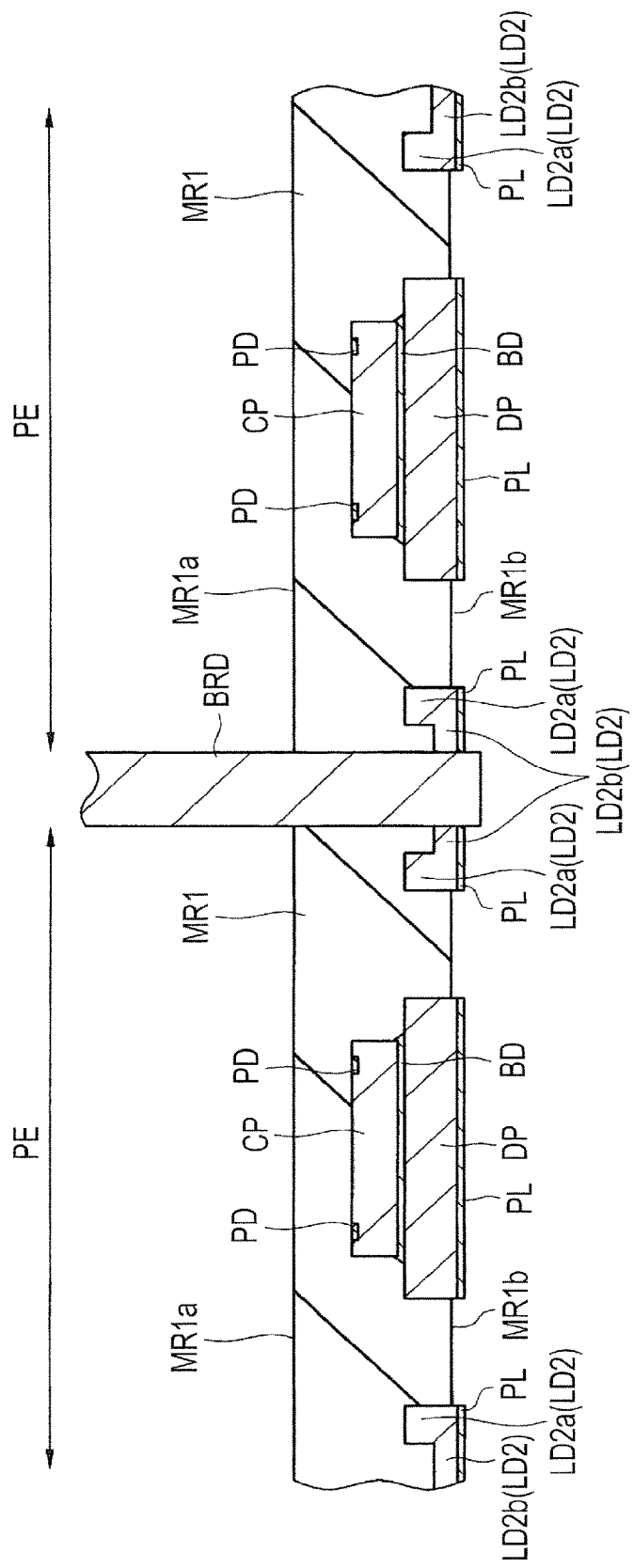
FIG. 30 is a cross-sectional view showing the dicing step.
Figure 31:
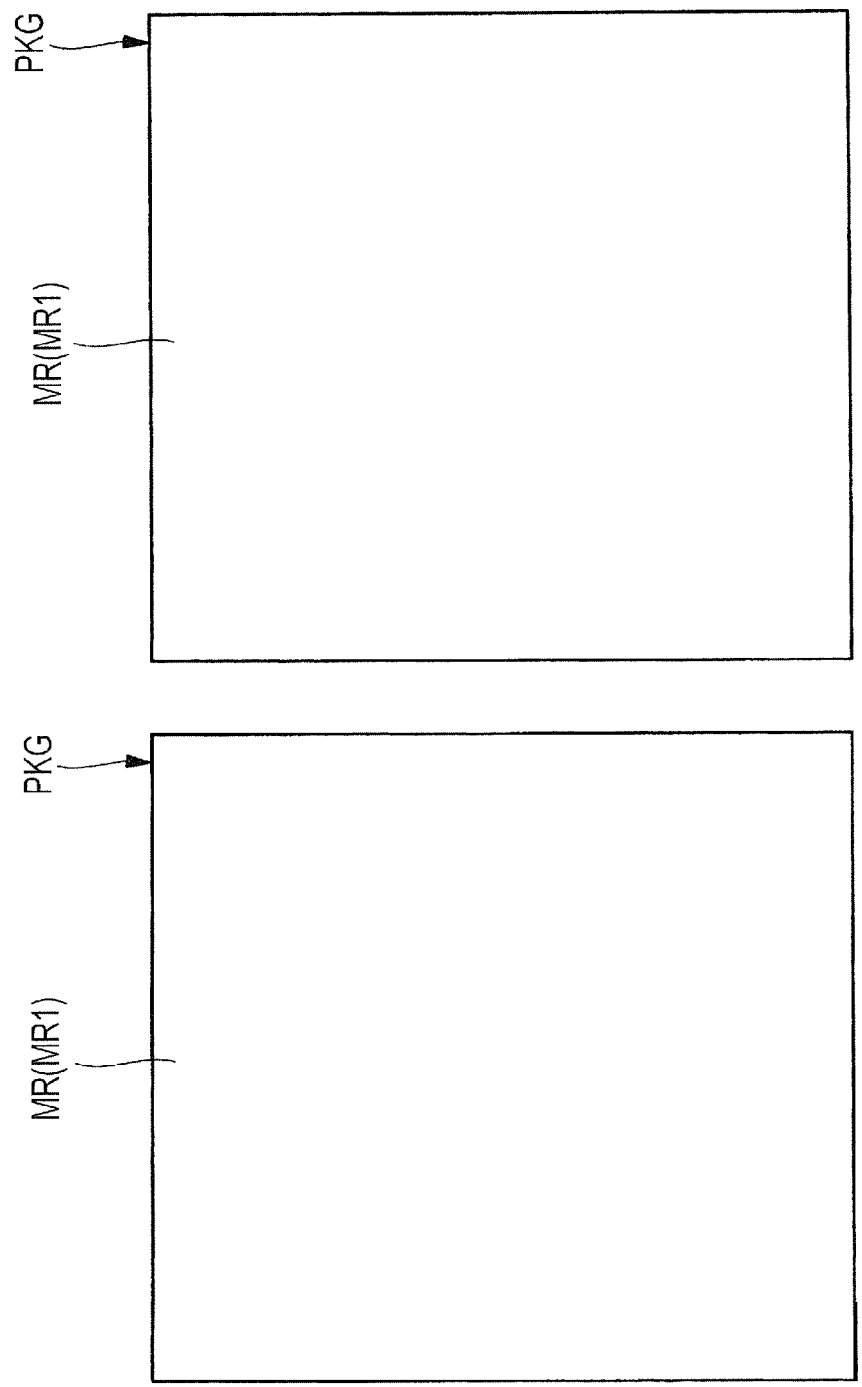
FIG. 31 is a plan view showing a stage where the dicing step is ended.
Figure 32:
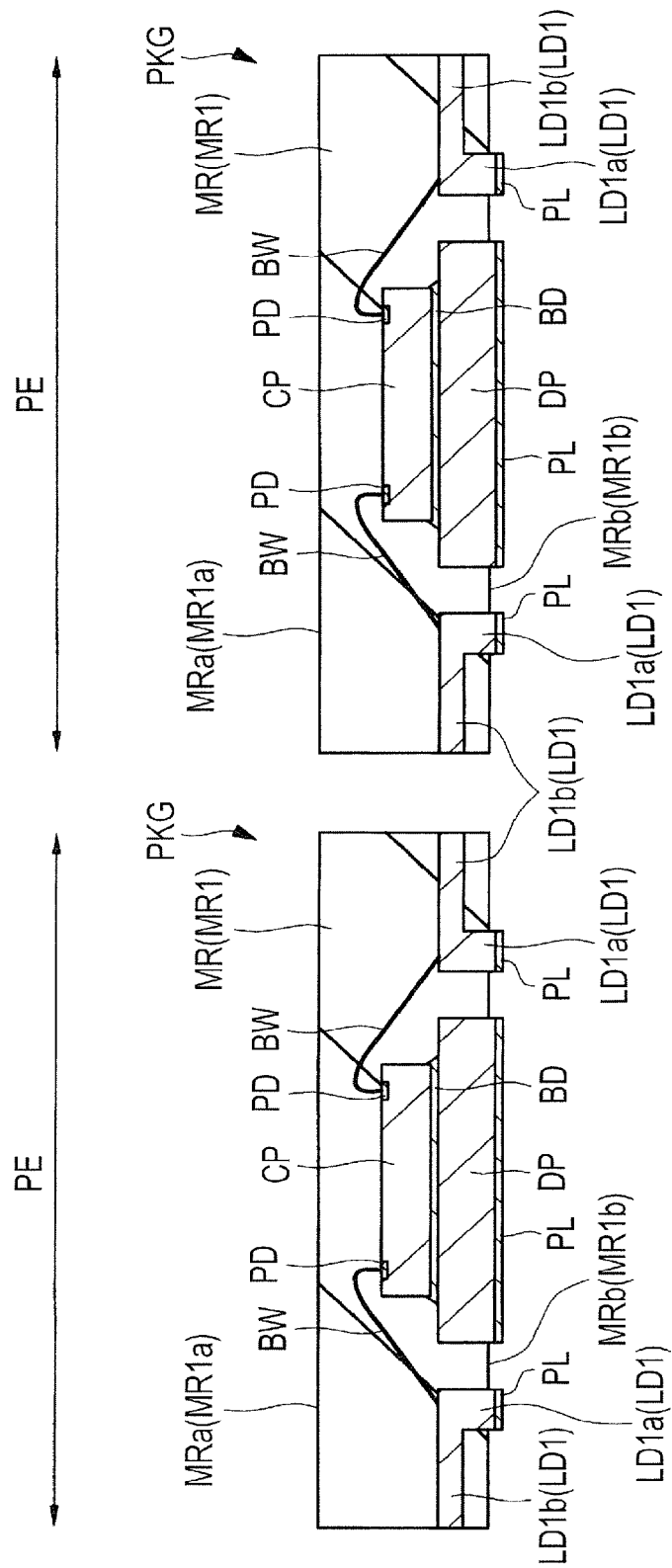
FIG. 32 is a cross-sectional view showing the stage where the dicing step is ended.
Figure 33:
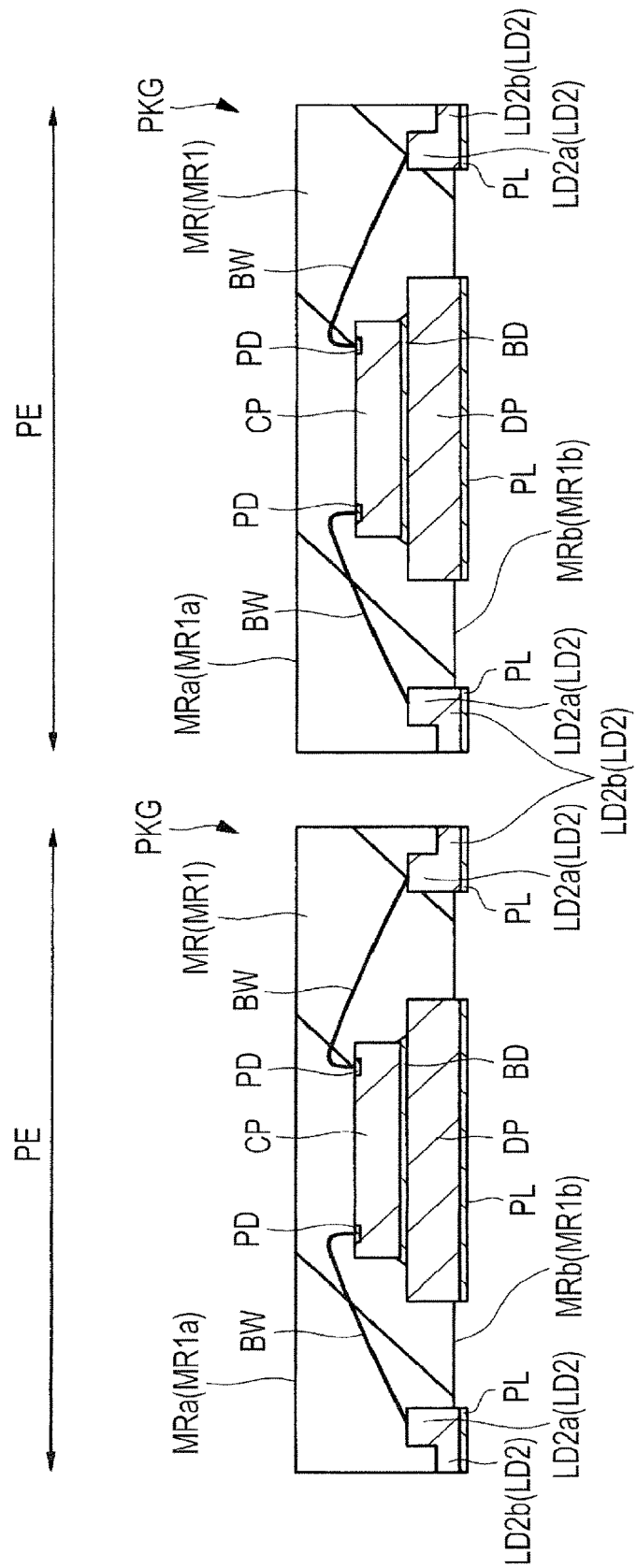
FIG. 33 is a cross-sectional view showing the stage where the dicing step is ended.

FIGS. 28 to 30 include a plan view (FIG. 28) and cross-sectional views (FIGS. 29 and 30) each for illustrating the dicing step (cutting step) in Step S6. FIGS. 31 to 33 show the stage after the dicing step in Step S6 is ended.

In the dicing step in Step S6, with the dicing blade (dicing saw BRD) as a rotating cutting blade (rotary blade), the sealing portion MR and the lead flame LF (including the leads LD, the suspension leads TL, and the dam bar DB) are cut. At this time, as shown in FIGS. 28 to 30, the dicing blade BRD moves in the regions between the semiconductor device regions PE next to each other along the directions in which the dam bar DB extends. As a result, in the regions between the adjacent semiconductor device regions PE, the sealing portion MR1 and the lead frame LF are cut. That is, in the regions between the adjacent semiconductor device regions PE, the sealing portion MR1, the leads LD, the suspension leads TL, and the dam bar DB are cut.

The dicing lines (cut regions) are the regions between the semiconductor device regions PE next to each other, i.e., regions located around the semiconductor device regions PE. In plan view, the sealing portion MR1 is cut into a grid-like pattern. Along the dicing lines, not only the sealing portion MR1, but also the lead frame LF is cut. Consequently, the respective portions of the leads LD and the suspension leads TL which are located within the dicing lines (regions to be cut) are also cut with the dicing blade BRD to be removed. In addition, the entire dam bar DB is located within the dicing lines (regions to be cut) and is therefore cut with the dicing blade BRD to be removed.

By the dicing step in Step S6, the sealing portion MR1 and the lead frame LF are cut to be split (divided) into the individual semiconductor device regions PE. Each of the separate semiconductor device regions PE serves as the semiconductor device PKG. Thus, as shown in FIGS. 31 to 33, the semiconductor device PKG can be manufactured.

The sealing portion MR1 cut and split into the individual semiconductor device regions PE corresponds to the sealing portion MR. Also, the upper surface MR1a of the sealing portion MR1 corresponds to the upper surface MRa of the sealing portion MR and the lower surface MR1b of the sealing portion MR1 corresponding to the lower surface MRb of the sealing portion MR. Also, the cut surfaces of the sealing portion MR1 resulting from the cutting thereof with the dicing blade BRD correspond to the side surfaces (MRc1, MRc2, MRc3, and MRc4) of the sealing portion MR. Note that each of the side surfaces of the sealing portion MR crosses each of the upper and lower surfaces MRa and MRb of the sealing portion MR (see FIGS. 6 and 7). The dam bar DB is cut together with the sealing portion MR1 located in the regions between the adjacent semiconductor device regions PE with the dicing blade BRD to be removed. As a result, the dam bar DB no longer remains in the manufactured semiconductor device PKG.

The leads LD (LD1 and LD2) and the suspension leads TL which are integrally connected with the dam bar DB are cut together with the sealing portion MR1 located in the regions between the adjacent semiconductor device regions PE with the dicing blade BRD. The cut surfaces of the leads LD1 resulting from the cutting thereof with the dicing blade BRD correspond to the end surfaces TM1 of the leads LD1. The cut surfaces of the leads LD2 resulting from the cutting thereof with the dicing blade BRD correspond to the end surfaces TM2 of the leads LD2. The cut surfaces of the suspension leads TL resulting from the cutting thereof with the dicing blade BRD correspond to the end surfaces TLM of the suspension leads TL. The respective cut surfaces (TM1, TM2, and TLM) of the leads LD1 and LD2 and the suspension leads TL are exposed from the cut surfaces (MRc1, MRc2, MRc3, and MRc4) of the sealing portion MR1.

The side surfaces (MRc1, MRc2, MRc3, and MRc4) of the sealing portion MR1 and the end surfaces TM1, TM2, and TLM exposed therefrom are the cut surfaces resulting from the cutting with the dicing blade BRD (rotary blade). Accordingly, the end surfaces TM1 of the leads LD1, the end surfaces TM2 of the leads LD2, and the end surfaces TLM of the suspension leads TL scarcely protrude from the side surfaces of the sealing portion MR1.

In each of the leads LD1, not the thicker portion LD1a, but the thinner portion LD1b is cut with the dicing blade BRD. Accordingly, the end surface TM1 of the lead LD1 corresponds to the cut surface of the thinner portion LD1b of the lead LD1. Also, in each of the leads LD2, not the thicker portion LD2a, but the thinner portion LD2b is cut with the dicing blade BRD. Accordingly, the end surface TM2 of the lead LD2 corresponds to the cut surface of the thinner portion LD2b of the lead LD2. The thickness of the thinner portion LD1b of the lead LD1 is reduced by half etching performed on the lower surface thereof. The thickness of the thinner portion LD2b of the lead LD2 is reduced by half etching performed on the upper surface thereof. The thickness of each of the suspension leads TL is reduced by half etching performed on the lower surface thereof. As a result, at each of the side surfaces (cut surfaces) of the sealing portion MR, the height position of the end surface TM1 of the lead LD1 is higher than the height position of the end surface TM2 of the lead LD2. Also, the height position of the end surface TLM of the suspension lead TL is higher than the height position of the end surface TM2 of the lead LD2.

In this manner, the semiconductor device PKG in the present embodiment can be manufactured.

<About Study by Present Inventors>

Figure 34:
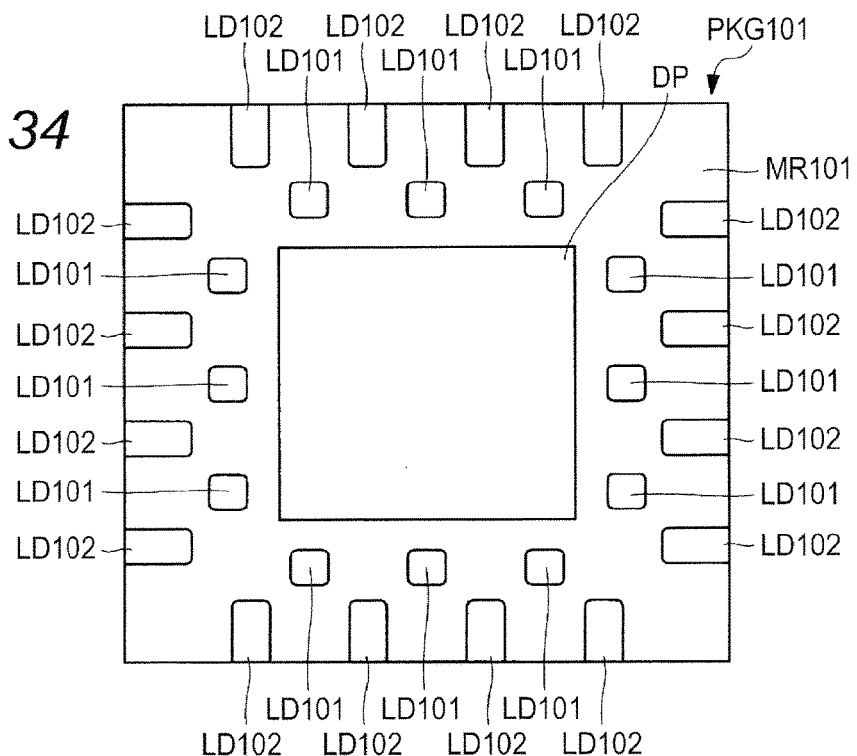
FIG. 34 is a bottom view of a semiconductor device in a studied example.
Figure 35:
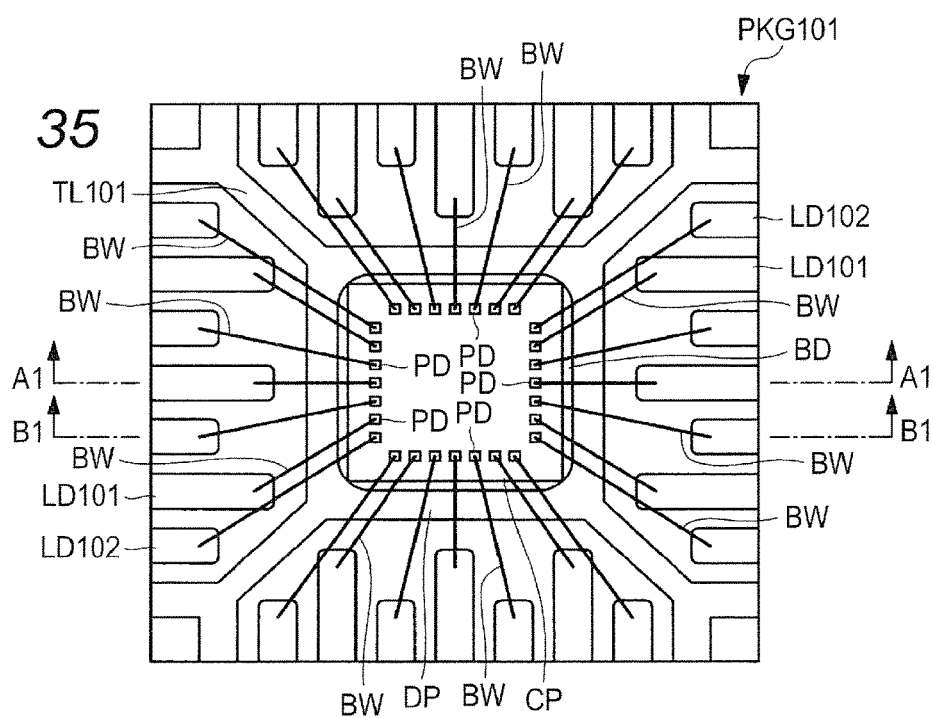
FIG. 35 is a perspective plan view of the semiconductor device in the studied example.
Figure 36:
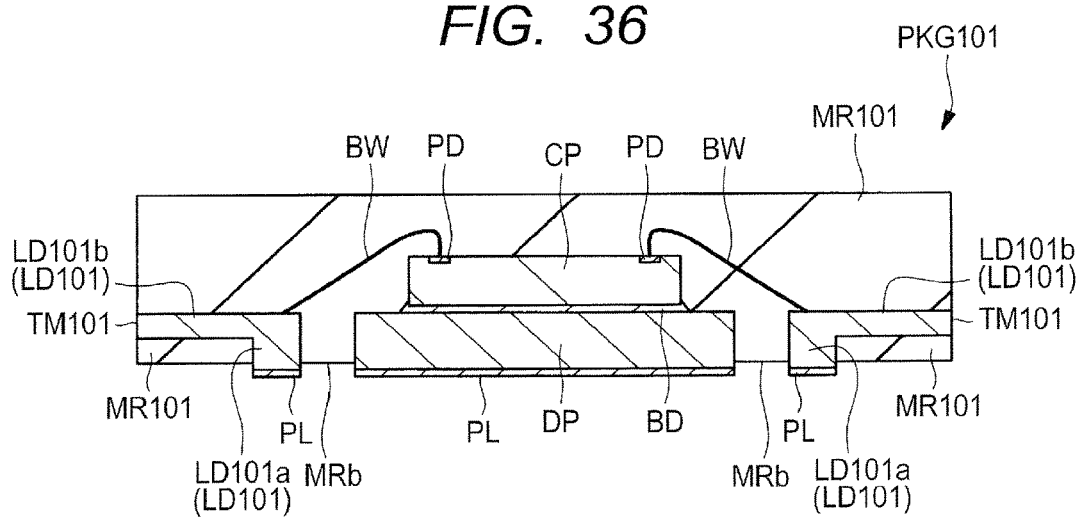
FIG. 36 is a cross-sectional view of the semiconductor device in the studied example.
Figure 37:
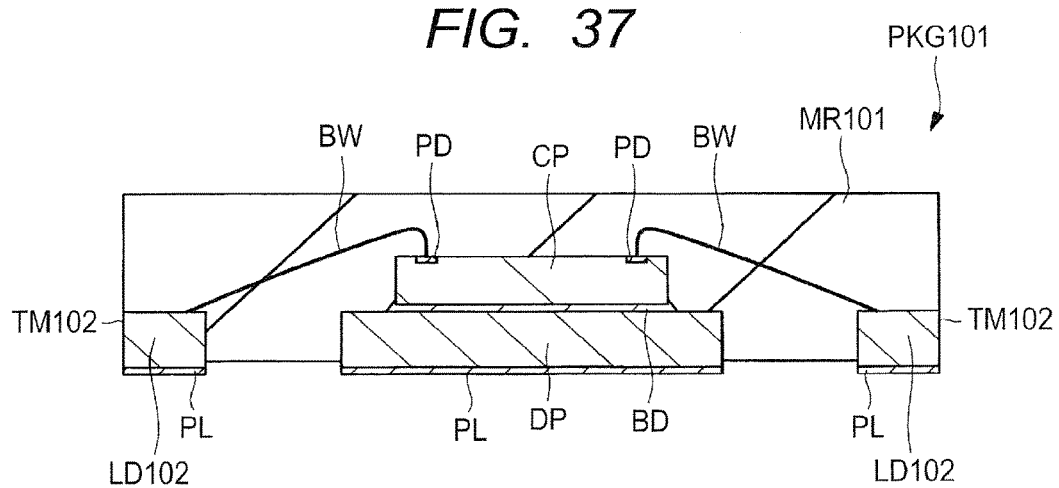
FIG. 37 is a cross-sectional view of the semiconductor device in the studied example.
Figure 38:
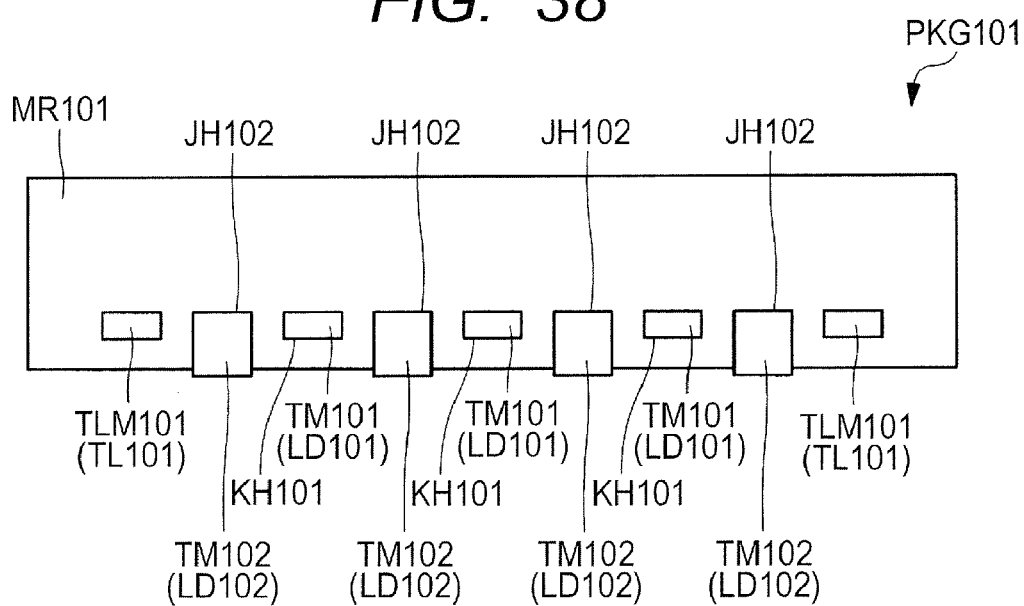
FIG. 38 is a side view of the semiconductor device in the studied example.

FIG. 34 is a bottom view of a semiconductor device PKG101 in a studied example studied by the present inventors. FIG. 35 is a perspective plan view of the semiconductor device PKG101 in the studied example. FIGS. 36 and 37 are cross-sectional views of the semiconductor device PKG101 in the studied example. FIG. 38 is a side view of the semiconductor device PKG101 in the studied example and corresponds to each of FIGS. 2, 3, 6, 7, and 9 described above. Note that the cross section of the semiconductor device PKG101 at the position along the line A1-A1 in FIG. 35 corresponds to FIG. 36, and the cross section of the semiconductor device PKG101 at the position along the line B1-B1 in FIG. 35 corresponds to FIG. 37.

The semiconductor device PKG101 in the studied example in each of FIGS. 34 to 38 is also a QFN type semiconductor package. In the semiconductor device PKG101 in the studied example in FIG. 34, leads LD101 and leads LD102 are alternately disposed around the die pad DP. End surfaces TM101 of the leads LD101, end surfaces TM102 of the leads LD102, and end surfaces TLM101 of the suspension leads TL101 are exposed from the side surfaces of a sealing portion (resin sealing portion) MR101. The side surfaces of the sealing portion MR101 and the end surfaces TM101, TM102, and TLM101 exposed therefrom are cut surfaces formed by cutting with a dicing blade (corresponding to the foregoing dicing blade BRD) in a dicing step of cutting a resin sealing portion (corresponding to the foregoing sealing portion MR1).

In a semiconductor device in the form of a semiconductor package including a plurality of leads, as the number of leads increases with an increase in the number of terminals and the semiconductor device is miniaturized, the space (pitch) between the two leads next to each other is increasingly reduced. A reduction in the space between the adjacent leads increases the risk of a short circuit between the adjacent leads. Examples of a factor causing a short circuit between the adjacent leads include a metal burr formed in the dicing step of cutting the resin sealing portion.

That is, the metal burr formed in the dicing step of cutting the resin sealing portion may cause a short circuit between the adjacent leads. In the dicing step of cutting the resin sealing portion, the resin sealing portion and the leads are cut with a dicing blade. At that time, however, in the direction of movement of the dicing blade, metal burrs are frequently formed on the leads. When the metal burr on one of the leads comes in contact with the adjacent lead, a short circuit occurs between the adjacent leads.

Figure 39:
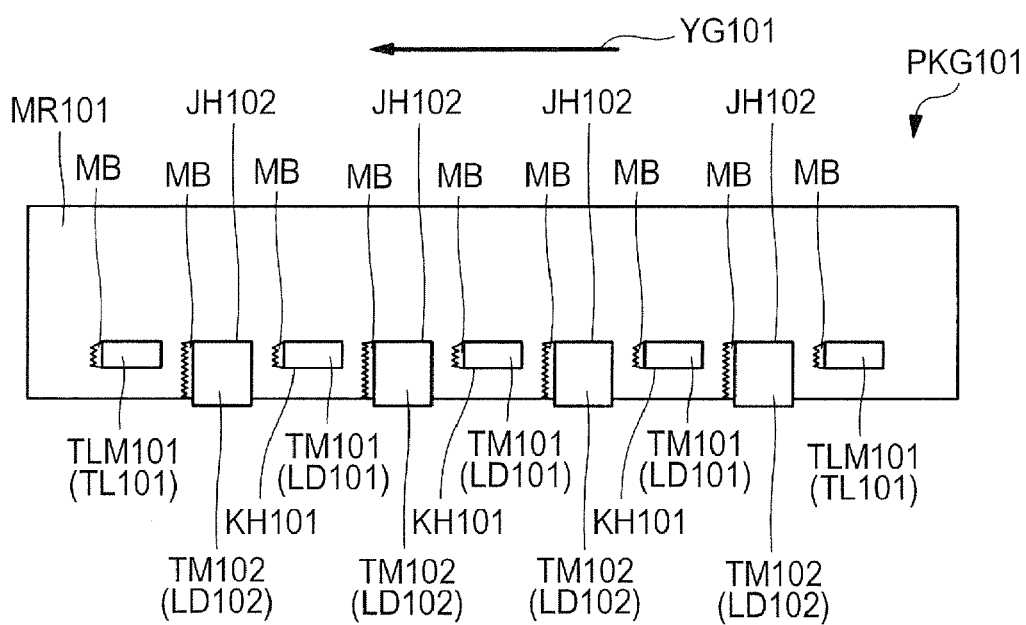
FIG. 39 is a side view of the semiconductor device in the studied example.

FIG. 39 is also a side view showing the side surface of the semiconductor device PKG101 in the studied example. FIG. shows the case where metal burrs MB are formed on the leads LD101 and LD102 in the dicing step.

As also shown in FIG. 39, the metal burrs MB are formed in the direction of movement of the dicing blade. Accordingly, on the leads LD101 and LD102 exposed at the same side surface of the sealing portion MR101, the metal burrs MB are formed in the same direction. In the case shown in FIG. 39, the direction shown by an arrow YG101 is the direction of movement of the dicing blade. On the leads LD101 and LD102, the metal burrs MB are formed in the direction shown by the arrow YG101. The metal burrs MB formed on the leads (LD101 and LD102) are formed integrally with the leads (LD101 and LD102) to extend as thin films over the side surface of the resin sealing portion.

In the semiconductor device PKG101 in the studied example described herein, each of the leads LD101 has substantially the same configuration as that of each of the foregoing leads LD1. Accordingly, the lead LD101 integrally has a thicker portion LD101a corresponding to the foregoing thicker portion LD1a and a thinner portion LD101b corresponding to the foregoing thinner portion LD1b. The cut surface of the thinner portion LD101b serves as the end surface TM101 of the lead LD101 and is exposed at the side surface of the sealing portion MR101 (see FIGS. 36, 38, and 39). However, unlike each of the foregoing leads LD2, each of the leads LD102 has an overall uniform thickness which is substantially equal to the thickness of the foregoing thicker portion LD2a (see FIG. 37). The cut surface of the lead LD102 having the uniform thickness serves as the end surface TM102 of the lead LD102 and is exposed at the side surface of the sealing portion MR101 (see FIGS. 37, 38, and 39). In the semiconductor device PKG101 in the studied example, at the lower surface of the sealing portion MR101, the lower surfaces of the thicker portions LD101a of the leads 101 are exposed, but the lower surfaces of the thinner portions LD101b of the leads LD101 are covered with the sealing portion MR101 and are therefore not exposed. The leads LD102 have the entire lower surfaces thereof exposed from the lower surface of the sealing portion MR101. Accordingly, the bottom view of the semiconductor device PKG101 in the studied example, which is shown in FIG. 34, is substantially the same as the bottom view of the semiconductor device PKG in FIG. 2 described above.

In the case of the semiconductor device PKG101 in the studied example, when the metal burr MG is formed in the dicing step of cutting the resin sealing portion, the metal burr MG may cause a short circuit between the adjacent leads LD101 and LD102.

That is, as also shown in FIG. 39, the metal burrs MB are formed in the direction of movement of the dicing blade. Consequently, on the leads LD101 and LD102 exposed at a given one of the side surfaces (e.g., side surface shown in FIG. 39) of the sealing portion MR101, the metal burrs MB are formed in a lateral direction (direction parallel with the lower surface and side surfaces of the sealing portion MR101). As can also be seen from FIG. 39, the metal burr MB is formed in the lateral direction from one of the adjacent leads LD101 and LD102 toward the other thereof. However, when the metal burr extends over a long distance, the metal burr MB reaches the other lead so that the adjacent leads LD101 and LD102 are short-circuited through the metal burr MG. The possibility of a short circuit between the leads to the degradation of the reliability of the semiconductor device.

It is necessary to prevent the leads LD101 and LD102 from being short-circuited through the metal burr MB. Accordingly, in the case of the semiconductor device PKG101 in the studied example, it is necessary to increase the space between the leads LD101 and LD102 so as to prevent a short circuit between the leads LD101 and LD102 even when the metal burr MB is formed. However, an increase in the space between the leads LD101 and LD102 results in an increase in the two-dimensional size of the semiconductor device PKG101, which is disadvantageous in increasing the number of the terminals of the semiconductor device and miniaturizing the semiconductor device. However, when the space between the leads LD101 and LD102 is conversely reduced to increase the number of the terminals of the semiconductor device and miniaturize the semiconductor device, the risk (possibility) arises to cause a short circuit between the leads LD101 and LD102 through the metal burr MB. When the leads LD101 and LD102 are short-circuited through the metal burr MT, the semiconductor device with the short circuit is removed in an inspection step after the manufacturing thereof. Thus, the presence of the risk of a short circuit between the leads LD101 and LD102 through the metal burr MB leads to the degradation of the manufacturing yield of the semiconductor device and an increase in the manufacturing cost of the semiconductor device.

<About Main Characteristic Features and Effects>

One of the main characteristic features of the present embodiment is that, on the basis of the lower surface MRb of the sealing portion MR, a height position of the lower side KH1 of the end surface TM1 of each of the leads LD1 is higher than a height position of the upper side JH2 of the end surface TM2 of each of the leads LD2 next to the lead LD1. In other words, in side view, the distance (L2) between the lower side KH1 of the end surface TM1 of the lead LD1 and the upper surface MRa of the sealing portion MR in the thickness direction of the sealing portion MR is smaller than the distance (L3) between the upper side JH2 of the end surface TM2 of the lead LD2 and the upper surface MRa of the sealing portion MR in the thickness direction of the sealing portion MR (L2<L3). Accordingly, even when metal burrs (metal burrs on the leads) are formed on the end surfaces TM1 and TM2 of the leads LD1 and LD2 as the cut surfaces of the leads LD1 and LD2, it is possible to reliably prevent the two leads LD1 and LD2 next to each other from being short-circuited through the metal burrs. The following is the reason for this.

Figure 40:
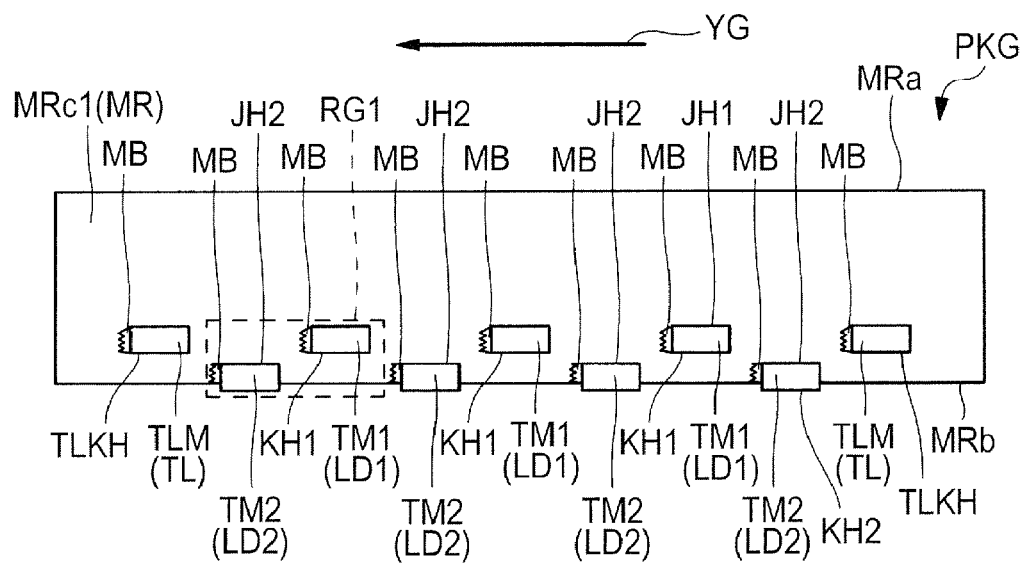
FIG. 40 is a side view of the semiconductor device in the embodiment.
Figure 41:
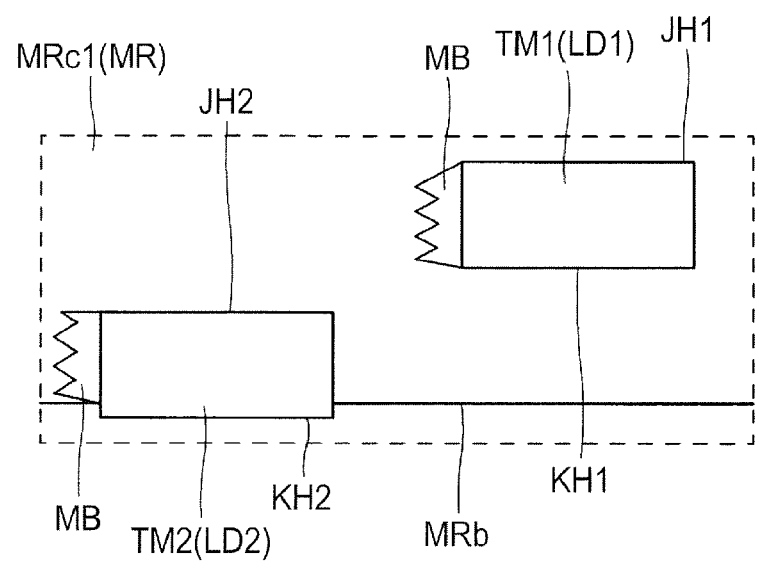
FIG. 41 is a partially enlarged side view showing a part of FIG. 40 in enlarged relation.

Similarly to FIG. 9 described above, FIG. 40 is also a side view showing the side surface of the semiconductor device PKG in the present embodiment. FIG. 40 shows the case where the metal burrs MB are formed on the leads LD1 and LD2 in the dicing step in Step S6. FIG. 41 corresponds to FIG. 10 described above and shows an enlarged view of the region RG1 enclosed by the dotted line in FIG. 40.

As described above, when the semiconductor device PKG is manufactured, the sealing portion MR1 and the leads LD1 and LD2 are cut with the dicing blade BRD (rotary blade) in Step S6 described above. At that time, the metal burrs MB may be formed on the leads LD1 and LD2 to develop in the direction of movement of the dicing blade BRD (rotary blade).

As also shown in FIGS. 40 and 41, the metal burrs MB are formed in the direction of movement of the dicing blade BRD so that the metal burrs MB are formed on the leads LD1 and LD2 exposed at the same side surface of the sealing portion MR to develop in the same direction. Accordingly, in the case shown in FIG. 40, the direction shown by an arrow YG is the direction of movement of the dicing blade BRD and, on each of the leads LD1 and D2, the metal burr MB is formed to develop in the direction shown by the arrow YG. That is, since the metal burr MB is formed in the direction of movement of the dicing blade BRD, on each of the leads LD1 and LD2 exposed at a given one of the side surfaces (which is assumed to be the side surface MRc1 herein) of the sealing portion MR, the metal burr MB is formed in the lateral direction (direction parallel with the lower surface MRb and the side surface MRc1 of the sealing portion MR). The respective metal burrs MB formed on the leads (LD and LD2) are formed integrally with the leads (LD1 and LD2) to extend (spread) as thin films from the end surfaces (TM1 and TM2) of the leads (LD1 and LD2) over the side surface of the sealing portion MR1.

The direction in which the metal burr MB is formed is the direction in which the metal burr MB extends (direction in which the metal burr MB spreads from each of the leads). At the side surface MRc1 of the sealing portion MR, each of the metal burrs MB formed on the end surfaces TM1 and TM2 of the leads LD1 and LD2 extends in a direction (i.e., lateral direction) parallel with each of the lower surface MRb and the side surface MRc1 of the sealing portion MR or parallel with the upper surface MRa and the side surface MRc1 of the sealing portion MR. In other words, at the side surface MRc1 of the sealing portion MR, each of the metal burrs MB formed on the end surfaces TM1 and TM2 of the leads LD1 and LD2 extends in the direction in which the side where the lower surface MRb and the side surface MRc1 of the sealing portion MR meet extends or in the direction in which the side where the upper surface MRa and the side surface MRc1 of the sealing portion MR meet extends. Also, at the side surface MRc2 of the sealing portion MR, each of the metal burrs MB formed on the end surfaces TM1 and TM2 of the leads LD1 and LD2 extends in a direction (i.e., lateral direction) parallel with each of the lower surface MRb and the side surface MRc2 of the sealing portion MR. Also, at the side surface MRc3 of the sealing portion MR, each of the metal burrs MB formed on the end surfaces TM1 and TM2 of the leads LD1 and LD2 extends in a direction (i.e., lateral direction) parallel with each of the lower surface MRb and the side surface MRc3 of the sealing portion MR. Also, over the side surface MRc4 of the sealing portion MR, each of the metal burrs MB formed on the end surfaces TM1 and TM2 of leads LD1 and LD2 extends in a direction (i.e., lateral direction) parallel with each of the lower surface MRb and the side surface MRc4 of the sealing portion MR.

In the present embodiment, the height position of the lower side KH1 of the end surface TM1 of the lead LD1 is set higher than the height position of the upper side JH2 of the end surface TM2 of the lead LD2 such that, even when the metal burr MB is formed in the lateral direction from one of the leads LD1 and LD2 next to each other toward the other thereof and extends over a long distance, the metal burr MB is prevented from coming in contact with the other lead.

In the case of the semiconductor device PKG101 in the foregoing studied example, unlike in the present embodiment, the height position of a lower side KH101 of the end surface TM101 of each of the leads LD101 is lower than the height position of an upper side JH101 of the end surface TM102 of each of the leads LD102 next to the lead LD101 (see FIGS. 38 and 39). As a result, when the metal burr MB is formed in a lateral direction from one of the adjacent leads LD101 and LD102 to the other thereof and extends over a long distance, the metal burr MB comes in contact with the other lead. For example, in FIG. 39, the metal burr MB formed on each of the leads LD101 extends in the lateral direction toward the lead LD102 adjacent thereto in the direction shown by the arrow YG101. When the metal burr MB extends over a long distance, the metal burr MB formed on the lead LD101 undesirably reaches the lead LD102 adjacent thereto in the direction shown by the arrow YG101 to cause a short circuit between the leads LD101 and LD102 through the metal burr MB. Likewise, in FIG. 39, the metal burr MB formed on each of the leads LD102 extends in the lateral direction toward the lead LD101 adjacent thereto in the direction shown by the arrow YG101. When the metal burr MB extends over a long distance, the metal burr MB formed on the lead LD2 undesirably reaches the lead LD101 adjacent thereto in the direction shown by the arrow YG101 to cause a short circuit between the leads LD102 and YG101 through the metal burr MB. Thus, in the case of the semiconductor device PKG101 in the foregoing studied example, to prevent the leads LD101 and LD102 from being short-circuited through the metal burr MB, it is inevitable to increase the space between the leads LD101 and LD102, resulting in an increased two-dimensional size of the semiconductor device.

By contrast, in the present embodiment, the height position of the lower side KH1 of the end surface TM1 of each of the leads LD1 is set higher than the height position of the upper side JH2 of the end surface TM2 of each of the leads LD2 next to the lead LD1. Accordingly, even when the metal burr MB is formed on one of the adjacent leads LD1 and LD2 to develop in a lateral direction toward the other thereof and extends over a long distance, the metal burr MB is prevented from coming in contact with the other lead. Therefore, it is possible to prevent the adjacent leads LD1 and LD2 from being short-circuited through the metal burr MB and thus improve the reliability of the semiconductor device PKG. In the case of the semiconductor device PKG in the present embodiment, even when the space between the leads LD1 and LD2 is not increased, it is possible to prevent the adjacent leads LD1 and LD2 from being short-circuited through the metal burr MB. This can reduce the two-dimensional size of the semiconductor device PKG and miniaturize the semiconductor device PKG.

To prevent the adjacent leads LD1 and LD2 from being short-circuited through the metal burr MB, it is important to set the height position of the lower side KH1 of the end surface TM1 of the lead LD1 higher than the height position of the upper side JH2 of the end surface TM2 of the lead LD2. For example, in FIG. 41, when the height position of the lower side KH1 of the end surface TM1 of each of the leads LD1 is higher than the height position of the upper side JH2 of the end surface TM2 of each of the leads LD2, even though the metal burr MB formed on the lead LD1 extends over a long distance, the metal burr MB is prevented from coming in contact with the lead LD2 since the metal burr MB extends in the lateral direction. However, in FIG. 41, when the height position of the lower side KH1 of the end surface TM1 of each of the leads LD1 is lower than the height position of the upper side JH2 of the end surface TM2 of each of the leads LD2 unlike in the present embodiment, if the metal burr MB formed on the lead LD1 extends over a long distance, the metal burr MB reaches the lead LD2 to come in contact therewith since the metal burr MB extends in the lateral direction. Accordingly, by setting the height position of the lower side KH1 of the end surface TM1 of the lead LD1 higher than the height position of the upper side JH2 of the end surface TM2 of the lead LD2, even when the metal burrs MB are formed on the cut surfaces (end surfaces TM1 and TM2) of the leads LD1 and LD2, no adjacent lead is present ahead of the burrs MB in the extending directions of the metal burrs MB. As a result, it is possible to prevent a short circuit between the leads LD1 and LD2 through the metal burr MB.

Thus, the present inventors have focused attention on the fact that, in the case of cutting a resin sealing portion and leads with a dicing blade (rotary blade), a metal burr may be formed on the cut surface of each of the leads and the metal burr extends in a lateral direction. Then, the present inventors have disposed the cut surface (end surface TM1) of each of the leads LD1 and the cut surface (end surface TM2) of each of the leads LD2 at different height positions and set the height position of the lower side KH1 of the end surface TM1 of each of the leads LD1 higher than the height position of the upper side JH2 of the end surface TM2 of each of the leads LD2 such that, even when a metal burr is formed on the cut surface of the lead, no adjacent lead is present ahead of the metal burr in the extending direction thereof. That is, the height position of the lowest portion (which is the lower side KH1 herein) of the end surface TM1 of the lead LD1 next to the lead LD2 at the same side surface of the sealing portion MR is set higher than the height position of the highest portion (which is the upper side JH2 herein) of the end surface TM2 of the lead LD2 next to the lead LD1. In other words, even when one of the end surfaces TM1 and TM2 of the leads LD1 and LD2 next to each other at the same side surface of the sealing portion MR is virtually moved in a lateral direction (direction parallel with the lower surface MRb and the side surface of the sealing portion MR), the one of the end surfaces TM1 and TM2 is prevented from overlapping the other thereof. Accordingly, even when the metal burrs (MB) are formed on the cut surfaces (end surfaces TM1 and TM2) of the leads LD1 and LD2, it is possible to reliably prevent the adjacent leads LD1 and LD2 from being short-circuited through the metal burr (MB).

In the present embodiment, even when the metal burrs (MB) are formed during the cutting of the leads LD1 and LD2, it is possible to reliably prevent the adjacent leads LD1 and LD2 from being short-circuited through the metal burr (MB). This allows a reduction in the space between the adjacent leads LD1 and LD2. That is, in the present embodiment, by setting the height position of the lower side KH1 of the end surface TM1 of each of the leads LD1 higher than the height position of the upper side JH2 of the end surface TM2 of each of the leads LD2, even when the space between the adjacent leads LD1 and LD2 is reduced, there is no increase in the risk (possibility) of a short circuit between the adjacent leads LD1 and LD2 through the metal burr (MB). Since the space between the adjacent leads LD1 and LD2 can thus be reduced without increasing the risk (possibility) of a short circuit between the adjacent leads LD1 and LD2 through the metal burr (MB), it is possible reduce the two-dimensional size of the semiconductor device PKG and increase the number of the leads LD without increasing the two-dimensional size of the semiconductor device PKG. This can miniaturize the semiconductor device PKG and increase the number of the terminals thereof. When a short circuit occurs between adjacent leads via a metal burr, the semiconductor device with the short circuit is removed in an inspection step after the manufacturing thereof. In the present embodiment, a short circuit between leads resulting from metal burrs on the leads can be prevented. Therefore, it is possible to improve the manufacturing yield of the semiconductor device and reduce the manufacturing cost of the semiconductor device.

As described above, in the present embodiment, as a result of focusing attention on the fact that a metal burr may be formed on the cut surface of each of the leads when the resin sealing portion (sealing portion MR1) and the leads are cut with a dicing blade (rotary blade) and the metal burr extends in a lateral direction, the present inventors have set the height position of the lower side KH1 of the end surface TM1 of each of the leads LD1 higher than the height position of the upper side JH2 of the end surface TM2 of each of the leads LD2. When the resin sealing portion (sealing portion MR1) and the leads are cut by punch working (punching) unlike in the present embodiment, a metal burr is formed on each of the leads to develop in a vertical direction, not in a lateral direction.

Accordingly, the present embodiment is effective when applied to the case where, when the semiconductor device (PKG) is manufactured, the resin sealing portion (sealing portion MR) and the leads LD are cut with a dicing blade (rotary blade). By cutting with the dicing blade (rotary blade), not punch working, even when the resin sealing portion in a region to be cut is rather thick, the resin sealing portion can reliably be cut.

The present embodiment is also effective when applied to the case where, in the manufactured semiconductor device PKG, the metal burrs (MB) are formed on the end surfaces TM (TM1 and TM2) of the leads LD (LD1 and LD2) exposed from the side surfaces of the sealing portion MR and the metal burrs (MB) develop in a lateral direction. In side view in which the side surface MRc1 of the sealing portion MR is viewed, the lateral direction mentioned herein is a direction parallel with each of the lower surface MRb and the side surface MRc1 of the sealing portion MR (i.e., direction parallel with the lower surface MRb and also parallel with the side surface MRc1) or a direction parallel with each of the upper surface MRa and the side surface MRc1 of the sealing portion MR (i.e., direction parallel with the upper surface MRa and also parallel with the side surface MRc1). In other words, the lateral direction is a direction in which the side where the lower surface MRb and the side surface MRc1 of the sealing portion MR meet extends or a direction in which the side where the upper surface MRa and the side surface MRc1 of the sealing portion MR meet extends. In side view in which the side surface MRc2 of the sealing portion MR is viewed, the lateral direction is a direction parallel with each of the lower surface MRb and the side surface MRc2 of the sealing portion or a direction parallel with each of the upper surface MRa and the side surface MRc2 of the sealing portion MR. In other words, the lateral direction is a direction in which the side where the lower surface MRb and the side surface MRc2 of the sealing portion MR meet extends or a direction in which the side where the upper surface MRa and the side surface MRc2 of the sealing portion MR meet extends. The same idea can also hold true in side view in which the side surface MRc3 of the sealing portion MR is viewed and in side view in which the side surface MRc4 of the sealing portion MR is viewed.

That is, a case is assumed where, in the manufactured semiconductor device PKG, the metal burrs (MB) are formed on the end surfaces TM of the leads LD exposed from each of the side surfaces of the sealing portion MR and the metal burrs develop in a lateral direction. It is suggested that, in this case, unless the height position of the lower side KH1 of the end surface TM1 of each of the leads LD1 is set higher than the height position of the upper side JH2 of the end surface TM2 of each of the leads LD2, there is the risk of a short circuit between the leads LD through the metal burr formed during the cutting of the leads LD, unlike in the present embodiment. Accordingly, it can be said that, in this case, by setting the height position of the lower side KH1 of the end surface TM1 of each of the leads LD1 higher than the height position of the upper side JH2 of the end surface TM2 of each of the leads LD2 as in the present embodiment, the risk of a short circuit between the leads LD through the metal burr (MB) formed during the cutting of the leads is eliminated. Therefore, when the metal burrs (MB) are formed on the end surfaces TM of the leads LD exposed from each of the side surfaces of the sealing portion MR in the manufactured semiconductor device PKG and the metal burrs develop in the lateral direction, it is effective to apply the present embodiment to the semiconductor device PKG. By doing so, such effects as described above can be obtained.

In the wire bonding step in Step S3, a method (thermocompression method) which connects the wires BW with the pad electrodes PD and the leads LD by applying heat and a load can also be used. However, it is more preferable to use a method (ultrasonic thermocompression method) which connects the wires BW with the pads PD and the leads LD while applying also an ultrasonic wave in addition to heat and a load. By using the ultrasonic thermocompression method, it is possible to enhance the connection strength of the wires BW relative to the pad electrodes PD and the leads LD.

Note that, since copper (Cu) is a material harder than gold (Au), it is more difficult to ensure a connection strength relative to the leads for copper (Cu) wires than for gold (Au) wires. Accordingly, it is desirable to set the frequency of the applied ultrasonic wave higher in a wire bonding step using copper wires than in a wire bonding step using gold wires and, by doing so, it is possible to ensure the connection strength for the copper wires. However, when the widths of the leads (widths of the leads in a wire bonding region) are reduced, it is difficult to apply an ultrasonic wave at a high frequency. Therefore, when the copper wires are used, it is desirable to rather increase the widths of the leads (widths of the leads in the wire bonding region) with the increase of the frequency of the ultrasonic wave applied during wire bonding.

However, in the semiconductor device PKG101 in the foregoing studied example, when the widths of the leads (widths of the leads in the wire bonding region) are increased due to the use of the copper wires and the space between the adjacent leads is accordingly reduced, the risk of a short circuit between the leads through the metal burr formed during the cutting of the leads may increase. Accordingly, when the copper wires are used in the semiconductor device PKG101 in the foregoing studied example and a short circuit between the leads through the metal burr formed during the cutting of the leads is to be prevented, the widths of the leads (widths of the leads in the wire bonding region) are increased, while the space between the adjacent leads is maintained. However, this increases the two-dimensional size of the semiconductor device PKG101.

By contrast, in the present embodiment, as described above, the height position of the lower side KH1 of the end surface TM1 of each of the leads LD1 is set higher than the height position of the upper side JH2 of the end surface TM2 of each of the leads LD2 to thus prevent a short circuit between the leads LD through the metal burr formed during the cutting of the leads LD. Consequently, even when the space between the adjacent leads LD is reduced, it is possible to prevent a short circuit between the leads LD through the metal burr formed during the cutting of the leads LD. As a result, in the semiconductor device PKG in the present embodiment, even when the widths of the leads LD (widths of the leads LD in the wire bonding region) are increased due to the use of copper wires as the wires BW and the space between the adjacent leads LD is accordingly reduced, it is possible to prevent a short circuit between the leads LD through the metal burr formed during the cutting of the leads LD.

Therefore, in the present embodiment, when copper wires are used as the wires BW, it is possible to rather increase the widths of the leads LD (widths of the leads LD in the wire bonding region) and allow wire bonding using the ultrasonic thermocompression method to be easily performed. In addition, since it is permitted to reduce the space between the adjacent leads LD, the two-dimensional size of the semiconductor device PKG can be reduced. Accordingly, as the wires BW, gold (Au) wires, copper (Cu) wires, aluminum (Al) wires, or the like can appropriately be used. The present embodiment achieves a significant effect when applied to the case where copper wires are used as the wires BW.

In the case where gold wires are used as the wires BW, the frequency of an ultrasonic wire applied during wire bonding can be reduced compared to the case where copper wires are used and accordingly the widths of the leads LD can be reduced. This can reduce the amount (volume) of the leads cut in the dicing step and thus elongate the use lifetime of the dicing blade BRD. As a result, it can be expected that, even when applied to the case where gold wires are used as the wires BE, the present embodiment achieves the effects.

As described above, in the present embodiment, the height position of the lower side KH1 of the end surface TM1 of each of the leads LD1 is set higher than the height position of the upper side JH2 of the end surface TM2 of each of the leads LD2. When the distance (distance in the height direction) between the height position of the lower side KH1 of the end surface TM1 of the lead LD1 and the height position of the upper side JH2 of the end surface TM2 of the lead LD2 is assumed to be a distance DF using a reference mark DF (see FIG. 10), the difference DF is larger than zero (i.e., DF>0 is satisfied). Note that the difference DF corresponds to the difference between the distance L2 between the lower side KH1 of the end surface TM1 of the lead LD1 and the upper surface MRa (i.e., the side of the upper surface MRa shown in FIG. 9) of the sealing portion MR in the thickness direction of the sealing portion MR and the distance L3 between the upper side JH2 of the end surface TM2 of the lead LD2 and the upper surface MRa (i.e., the side of the upper surface MRa shown in FIG. 9) of the sealing portion MR in the thickness direction of the sealing portion MR (DF=L3−L2).

The distance DF is preferably 10 to 40% of the thickness of the thickest portion of the lead LD1 or LD2 (which is the thickness T1a of the thicker portion LD1a or the thickness T2a of the thicker portion LD2a herein). That is, T1a× 0.1≤DF≤T1a×0.4 or T2a×0.1≤DF≤T2a×0.4 is preferably satisfied. When the difference DF is rather increased, even when the metal burr (MB) is formed on each of the leads LD to develop in a direction somewhat inclined from a lateral direction from any cause during the cutting of the leads LD, it is possible to reliably prevent a short circuit between the adjacent leads LD1 and LD2 through the metal burr. From this point of view, the difference DF is preferably not less than 10% of the thickness of the thickest portion of the lead LD1 or LD2 (which is the thickness T1a of the thicker portion LD1a or the thickness T2a of the thicker portion LD2a). That is, T1a×0.1≤DF or T2a×0.1≤DF is preferably satisfied.

However, when the thickness DF is excessively increased, the thicknesses T1b and T2b of the thinner portions LD1b and LD2b of the leads LD1 and LD2 are considerably reduced and it may be difficult to perform the manufacturing process of the semiconductor device PKG. From this point of view, the difference DF is preferably not more than 40% of the thickness of the thickest portion of the lead LD1 or LD2 (which is the thickness T1a of the thicker portion LD1a or the thickness T2a of the thicker portion LD2). That is, DF≤ T1a×0.4 or DF≤T2a×0.4 is preferably satisfied. Accordingly, the difference DF is particularly preferably 10 to 40° of the thickness of the thickest portion of the lead LD1 or LD2 (which is the thickness T1a of the thicker portion LD1a or the thickness T2a of the thicker portion LD2). That is, T1a×0.1≤DF≤T1a×0.4 or T2a×0.1≤DF≤T2a×0.4 is particularly preferably satisfied.

By way of example, each of the thicknesses T1a and T2a of the thicker portions LD1a and LD2a of the leads LD1 and LD2 can be set to about 0.2 mm, the thicknesses T1b and T2b of the thinner portions LD1b and LD2b of the leads LD1 and LD2 can be set to about 0.08 mm, and the difference DF can be set to about 0.04 mm.

<About First Modification>

Next, a description will be given of a first modification of the semiconductor device PKG in the present embodiment. Note that the following will refer to the semiconductor device PKG in the first modification as a semiconductor device PKG1 using a reference numeral PKG1 and refer to the semiconductor device PKG in FIGS. 1 to 11 described above as the foregoing semiconductor device PKG.

Figure 42:
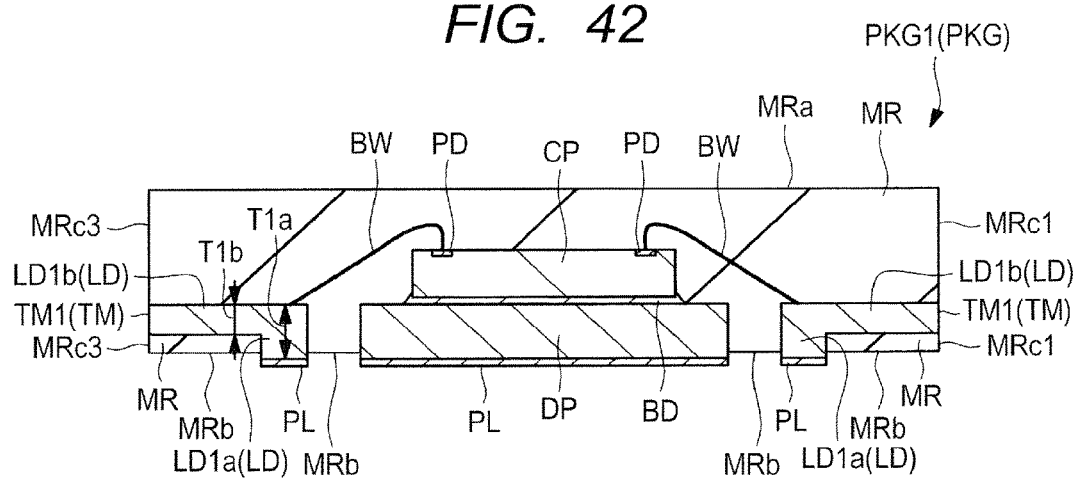
FIG. 42 is a cross-sectional view of a semiconductor device in a first modification.
Figure 43:
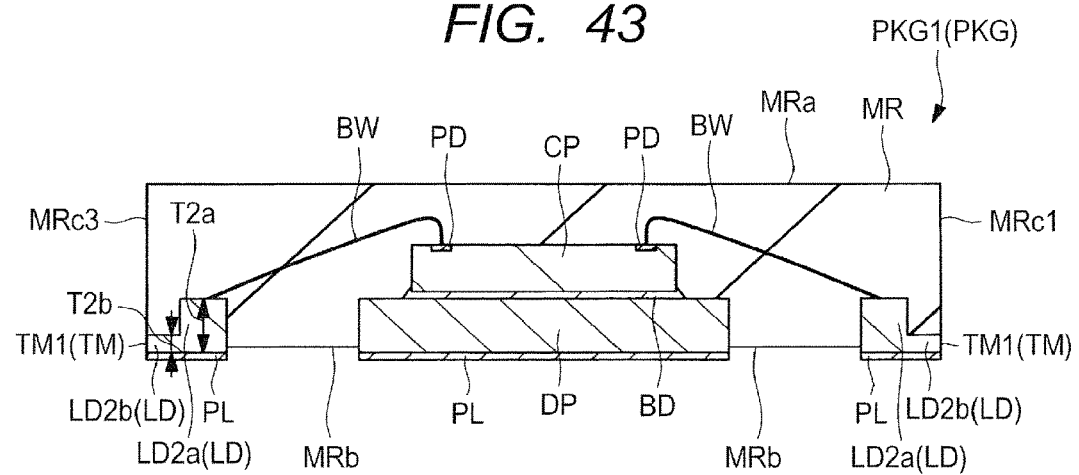
FIG. 43 is a cross-sectional view of the semiconductor device in the first modification.
Figure 44:
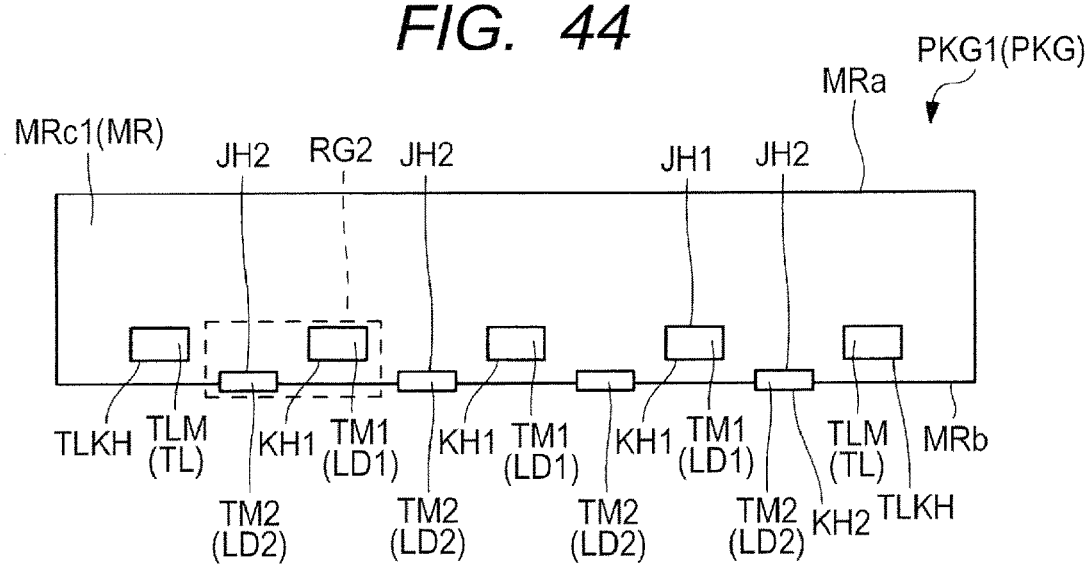
FIG. 44 is a side view of the semiconductor device in the first modification.
Figure 45:
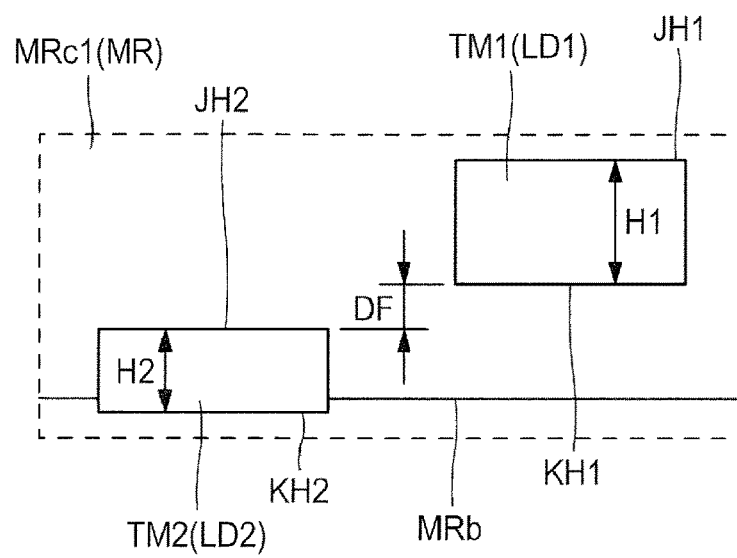
FIG. 45 is a partially enlarged side view showing a part of FIG. 44 in enlarged relation.

FIGS. 42 and 43 are cross-sectional views of the semiconductor device PKG1 in the first modification. FIG. 44 is a side view of the semiconductor device PKG1 in the first modification. FIG. 45 is a partially enlarged side view which shows an enlarged view of a region RG2 enclosed by the dotted line in FIG. 44. FIG. 42 corresponds to FIG. 6 described above. FIG. 43 corresponds to FIG. 7 described above. FIG. 44 corresponds to FIG. 9 described above. FIG. 45 corresponds to FIG. 10 described above.

In the foregoing semiconductor device PKG (semiconductor device PKG in FIGS. 1 to 11 described above), the thickness T1b of the thinner portion LD1b of each of the leads LD1 is substantially equal to the thickness T2b of the thinner portion LD2b of each of the leads LD2 (T1b=T2b) (see FIGS. 6 and 7). Reflecting T1b=T2b, in the foregoing semiconductor device PKG, the dimension H1 of the end surface TM1 of each of the leads LD1 in the height direction is substantially equal to the dimension H2 of the end surface TM2 of each of the leads LD2 in the height direction (H1=H2) (see FIG. 10).

By contrast, in the semiconductor device PKG1 in the first modification, the thickness T1b of the thinner portion LD1b of each of the leads LD1 is larger than the thickness T2b of the thinner portion LD2b of each of the leads LD2 (T1b>T2b) (see FIGS. 42 and 43). Reflecting T1b>T2b, in the semiconductor device PKG1 in the first modification, the dimension H1 of the end surface TM1 of each of the leads LD1 in the height direction is larger than the dimension H2 of the end surface TM2 of each of the leads LD2 in the height direction (H1>H2) (see FIG. 45).

The semiconductor device PKG1 in the first modification is common to the foregoing semiconductor device PKG in that the dimension H1 of the end surface TM1 of the lead LD1 in the height direction is substantially equal to the thickness T1b of the thinner portion LD1b of the lead LD1 (H1=T1b) and the dimension H2 of the end surface TM2 of the lead LD2 in the height direction is substantially equal to the thickness T2b of the thinner portion LD2b of the lead LD2 (H2=T2b).

The configuration of the semiconductor device PKG1 in the first modification is otherwise substantially the same as that of the foregoing semiconductor device PKG so that a repeated description thereof is omitted herein. Also, the manufacturing process of the semiconductor device PKG1 in the first modification is substantially the same as the manufacturing process of the foregoing semiconductor device PKG so that a repeated description thereof is omitted herein.

From the semiconductor device PKG1 in the first modification, substantially the same effects as obtained from the foregoing semiconductor device PKG can be obtained. In addition, the following effects can also be obtained from the semiconductor device PKG1.

When the semiconductor device is manufactured, the entire lower surface of each of the leads LD2 of the lead frame LF and the lower surface of the thicker portion LD1a of each of the leads LD1 can be supported on the supporting surface of a supporting member, but the lower surface of the thinner portion LD1b of the lead LD1 is apart from the supporting surface of the supporting member to be in an unsupported state. Examples of the supporting member include a sheet-like member (back tape) bonded to the entire lower surface of the lead frame LF and the like. For example, after the lead frame LF is produced, the back tape is bonded to the entire lower surface of the lead frame LF and removed from the lead frame LF after the sealing portion MR1 is formed in the molding step and before the plating step (step of forming the foregoing plating layers PL) is performed. Since the entire lower surface of each of the leads LD2 and the lower surface of the thicker portion LD1a of each of the leads LD1 in the lead frame LF are in contact with the back tape, even when the molding step is performed, the respective lower surfaces of the lead LD2 and the thicker portion LD1a of the lead LD1 are not covered with the sealing portion MR1. On the other hand, since the lower surface of the thinner portion LD1b of each of the leads LD1 is apart from the back tape, when the molding step is performed, the lower surface of the thinner portion LD1b of the lead LD1 is covered with the sealing portion MR1.

When the semiconductor device is manufactured, not only the thicker portion LD2a of each of the leads LD2, but also the thinner portion LD2b thereof is supported by a supporting member such as a back tape. Accordingly, even when the thickness T2 of the thinner portion LD2b of the lead LD2 is reduced, the supporting strength of the lead LD2 is not reduced and a problem associated with the manufacturing process of the semiconductor device is less likely to arise. On the other hand, when the semiconductor device is manufactured, the thicker portion LD1 of each of the leads LD1 can be supported by a supporting member such as a back tape, but the thinner portion LD1b of the lead LD1 is not supported by a supporting member such as a back tape. Accordingly, when the thickness T1b of the thinner portion LD1b of the lead LD1 is excessively reduced, the supporting strength of the lead LD1 deteriorates to possibly cause the deformation of the lead LD1. Therefore, it is desirable to rather increase the thickness T1b of the thinner portion LD1b of the lead LD1.

Accordingly, in the semiconductor device PKG1 in the first modification, the thickness T2b of the thinner portion LD2b of each of the leads LD2 is set smaller than the thickness T1b of the thinner portion LD1b of the lead LD1 (T1b>T2b). Consequently, the dimension H1 of the end surface TM1 of the lead LD1 in the height direction is larger than the dimension H2 of the end surface TM2 of the lead LD2 in the height direction (H1>H2). Therefore, by increasing the thickness T1b of the thinner portion LD1b of the lead LD1, it is possible to ensure a supporting strength for the lead LD1 and reliably prevent the deformation of the lead LD1 and, by reducing the thickness T2b of the thinner portion LD2b of the lead LD2, it is possible to reliably provide a structure in which the height position of the lower side KH1 of the end surface TM1 of the lead LD1 is higher than the height position of the upper side JH2 of the end surface TM2 of the lead LD2.

Note that, in the case of the semiconductor device PKG1 in the first modification also, in the same manner as in the foregoing semiconductor device PKG, the foregoing difference DF is particularly preferably 10 to 40% of the thickness of the thickest portion of the lead LD1 or LD2 (which is the thickness T1a of the thicker portion LD1a or the thickness T2a of the thicker portion LD2a herein). That is, T1a×0.1≤DF≤T1a×0.4 or T1b×0.1≤DF≤T1b×0.4 is particularly preferably satisfied. By way of example, each of the thicknesses T1a and T2a of the thicker portions LD1a and LD2a of the leads LD1 and LD2 can be set to about 0.2 mm, the thickness T1b of the thinner portions LD1b of the lead LD1 can be set to about 0.1 mm, the thickness T2b of the thinner portions LD2b of the lead LD2 can be set to about 0.06 mm, and the difference DF can be set to about 0.04 mm.

<About Second Modification>

Next, a description will be given of a second modification of the semiconductor device PKG in the present embodiment. Note that the following will refer to the semiconductor device PKG in the second modification as a semiconductor device PKG2 using a reference numeral PKG2 and refer to the semiconductor device PKG in FIGS. 1 to 11 described above as the foregoing semiconductor device PKG.

Figure 46:
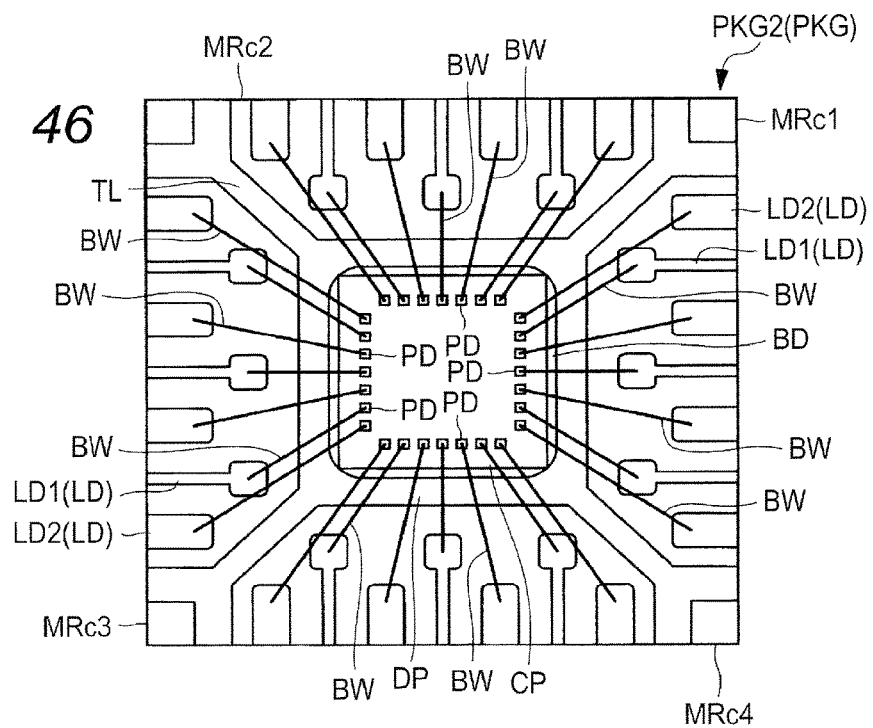
FIG. 46 is a perspective plan view of a semiconductor device in a second modification.
Figure 47:
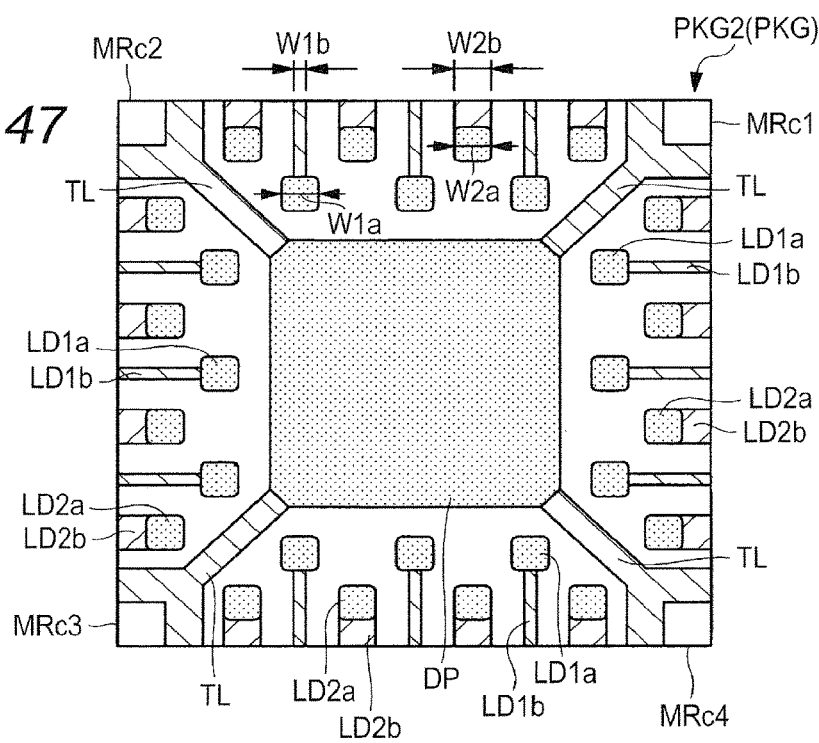
FIG. 47 is a perspective plan view of the semiconductor device in the second modification.
Figure 48:
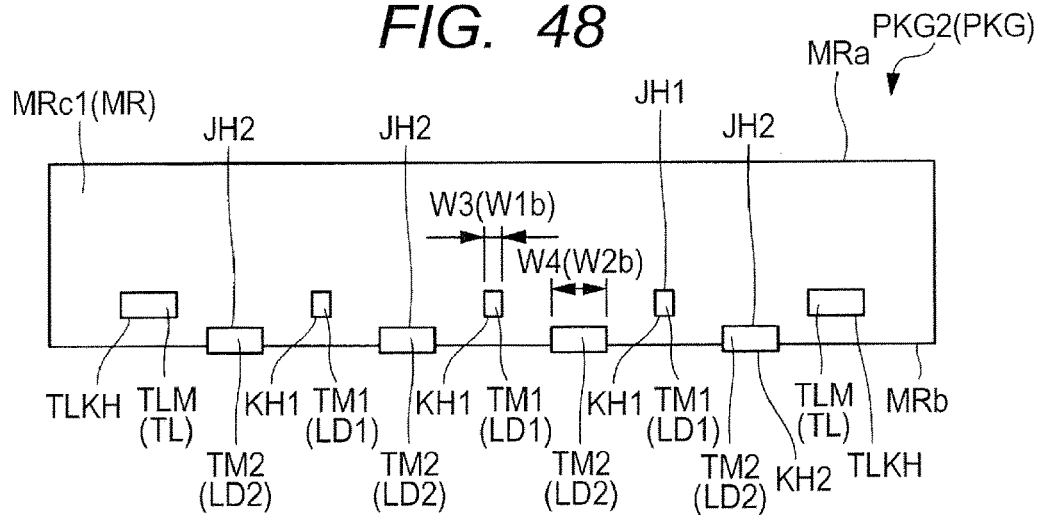
FIG. 48 is a side view of the semiconductor device in the second modification.

FIGS. 46 and 47 are perspective plan views of the semiconductor device PKG2 in the second modification. FIG. is a side view of the semiconductor device PKG2 in the second modification. Note that FIG. 46 corresponds to FIG. 3 described above, FIG. 47 corresponds to FIG. 11 described above, and FIG. 48 corresponds to FIG. 9 described above. To FIG. 47 also, the same hatching as added to FIG. 11 described above is added. Since a top view of the semiconductor device PKG2 in the second modification is the same as FIG. 1 described above, a bottom view of the semiconductor device PKG2 in the second modification is the same as FIG. 2 described above, and a cross-sectional view of the semiconductor device PKG2 in the second modification is the same as each of FIGS. 6 to 8 described above, repeated illustration thereof is omitted herein.

In the foregoing semiconductor device PKG (semiconductor device PKG in FIGS. 1 to 11 described above), the width W1b of the thinner portion LD1b of each of the leads LD1 is substantially equal to the width W1a of the thicker portion LD1a of the lead LD1 (W1a=W1b) (see FIG. 11). Also, in the foregoing semiconductor device PKG, the width W2b of the thinner portion LD2b of each of the leads LD2 is substantially equal to the width W2a of the thicker portion LD2a of the lead LD2 (W2a=W2b). Also, in the foregoing semiconductor device PKG, the width W1b of the thinner portion LD1b of the lead LD1 is substantially equal to the width W2b of the thinner portion LD2b of the lead LD2 (W1b=W2b). Also, in the foregoing semiconductor device PKG, the width W1a of the thicker portion LD1a of the lead LD1 is substantially equal to the width W2a of the thicker portion LD2a of the lead LD2 (W1a=W2a) (see FIG. 11). Accordingly, in the foregoing semiconductor device PKG, the lateral dimension W3 of the end surface TM1 of the lead LD1 is equal to the lateral dimension W4 of the end surface TM2 of the lead LD2 (W3=W4) (see FIG. 9).

By contrast, the semiconductor device PKG2 in the second modification is common to the foregoing semiconductor device PKG in that the width W2*b* of the thinner portion LD2*b* of each of the leads LD2 is substantially equal to the width W2*a* of the thicker portion LD2*a* of the lead LD2 (W2*a*=W2*b*) (see FIG. 47). However, in the semiconductor device PKG2 in the second modification, unlike in the foregoing semiconductor device PKG, the width W1*b* of the thinner portion LD1*b* of each of the leads LD1 is smaller than the width W1*a* of the thicker portion LD1*a* of the lead LD1 (W1*a*>W1*b*) (see FIG. 47). The semiconductor device PKG2 in the second modification is also common to the foregoing semiconductor device PKG in that the width W1*a* of the thicker portion LD1*a* of the lead LD1 is substantially equal to the width W2*a* of the thicker portion LD2*a* of each of the leads LD2 (W1*a*=W2*a*) (see FIG. 47). However, in the semiconductor device PKG2 in the second modification, unlike in the foregoing semiconductor device PKG, the width W1*b* of the thinner portion LD1*b* of the lead LD1 is smaller than the width W2*b* of the thinner portion LD2*b* of the lead LD2 (W1*b*<W2*b*) (see FIG. 47). Accordingly, in the semiconductor device PKG2 in the second modification, unlike in the foregoing semiconductor device PKG, the lateral dimension W3 of the end surface TM1 of the lead LD1 is smaller than the lateral dimension W4 of the end surface TM2 of the lead LD2 (W3<W4). This is because the lateral dimension of the end surface TM1 of the lead LD1 is substantially equal to the width W1*b* of the thinner portion LD1*b* of the lead LD1, and the lateral dimension of the end surface TM2 of the lead LD2 is substantially equal to the width W2*b* of the thinner portion LD2*b* of the lead LD2 (see FIG. 48).

The configuration of the semiconductor device PKG2 in the second modification is otherwise substantially the same as that of the foregoing semiconductor device PKG so that a repeated description thereof is omitted herein. Also, the manufacturing process of the semiconductor device PKG2 in the second modification is substantially the same as the manufacturing process of the foregoing semiconductor device PKG so that a repeated description thereof is omitted herein.

From the semiconductor device PKG2 in the second modification, substantially the same effects as obtained from the foregoing semiconductor device PKG can be obtained. In addition, the following effects can also be obtained from the semiconductor device PKG2.

When the semiconductor device is mounted over a mounting substrate, the respective lower exposed surfaces of the leads LD1 and LD2 are bonded to the terminals of the mounting substrate with a solder or the like. When the semiconductor device is warped, a stress resulting from the warping is largest to the outer peripheral portion of the lower surface MRb of the sealing portion MR. At the lower surface MRb of the sealing portion MR, the lower exposed surfaces of the leads LD2 are located closer to the outer periphery than the lower exposed surfaces of the leads LD1. Accordingly, when the semiconductor device is warped, the stress applied as a result of the warping to the junction portion between the lower exposed surface of each of the leads LD2 and the terminal of the mounting substrate is larger than the stress applied as a result of the warping to the junction portion between the lower exposed surface of each of the leads LD1 and the terminal of the mounting substrate. Consequently, when the semiconductor device is warped, the risk (possibility) of peeling of the junction portion between the lead LD2 and the terminal of the mounting substrate is higher than the risk (possibility) of peeling of the junction portion between the lead LD1 and the terminal of the mounting substrate.

Accordingly, in the semiconductor device PKG2 in the second modification also, in the same manner as in the foregoing semiconductor device PKG, the width W2*b* of the thinner portion LD2*b* of each of the leads LD2 is set substantially equal to the width W2*a* of the thicker portion LD2*a* of the lead LD2 (W2*a*=W2*b*) to assure the area of the lower exposed surface of the lead LD2 exposed from the lower surface MRb of the sealing portion MR. This can ensure a junction strength between the lead LD2 of the semiconductor device and the terminal of the mounting substrate. Consequently, even if the semiconductor device is warped when the semiconductor device is mounted over the mounting substrate, by increasing the area of the lower exposed surface of the lead LD2 to which a large stress is applied as a result of the warping and enhancing the junction strength between the lead LD2 and the terminal of the mounting substrate, it is possible to reliably prevent the junction portion between the lead LD2 and the terminal of the mounting substrate from peeling. Therefore, it is possible to improve the mounting reliability of the semiconductor device.

On the other hand, when the semiconductor device is warped, the stress applied as a result of the warping to the junction portion between the lower exposed surface of each of the leads LD2 and the terminal of the mounting substrate is smaller than the stress applied as a result of the warping to the junction portion between the lower exposed surface of each of the leads LD1 and the terminal of the mounting substrate. In addition, the lower exposed surface of the lead LD2 is made of the lower surface of the thicker portion LD1*a* of the lead LD1, and the lower surface of the thinner portion LD1*b* of the lead LD1 is covered with the sealing portion MR. Accordingly, even when the width W1*b* of the thinner portion LD1*b* of the lead LD1 is reduced, the area of the lower exposed surface of the lead LD2 remains unchanged. Therefore, a reduction in the width W1*b* of the thinner portion LD1*b* of the lead LD1 does not affect the junction strength between the lower exposed surface of the lead LD1 and the terminal of the mounting substrate.

Accordingly, in the semiconductor device PKG2 in the second modification, the width W1*b* of the thinner portion LD1*b* of each of the leads LD1 is set smaller than the width W1*a* of the thicker portion LD1*a* of the lead LD1 (W1*a*>W1*b*). This can reduce the width W1*b* of the thinner portion LD1*b* of the lead LD1, while assuring the width W1*a* and the two-dimensional size (plane area) of the thicker portion LD1*a* of the lead LD1. By rather increasing the width W1*a* and the two-dimensional size (plane area) of the thicker portion LD1*a* of the lead LD1, it is easier to connect the wires BW with the upper surfaces of the thicker portions LD1*a* of the leads LD1 and ensure the junction strength between the lower surface (i.e., lower exposed surface) of the thicker portion LD1*a* of the lead LD1 and the terminal of the mounting substrate. In addition, in the dicing step of cutting the resin sealing portion and the leads, as the amount (volume) of the metal members to be cut is smaller, the dicing step is more easily performed. In the case in the second modification, by reducing the width W1*b* of the thinner portion LD1*b* of the lead LD1, it is possible to reduce the amount (volume) of the leads LD1 cut in the dicing step in Step S6. This allows the dicing step in Step S6 to be more easily performed and also allows the use lifetime of the dicing blade BRD to be elongated.

Thus, in the semiconductor device PKG2 in the second modification, the width W1*b* of the thinner portion LD1*b* of each of the leads LD1 is set smaller than the width W2*b* of the thinner portion LD2 of each of the leads LD2

(W1b<W2b). Consequently, the lateral dimension W3 of the end surface TM1 of the lead LD1 is smaller than the lateral dimension W4 of the end surface TM2 of the lead LD2 (W3<W4). This can increase the width W2b of the thinner portion LD2b of the lead LD2 (lateral dimension W4 of the end surface TM2), enhance the junction strength between the lower exposed surface of the lead LD2 and the terminal of the mounting substrate, and improve the mounting reliability of the semiconductor device. This can also reduce the width W1b of the thinner portion LD1b of the lead LD1 (lateral dimension W3 of the end surface TM1) and allow the dicing step in Step S6 to be more easily performed. This can also elongate the use lifetime of the dicing blade BRD.

Thus, in the case in the second modification (semiconductor device PKG2), it is possible to reduce the amount (volume) of the metal members cut in the dicing step in Step S6 compared to the case where the foregoing semiconductor device PKG is manufactured, while ensuring substantially the same mounting reliability as ensured for the foregoing semiconductor device PKG. Therefore, the advantage of facilitating the dicing step in Step S6 can be obtained.

In the plating step in Step S5, the end surfaces TM1, TM2, and TLM are not formed yet so that the plating layers PL are not formed over the end surfaces TM1, TM2, and TLM in Step S5. However, when the leads LD2 are cut in the dicing step in Step S6, the plating layers PL formed over the lower exposed surfaces of the leads LD2 (portions thereof exposed from the lower surface MR1b of the sealing portion MR1) are also cut together with the leads LD2. Consequently, a part of each of the plating layers PL may result in the burr of the plating layer PL and extend over a part of the cut surface (end surface TM2) of the lead LD2. In this case, in the manufactured semiconductor device, a part of the end surface TM2 of each of the leads LD2 is covered with the plating layer PL. If a part of the end surface TM2 of each of the leads LD2 is covered with the plating layer PL, when the semiconductor device is solder-mounted over the mounting substrate, a solder rises to wet the upper surface of the plating layer PL covering the part of the end surface TM2 of the lead LD2. In the same manner as in the foregoing semiconductor device PKG, in the semiconductor device PKG2 in the second modification also, the width W2b of the thinner portion LD2b of the lead LD2 is not reduced. Accordingly, when the semiconductor device is solder-mounted over the mounting substrate, the amount of the solder which rises to wet the upper surface of the plating layer PL covering the part of the end surface TM2 of the lead LD2 can be increased. In this point also, in the case of the semiconductor device PKG2 in the second modification, it is possible to ensure substantially the same mounting reliability as ensured for the foregoing semiconductor device PKG.

<About Third Modification>

Next, a description will be given of a third modification of the semiconductor device PKG in the present embodiment. Note that the following will refer to the semiconductor device PKG in the third modification as a semiconductor device PKG3 using a reference numeral PKG3 and refer to the semiconductor device PKG in FIGS. 1 to 11 described above as the foregoing semiconductor device PKG.

Figure 49:
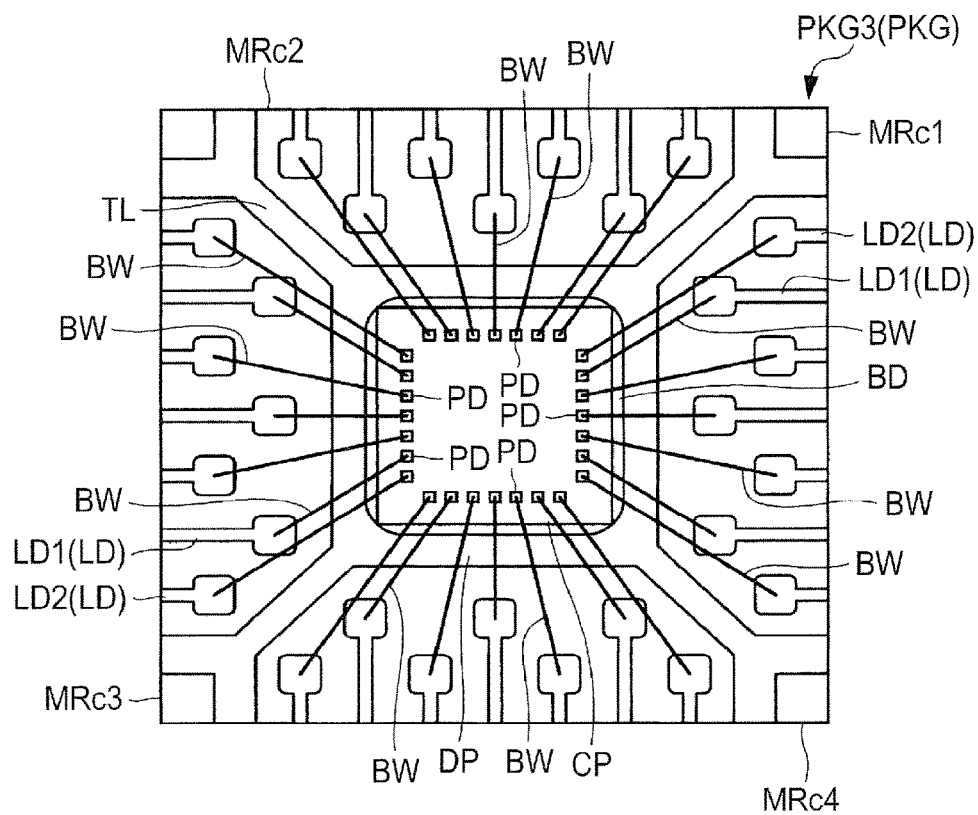
FIG. 49 is a perspective plan view of a semiconductor device in a third modification.
Figure 50:
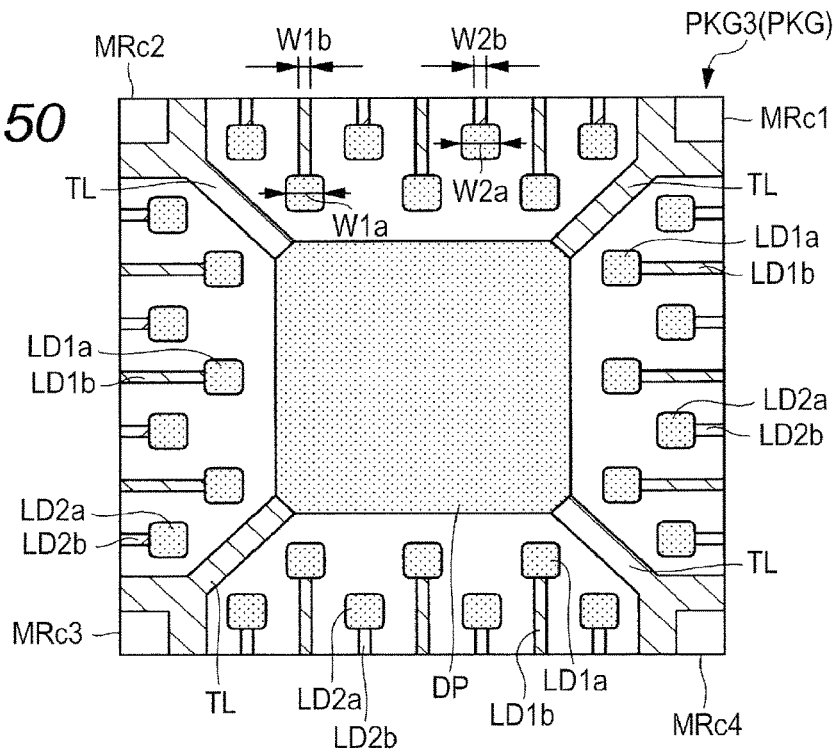
FIG. 50 is a perspective plan view of the semiconductor device in the third modification.
Figure 51:
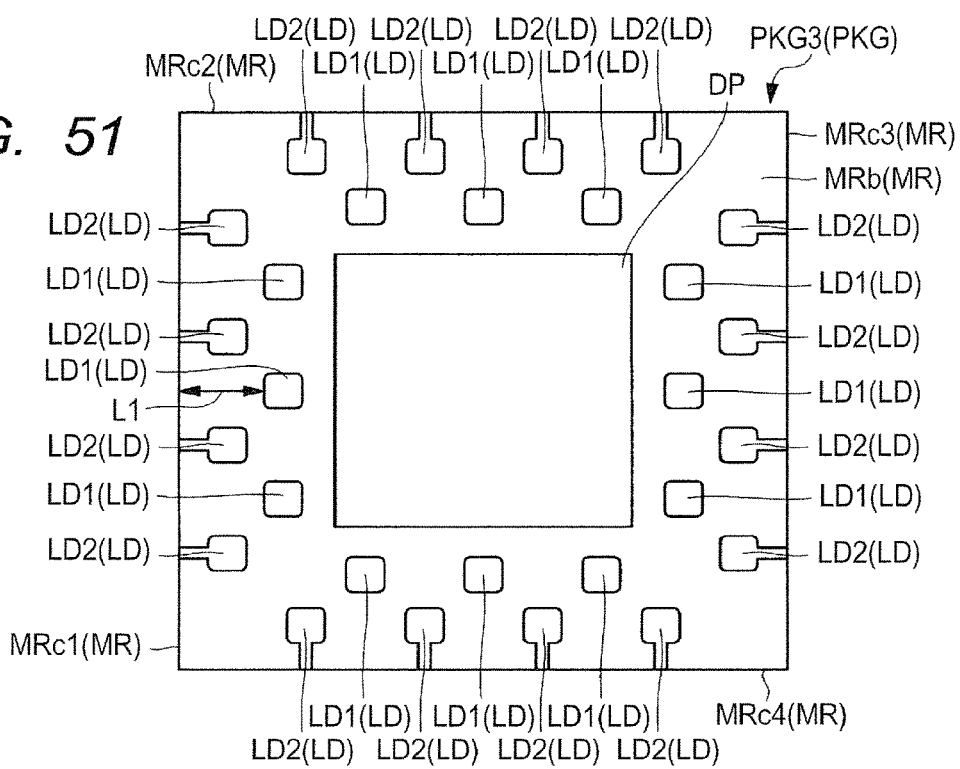
FIG. 51 is a bottom view of the semiconductor device in the third modification.
Figure 52:
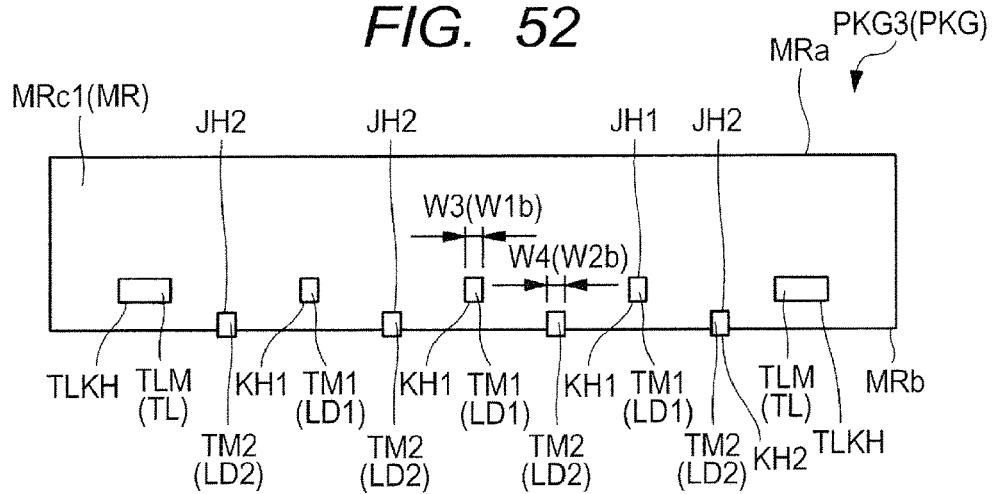
FIG. 52 is a side view of the semiconductor device in the third modification.

FIGS. 49 and 50 are perspective plan views of the semiconductor device PKG3 in the third modification. FIG. 51 is a bottom view of the semiconductor device PKG3 in the third modification. FIG. 52 is a side view of the semiconductor device PKG3 in the third modification. Note that FIG. 49 corresponds to FIG. 3 described above, FIG. 50 corresponds to FIG. 11 described above, FIG. 51 corresponds to FIG. 2 described above, and FIG. 52 corresponds to FIG. 9 described above. To FIG. 50 also, the same hatching as added to FIG. 11 described above is added. Since a top view of the semiconductor device PKG3 in the third modification is the same as FIG. 1 described above and a cross-sectional view of the semiconductor device PKG3 in the third modification is the same as each of FIGS. 6 to 8 described above, repeated illustration thereof is omitted herein.

In the semiconductor device PKG3 in the third modification, unlike in the foregoing semiconductor device PKG and the semiconductor device PKG2 in the second studied example, the width W2b of the thinner portion LD2b of each of the leads LD2 is smaller than the width W2a of the thicker portion LD2a of the lead LD2 (W2a>W2b) (see FIG. 50). Also, in the semiconductor device PKG3 in the third modification, unlike in the foregoing semiconductor device PKG, but in the same manner as in the semiconductor device PKG2 in the second modification, the width W1b of the thinner portion LD1b of each of the leads LD1 is smaller than the width W1a of the thicker portion LD1a of the lead LD1 (W1a>W1b) (see FIG. 50). The semiconductor device PKG3 in the third modification is common to the foregoing semiconductor device PKG and the semiconductor device PKG2 in the second studied example in that the width W1a of the thicker portion LD1a of the lead LD1 is substantially equal to the width W2a of the thicker portion LD2a of the lead LD2 (W1a=W2a) (see FIG. 50). Also, in the semiconductor device PKG3 in the third modification, the width W1b of the thinner portion LD1b of the lead LD1 is substantially equal to the width W2b of the thinner portion LD2b of the lead LD2 (W1b=W2b) (see FIG. 50). Consequently, in the semiconductor device PKG3 in the third modification, the lateral dimension W3 of the end surface TM1 of the lead LD1 is substantially equal to the lateral dimension W4 of the end surface T2 of the lead LD2 (see FIG. 52). This is because the lateral dimension W3 of the end surface TM1 of the lead LD1 is substantially equal to the width W1b of the thinner portion LD1b of the lead LD1, and the lateral dimension W4 of the end surface TM2 of the lead LD2 is substantially equal to the width W2b of the thinner portion LD2b of the lead LD2.

The configuration of the semiconductor device PKG3 in the third modification is otherwise substantially the same as that of the foregoing semiconductor device PKG so that a repeated description thereof is omitted herein. Also, the manufacturing process of the semiconductor device PKG3 in the third modification is substantially the same as the manufacturing process of the foregoing semiconductor device PKG so that a repeated description thereof is omitted herein.

From the semiconductor device PKG3 in the third modification, substantially the same effects as obtained from the foregoing semiconductor device PKG can be obtained. In addition, the following effects can also be obtained from the semiconductor device PKG3.

That is, in the semiconductor device PKG3 in the third modification, in the same manner as in the semiconductor device PKG2 in the second modification, the width W1b of the thinner portion LD1b of each of the leads LD1 is set smaller than the width W1a of the thicker portion LD1a of the lead LD1 (W1a>W1b). Thus, it is possible to reduce the width W1h of the thinner portion LD1b of the lead LD1, while assuring the width W1a and the two-dimensional size (plane area) of the thicker portion LD1a of the lead LD1. Also, in the semiconductor device PKG3 in the third modification, unlike in the foregoing semiconductor device PKG and the semiconductor device PKG2 in the second modification, the width W2b of the thinner portion LD2b of each of the leads LD2 is set smaller than the width W2a of the thicker portion LD2a of the lead LD2 (W2a>W2b). Thus, it is possible to reduce the width W2b of the thinner portion LD2b of the lead LD2, while assuring the width W2a and the two-dimensional size (plane area) of the thicker portion LD2a of the lead LD2. By rather increasing the widths W1a and W2a and the two-dimensional sizes (plane areas) of the thicker portions LD1a and LD2a of the leads LD1 and LD2, it is easier to connect the wires BW with the respective upper surfaces of the thicker portions LD1a and LD2a of the leads LD1 and LD2 and ensure the junction strengths between the leads LD1 and LD2 and the terminals of the mounting substrate. In the dicing step of cutting the resin sealing portion and the leads, as the amount of the metal members to be cut is smaller, the dicing step is more easily performed. In the case in the third modification, not only the width W1b of the thinner portion LD1b of the lead LD1 (lateral dimension W3 of the end surface TM1), but also the width W2b of the thinner portion LD2b of the lead LD2 (lateral dimension W4 of the end surface TM2) is reduced to allow a reduction in each of the amounts (volumes) of the leads LD1 and LD2 to be cut in the dicing step in Step S6. Consequently, in the case in the third modification, the dicing step in Step S6 can be performed more easily. In addition, the use lifetime of the dicing blade BRD can also be elongated.

Accordingly, when a comparison is made among the foregoing semiconductor device PKG, the semiconductor device PKG2 in the second modification, and the semiconductor device PKG3 in the third modification, in terms of allowing the dicing step in Step S6 to be easily performed, the semiconductor device PKG3 in the third modification is most advantageous, and the semiconductor device PKG2 in the second modification is next most advantageous. On the other hand, in terms of maximizing the mounting reliability of the semiconductor device, the semiconductor device PKG2 in the second modification and the foregoing semiconductor device PKG are advantageous.

<About Fourth Modification>

Next, a description will be given of a fourth modification of the semiconductor device PKG in the present embodiment. Note that the following will refer to the semiconductor device PKG in the fourth modification as a semiconductor device PKG4 using a reference numeral PKG4 and refer to the semiconductor device PKG in FIGS. 1 to 11 described above as the foregoing semiconductor device PKG.

Figure 53:
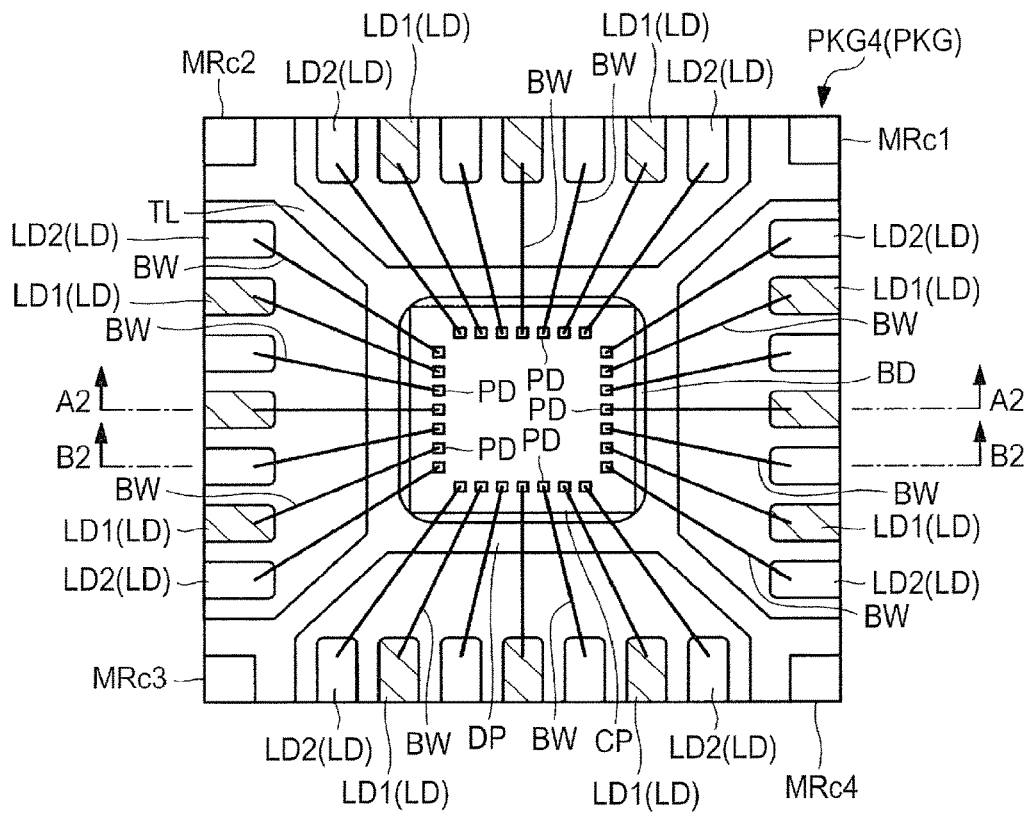
FIG. 53 is a perspective plan view of a semiconductor device in a fourth modification.
Figure 54:
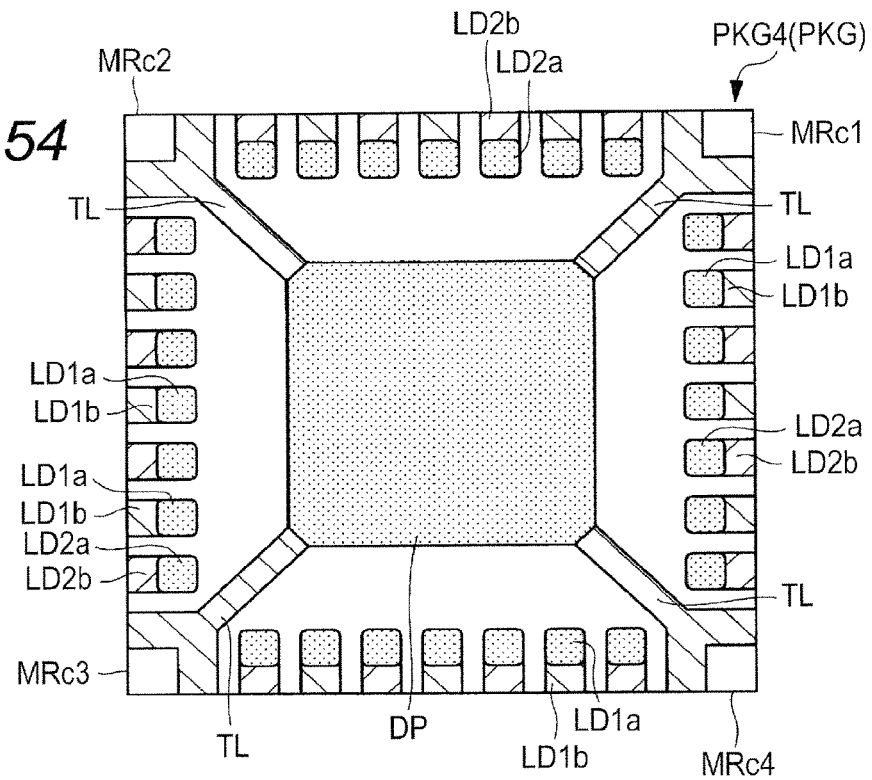
FIG. 54 is a perspective plan view of the semiconductor device in the fourth modification.
Figure 55:
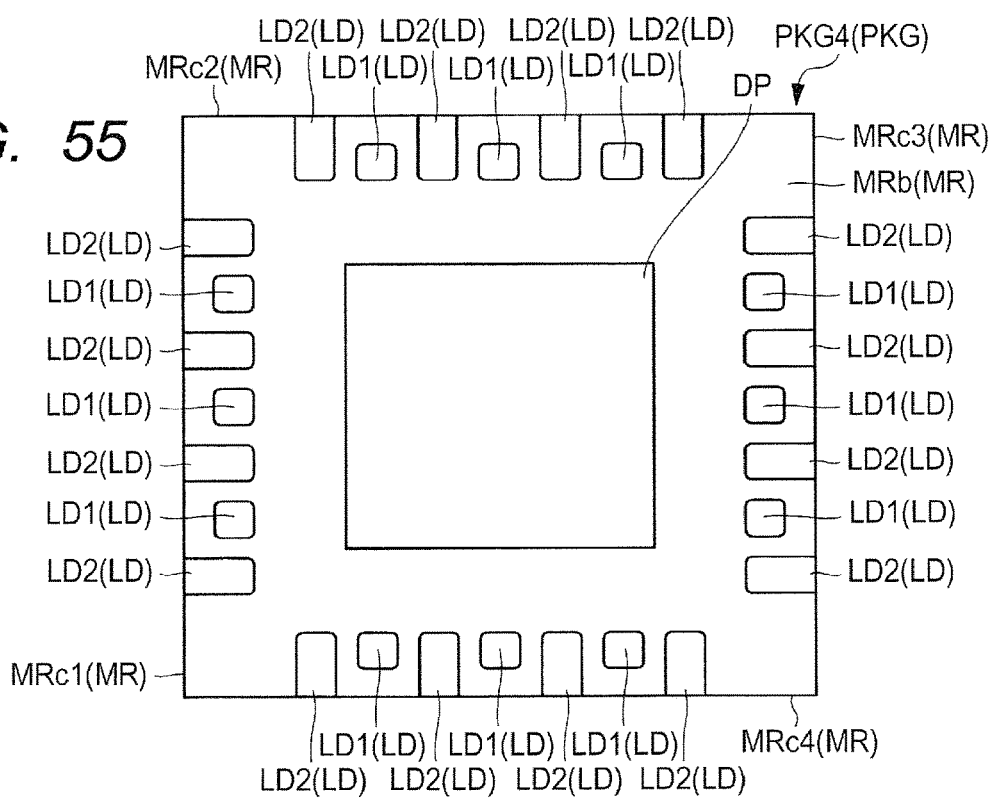
FIG. 55 is a bottom view of the semiconductor device in the fourth modification.
Figure 56:
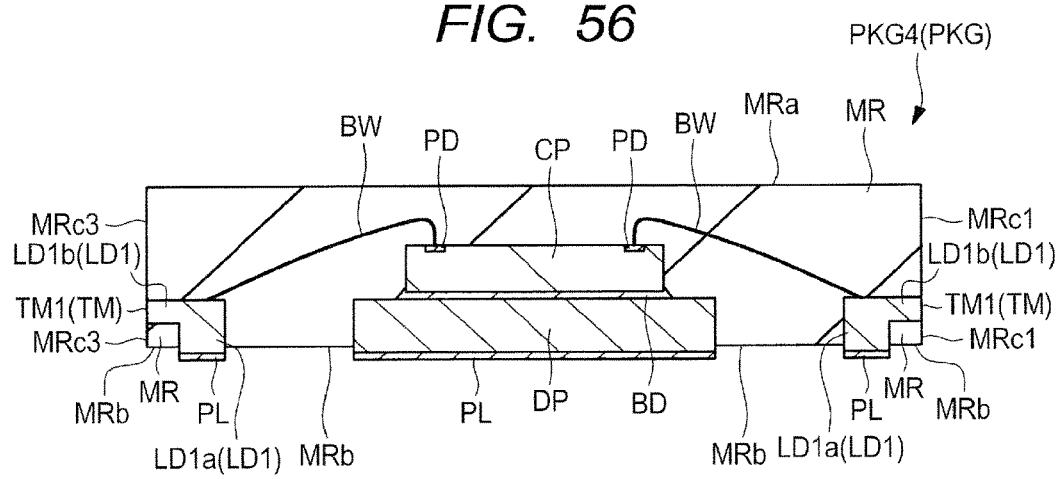
FIG. 56 is a cross-sectional view of the semiconductor device in the fourth modification.
Figure 57:
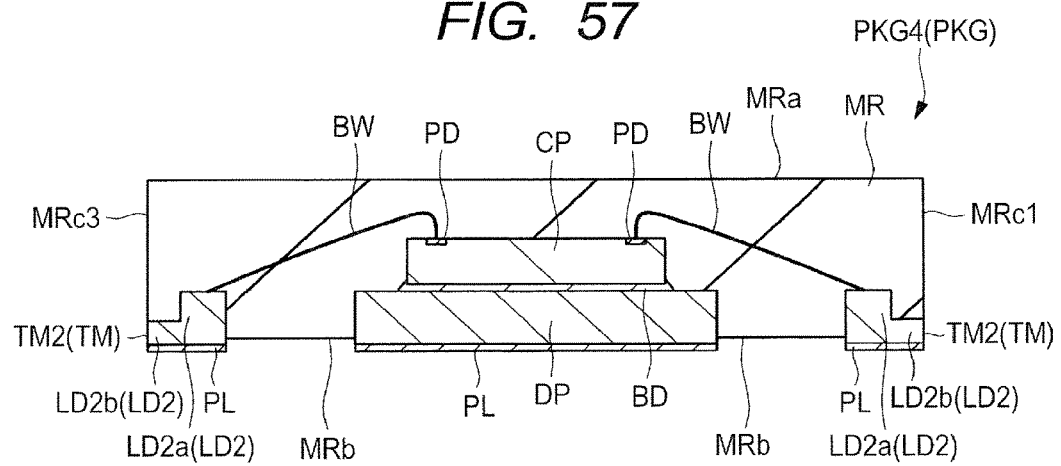
FIG. 57 is a cross-sectional view of the semiconductor device in the fourth modification.

FIGS. 53 and 54 are perspective plan views of the semiconductor device PKG4 in the fourth modification. FIG. 55 is a bottom view of the semiconductor device PKG4 in the fourth modification. FIGS. 56 and 57 are cross-sectional views of the semiconductor device PKG4 in the fourth modification. Note that FIG. 53 corresponds to FIG. 3 described above, FIG. 54 corresponds to FIG. 11 described above, FIG. 55 corresponds to FIG. 2 described above, FIG. 56 corresponds to FIG. 6 described above, and FIG. 57 corresponds to FIG. 7 described above. Note that the cross-sectional view of the semiconductor device PKG4 at the position along the line A2-A2 in FIG. 53 corresponds to FIG. 56, and the cross-sectional view of the semiconductor device PKG4 at the position along the line B2-B2 in FIG. 53 corresponds to FIG. 57. To FIG. 54 also, the same hatching as added to FIG. 11 described above is added. In FIG. 53, to allow the leads LD1 and LD2 to be distinguished from each other, the leads LD1 are hatched with oblique lines. Since a top view of the semiconductor device PKG4 in the fourth modification is the same as FIG. 1 described above and a side view of the semiconductor device PKG4 in the fourth modification is the same as FIGS. 9 and 10 described above, repeated illustration thereof is omitted herein.

In the foregoing semiconductor device PKG, the leads LD1 extend closer to the die pad DP than the leads LD2. That is, in the foregoing semiconductor device PKG, when a comparison is made between the leads LD1 and LD2 next to each other, the front end surface (front end portion) of each of the leads LD1 is located closer to the die pad DP than the front end surface (front end portion) of each of the leads LD2.

By contrast, in the semiconductor device PKG4 in the fourth modification, when a comparison is made between the leads LD1 and LD2 next to each other, the distance (space) from the front end surface of each of the leads LD2 to the die pad DP is substantially equal to the distance (space) from the front end surface of each of the leads LD1 to the die pad DP.

The semiconductor device PKG4 in the fourth modification is common to the foregoing semiconductor device PKG in that the leads LD1 and LD2 are alternately disposed (arranged) around the die pad DP, each of the leads LD1 integrally has the thicker portion LD1a and the thinner portion LD1b, and each of the leads LD2 integrally has the thicker portion LD2a and the thinner portion LD2b. The semiconductor device PKG4 in the fourth modification is also common to the foregoing semiconductor device PKG in that, at the lower surface MRb of the sealing portion MR, the lower surface of the thicker portion LD1a of the lead LD1 is exposed to serve as the lower exposed surface of the lead LD1, and the entire lower surface of the lead LD2 is exposed to serve as the lower exposed surface of the lead LD2.

In the foregoing semiconductor device PKG, as can also be seen from FIG. 2 described above, at the lower surface MRb of the sealing portion MR, the lower exposed surfaces of the leads LD1 and LD2 are arranged in two rows in a staggered configuration (staggered arrangement) along the outer periphery (lateral sides) of the lower surface MRb. By contrast, in the semiconductor device PKG4 in the fourth modification, as can also be seen from FIG. 55, at the lower surface MRb of the sealing portion MR, the lower exposed surfaces of the leads LD1 and LD2 are arranged in one row (aligned) along the outer periphery (lateral sides) of the lower surface MRb.

That is, in the semiconductor device PKG4 in the fourth modification, in plan view, the distance between the thicker portion LD1a of each of the leads LD1 and the die pad DP is substantially equal to the distance between the thicker portion LD2a of each of the leads LD2 next to the lead LD1 and the die pad DP. Accordingly, in plan view, the distance between the lower exposed surface of the lead LD1 and the die pad DP is substantially equal to the distance between the lower exposed surface of each of the leads LD2 next to the lead LD1 and the die pad DP. Consequently, in the semiconductor device PKG4 in the fourth modification, in plan view, between the thicker portions LD2a of the two leads LD2 located on both sides of the lead LD1, the thicker portion LD1a of the lead LD1 is located. Accordingly, at the lower surface MRb of the sealing portion MR, between the lower exposed surfaces of the two leads LD2 located on both sides of the lead LD1, the lower exposed surface of the lead LD1 is located. Likewise, in the semiconductor device PKG4 in the fourth modification, in plan view, between the thicker portions LD1a of the two leads LD1 located on both sides of the lead LD2, the thicker portion LD2a of the lead LD2 is located. As a result, at the lower surface MRb of the sealing portion MR, between the lower exposed surfaces of the two leads LD1 located on both sides of the lead LD2, the lower exposed surface of the lead LD2 is located.

The configuration of the semiconductor device PKG4 in the fourth modification is otherwise substantially the same as that of the foregoing semiconductor device PKG so that a repeated description thereof is omitted herein. Also, the manufacturing process of the semiconductor device PKG4 in the fourth modification is substantially the same as the manufacturing process of the foregoing semiconductor device PKG so that a repeated description thereof is omitted herein.

In the semiconductor device PKG4 in the fourth modification also, as shown in FIGS. 9 and 10 described above, the height position of the lower side KH1 of the end surface TM1 of each of the leads LD1 is set higher than the height position of the upper side JH2 of the end surface TM2 of each of the leads LD2. Accordingly, such effects as described above can be obtained.

However, when consideration is given to a solder bridge (short circuit between solder joints) which may occur when the semiconductor device PKG is solder-mounted over the mounting substrate, it is preferable that, in the same manner as in the foregoing semiconductor device PKG, at the lower surface MRb of the sealing portion MR, the lower exposed surfaces of the leads LD1 and LD2 are arranged in two rows in a staggered configuration (staggered arrangement) along the outer periphery (lateral sides) of the lower surface MRb to increase the spaces between the exposed surfaces of the leads LD1 and the lower exposed surfaces of the leads LD2 each exposed from the lower surface MRb of the sealing portion MR.

<About Fifth Modification>

Next, a description will be given of a fifth modification of the semiconductor device PKG in the present embodiment. Note that the following will refer to the semiconductor device PKG in the fifth modification as a semiconductor device PKG5 using a reference numeral PKG5 and refer to the semiconductor device PKG in FIGS. 1 to 11 described above as the foregoing semiconductor device PKG.

Figure 58:
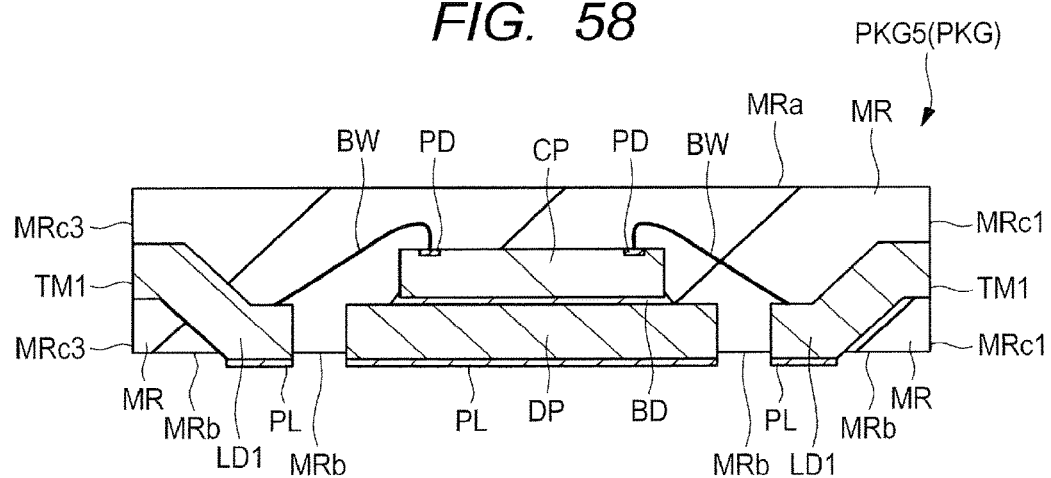
FIG. 58 is a cross-sectional view of a semiconductor device in a fifth modification.
Figure 59:
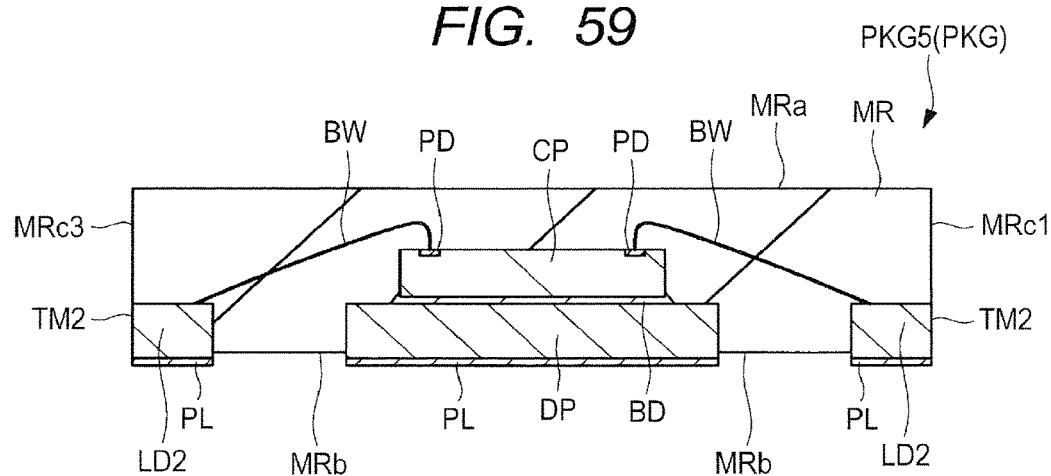
FIG. 59 is a cross-sectional view of the semiconductor device in the fifth modification.
Figure 60:
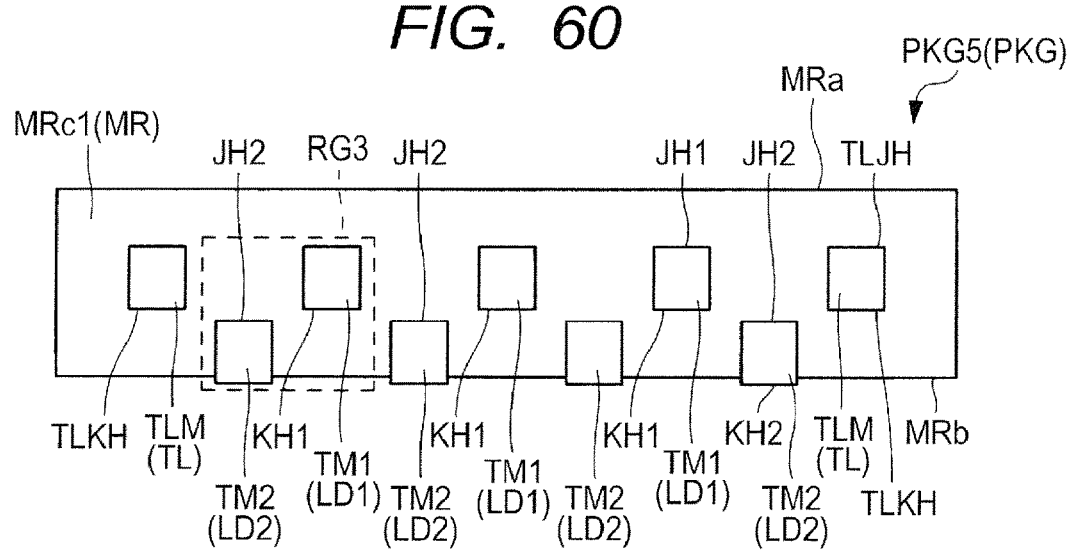
FIG. 60 is a side view of the semiconductor device in the fifth modification.
Figure 61:
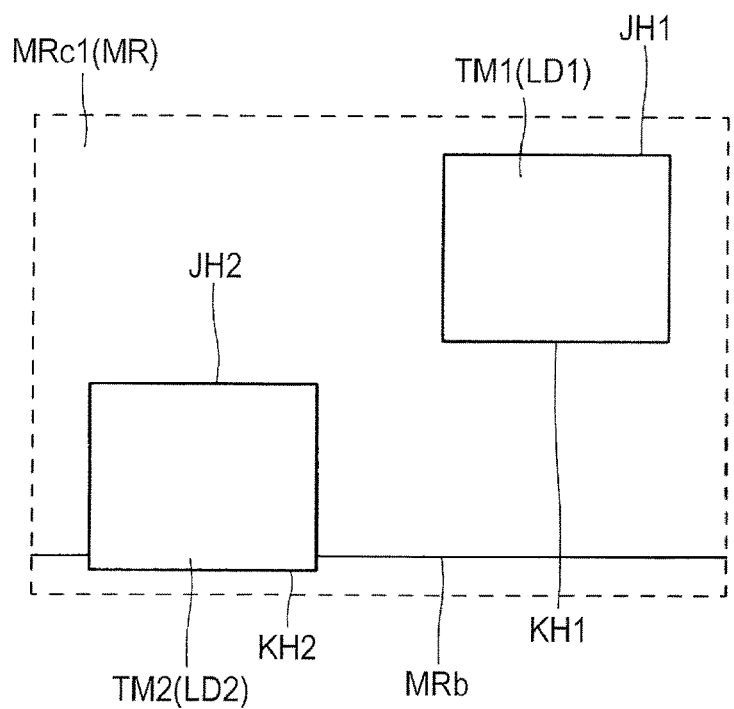
FIG. 61 is a partially enlarged side view showing a part of FIG. 60 in enlarged relation.

FIGS. 58 and 59 are cross-sectional views of the semiconductor device PKG5 in the fifth modification. FIG. 60 is a side view of the semiconductor device PKG5 in the fifth modification. FIG. 61 is a partially enlarged side view which shows an enlarged view of a region RG3 enclosed by the dotted line in FIG. 60. Note that FIG. 58 corresponds to FIG. 6 described above, FIG. 59 corresponds to FIG. 7 described above, FIG. 60 corresponds to FIG. 9 described above, and FIG. 61 corresponds to FIG. 10 described above. Since a top view of the semiconductor device PKG5 in the fifth modification is the same as FIG. 1 described above, a bottom view of the semiconductor device PKG5 in the fifth modification is the same as FIG. 2 described above, and a perspective plan view of the semiconductor device PKG5 in the fifth modification is the same as FIG. 3 described above, repeated illustration thereof is omitted herein.

The semiconductor device PKG5 in the fifth modification is common to the foregoing semiconductor device PKG in that the leads LD1 and LD2 are alternately disposed (arranged) around the die pad DP. In the foregoing semiconductor device PKG, each of the leads LD1 integrally has the thicker portion LD1*a* and the thinner portion LD1*b*, and each of the leads LD2 integrally has the thicker portion LD2*a* and the thinner portion LD2*b*. In the semiconductor device PKG5 in the fifth modification, the leads LD1 and LD2 have substantially equal thicknesses.

The semiconductor device PKG5 in the fifth modification is also common to the foregoing semiconductor device PKG in that the height position of the lower side KH1 of the end surface TM1 of each of the leads LD1 is set higher than the height position of the upper side JH2 of the end surface TM2 of each of the leads LD2 (see FIGS. 9, 10, 60, and 61). To provide the relationship between the lower side KH1 and the upper side JH2 such that the height position of the lower side KH1 is higher than the height position of the upper side JH2, in the foregoing semiconductor device PKG, the thinner portion LD1*b* of the lead LD1 is formed by half etching performed on the lower surface thereof and the thinner portion LD2*b* of the lead LD2 is formed by half etching performed on the upper surface thereof. On the other hand, in the case of the semiconductor device PKG5 in the fifth modification, to provide the relationship between the lower side KH1 and the upper side JH2 such that the height position of the lower side KH1 is higher than the height position of the upper side JH2, the lead LD1 is subjected to bending.

That is, each of the leads LD2 in the semiconductor device PKG5 in the fifth modification corresponds to each of the leads LD2 in the foregoing semiconductor device PKG in which the thinner portion LD2*b* is provided with the same thickness as that of the thicker portion LD2*a*. Accordingly, in the semiconductor device PKG5 in the fifth modification, the lead LD2 having a uniform thickness is not subjected to bending and is entirely substantially flat. Each of the leads LD2 is sealed in the sealing portion MR1 and the entire lower surface of the lead LD2 is exposed from the lower surface MRb of the sealing portion MR, while the end surface TM2 as the cut surface of the lead LD2 is exposed from the side surface of the sealing portion MR. In the case of the semiconductor device PKG5 in the fifth modification, at the stage where the lead frame (LF) is produced, the lead LD1 is already bent. Consequently, in the case of the semiconductor device PKG5 in the fifth modification, the lead LD1 is sealed in a bent state in the sealing portion MR. That is, in the case of the semiconductor device PKG5 in the fifth modification, the lower surface of the portion of the lead LD1 which is located in the vicinity of the end portion (front end portion) thereof facing the die pad DP is exposed from the lower surface MRb of the sealing portion MR to serve as the lower exposed surface of the lead LD1. On the other hand, the portion of the lead LD1 which is further away from the front end portion is raised relative to the front end portion. In other words, the lower surface of the portion of the lead LD1 which is located in the vicinity of the front end portion thereof is exposed from the lower surface MRb of the sealing portion MR, while the end surface TM1 as the cut surface of the lead LD1 is apart from the lower surface MRb of the sealing portion MR. The lead LD1 is bent in the sealing portion MR such that, at each of the side surfaces of the sealing portion MR, the height position of the lower side KH1 of the end surface TM1 of the lead LD1 is higher than the height position of the upper side JH2 of the end surface TM2 of the lead LD2.

The configuration of the semiconductor device PKG5 in the fifth modification is otherwise substantially the same as that of the foregoing semiconductor device PKG so that a repeated description thereof is omitted herein.

When the semiconductor device PKG5 in the fifth modification is manufactured, the lead frame (LF) is produced by press working. The leads LD1 and LD2 have substantially equal thicknesses and, at the stage where the lead frame (LF) is produced, the lead LD1 has been bent. That is, in the lead frame (LF), the lead LD1 has been subjected to upset working. The manufacturing process of the semiconductor device PKG5 in the fifth modification is otherwise substantially the same as the manufacturing process of the foregoing semiconductor device PKG so that a repeated description thereof is omitted herein.

In the semiconductor device PKG5 in the fifth modification also, as shown in FIGS. 60 and 61, the height position of the lower side KH1 of the end surface TM1 of each of the leads LD1 is set higher than the height position of the upper side JH2 of the end surface TM2 of each of the leads LD2. Accordingly, such effects as described above can be obtained.

Note that, in the foregoing semiconductor device PKG, the lead frame LF can be produced by etching. Accordingly, it is possible to easily and reliably produce the lead frame LF which can provide the foregoing relationship between the lower side KH1 and the upper side JH2 such that the height position of the lower side KH1 is higher than the height position of the upper side JH2. This can further reduce the manufacturing cost of the semiconductor device.

While the invention achieved by the present inventors has been specifically described heretofore on the basis of the embodiment thereof, the present invention is not limited to the foregoing embodiment. It will be appreciated that various changes and modifications can be made in the invention within the scope not departing from the gist thereof.

What is claimed is:

1. A semiconductor device, comprising:
a chip mounting portion;
a semiconductor chip mounted over the chip mounting portion and having a plurality of pad electrodes;
a plurality of leads;
a plurality of wires electrically connecting the plurality of pad electrodes of the semiconductor chip with the plurality of leads; and
a resin sealing portion which seals the chip mounting portion, the semiconductor chip, the wires, and the leads,
wherein the resin sealing portion has a first upper surface and a first lower surface which are located opposite to each other, and a plurality of side surfaces located between the first upper surface and the first lower surface,
wherein at least a portion of each of the plurality of leads is exposed from the first lower surface of the resin sealing portion,
wherein the plurality of leads includes a first lead and a second lead located next to the first lead,
wherein a first end surface of the first lead and a second end surface of the second lead are exposed from a first side surface which is among the side surfaces of the resin sealing portion,
wherein the first end surface of the first lead has a first upper side closer to the first upper surface and a first lower side far away from the first upper surface,
wherein the second end surface of the second lead has a second upper side closer to the first upper surface and a second lower side far away from the first upper surface,
wherein, on the first end surface of the first lead and the second end surface of the second lead, metal burrs are formed to extend in respective directions parallel with each of the first lower surface and the first side surface, and
wherein a distance between the first lower side and the first upper surface in a thickness direction of the resin sealing portion is smaller than a distance between the second upper side and the first upper surface in the thickness direction of the resin sealing portion.

2. The semiconductor device according to claim 1, wherein a first dimension of the first end surface in the thickness direction of the resin sealing portion is larger than a second dimension of the second end surface in the thickness direction of the resin sealing portion.

3. The semiconductor device according to claim 1, wherein the plurality of leads is disposed so as to surround the chip mounting portion,
wherein the plurality of leads includes a plurality of the first leads and a plurality of the second leads, and
wherein the first leads and the second leads are alternately disposed.

4. The semiconductor device according to claim 1, wherein the first lead integrally has a first thicker portion and a first thinner portion thinner than the first thicker portion which are next to each other in an extending direction of the first lead,
wherein the first thicker portion is located closer to the chip mounting portion than the first thinner portion,
wherein a second lower surface of the first thicker portion is exposed from a first lower surface of the resin sealing portion, while a third lower surface of the first thinner portion is covered with the resin sealing portion,
wherein the first end surface is formed of the first thinner portion,
wherein the second lead integrally has a second thicker portion and a second thinner portion thinner than the second thicker portion which are next to each other in an extending direction of the second lead,
wherein the second thicker portion is located closer to the chip mounting portion than the second thinner portion, and
wherein the second end surface is formed of the second thinner portion.

5. The semiconductor device according to claim 4 wherein a fourth lower surface of the second thicker portion and a fifth lower surface of the second thinner portion are exposed from the first lower surface of the resin sealing portion.

6. The semiconductor device according to claim 4, wherein a first width of the first thinner portion is smaller than a second width of the first thicker portion.

7. The semiconductor device according to claim 6, wherein a third width of the second thinner portion is smaller than a fourth width of the second thicker portion.

8. The semiconductor device according to claim 1, wherein a third dimension of the first end surface in a direction parallel with the first lower surface is smaller than a fourth dimension of the second end surface in the direction parallel with the first lower surface.

* * * * *